(12) United States Patent
Buhrman et al.

(10) Patent No.: US 10,008,248 B2
(45) Date of Patent: Jun. 26, 2018

(54) CIRCUITS AND DEVICES BASED ON ENHANCED SPIN HALL EFFECT FOR EFFICIENT SPIN TRANSFER TORQUE

(71) Applicant: Cornell University, Ithaca, NY (US)

(72) Inventors: Robert A Buhrman, Ithaca, NY (US); Minh-hai Nguyen, Ithaca, NY (US); Chi-feng Pai, Ithaca, NY (US); Daniel C Ralph, Ithaca, NY (US)

(73) Assignee: Cornell University, Ithaca, NY (US)

( * ) Notice: Subject to any disclaimer, the term of this patent is extended or adjusted under 35 U.S.C. 154(b) by 0 days. days.

(21) Appl. No.: 15/327,017

(22) PCT Filed: Jul. 17, 2015

(86) PCT No.: PCT/US2015/041039
§ 371 (c)(1),
(2) Date: Jan. 17, 2017

(87) PCT Pub. No.: WO2016/011435
PCT Pub. Date: Jan. 21, 2016

(65) Prior Publication Data
US 2017/0178705 A1   Jun. 22, 2017

Related U.S. Application Data

(60) Provisional application No. 62/026,012, filed on Jul. 17, 2014, provisional application No. 62/063,337, (Continued)

(51) Int. Cl.
*G11C 11/16* (2006.01)
*H01L 43/04* (2006.01)
(Continued)

(52) U.S. Cl.
CPC ........ *G11C 11/161* (2013.01); *G11C 11/1673* (2013.01); *G11C 11/1675* (2013.01);
(Continued)

(58) Field of Classification Search
CPC .............. G11C 11/161; G11C 11/1673; G11C 11/1675; G11C 11/1697; H01L 27/222;
(Continued)

(56) References Cited

U.S. PATENT DOCUMENTS 6,683,359 B2   1/2004   Johnson et al.
6,714,444 B2   3/2004   Huai
(Continued)

FOREIGN PATENT DOCUMENTS

CN   101030443 A   9/2007
EP     1689006 A2   8/2006
(Continued)

OTHER PUBLICATIONS

Wang, et al., "Electric-field-assisted switching in magnetic tunnel junctions," Nature Mat., 11 :64-68, 2012.
(Continued)

*Primary Examiner* — Vanthu Nguyen
(74) *Attorney, Agent, or Firm* — Perkins Coie LLP

(57) ABSTRACT

Devices or circuits based on spin torque transfer (STT) and Spin Hall effect are disclosed by using a spin Hall effect (SHE) metal layer coupled to a magnetic free layer for various applications. The efficiency or strength of the STT effect based on this combination of SHE and STT can be enhanced by an interface modification between the SHE metal layer and the magnetic free layer or by modifying or engineering the SHE metal layer by doping the SHE metal with certain impurities or other means.

23 Claims, 33 Drawing Sheets

Related U.S. Application Data filed on Oct. 13, 2014, provisional application No. 62/082,048, filed on Nov. 19, 2014.

(51) Int. Cl.
| | |
|---|---|
| *H01L 43/06* | (2006.01) |
| *H01L 43/08* | (2006.01) |
| *H01L 43/10* | (2006.01) |
| *H01L 27/22* | (2006.01) |

(52) U.S. Cl.
CPC ........ *G11C 11/1697* (2013.01); *H01L 27/222* (2013.01); *H01L 43/04* (2013.01); *H01L 43/065* (2013.01); *H01L 43/08* (2013.01); *H01L 43/10* (2013.01)

(58) Field of Classification Search
CPC ....... H01L 43/04; H01L 43/065; H01L 43/08; H01L 43/10
See application file for complete search history.

(56) References Cited

U.S. PATENT DOCUMENTS

| | | | |
|---|---|---|---|
| 7,476,954 B2 | 1/2009 | Wang et al. | |
| 7,485,938 B2 | 2/2009 | Saito et al. | |
| 8,659,938 B2 * | 2/2014 | Prejbeanu ............... | G11C 11/16 365/100 |
| 9,105,832 B2 | 8/2015 | Burhman | |
| 9,171,601 B2 * | 10/2015 | Shukh ..................... | G11C 11/16 |
| 9,230,626 B2 | 1/2016 | Burhman | |
| 9,502,087 B2 | 11/2016 | Buhrman | |
| 9,576,631 B2 | 2/2017 | Buhrman | |
| 2003/0179510 A1 | 9/2003 | Hayakawa | |
| 2005/0185347 A1 | 8/2005 | Inomata | |
| 2007/0177421 A1 | 8/2007 | Sugiyama | |
| 2008/0150640 A1 | 6/2008 | Dimitrov et al. | |
| 2009/0161265 A1 | 6/2009 | Sugano et al. | |
| 2010/0027330 A1 | 2/2010 | Koo et al. | |
| 2010/0097063 A1 | 4/2010 | Ando et al. | |
| 2011/0303960 A1 | 12/2011 | Cao et al. | |
| 2012/0018822 A1 | 1/2012 | Gaudin et al. | |
| 2012/0020152 A1 | 1/2012 | Gaudin et al. | |
| 2012/0038387 A1 | 2/2012 | Nikonov et al. | |
| 2012/0098077 A1 | 4/2012 | Gaudin et al. | |
| 2014/0056060 A1 | 2/2014 | Khvalkovskiy et al. | |
| 2017/0069365 A1 | 3/2017 | Buhrman | |

FOREIGN PATENT DOCUMENTS

| | | | |
|---|---|---|---|
| JP | 2010062531 A | 3/2010 | |
| WO | 2014025838 A1 | 2/2014 | |

OTHER PUBLICATIONS

Wang, et al., "Time-resolved measurement of spin-transfer-driven ferromagnetic resonance and spin torque in magnetic tunnel junctions," Nature Physics, 7:496-501, 2011.
Weisheit, et al., "Electric field-induced modification of magnetism in thin-film ferromagnets," Science, 315:1077-1077, 2007.
Xue, Lin et al., "Resonance Measurement of Nonlocal Spin Torque in a Three-Terminal Magnetic Device," Physical Review Letters, PRL108, 147201, Apr. 6, 2012.
Zhang, Shufeng, "Spin Hall effect in the presence of spin diffusion," Physical review letters, 85:393, 2000.
Zhao, et al., "Cross-point architecture for spin transfer torque magnetic random access memory," arXiv: 1202.1782, 2012.
Zhu, et al., "Voltage-Induced Ferromagnetic Resonance in Magnetic Tunnel Junctions," Phys. Rev. Lett., 108:197203, 2012.
Pai et al., "Enhancement of Perpendicular Magnetic Anisotropy and Transmission of Spin-Hall-Effect-Induced Spin currents by a Hf Spacer layer in W/Hf/CoFeB/MgO Layer Structures". Applied Physics Letters [online]<URL: https://scholar.google.com/citations?view_op=view_citation&hi=en&user=vpSUGcsAAAAJ&citation_for_view=vpSUGGsAAAAJ:ufrVoPGSRksC>.
Young, L. W., Authorized Officer, U.S. Patent and Trademark Office, International Search Report and Written Opinion, International Application No. PCT/US2015/041039, dated Oct. 16, 2015, 15 pages.
Ando, et al. "Electric manipulation of spin relaxation using the spin Hall effect," Phys. Rev. Lett.,101 :036601, 2008.
Berger, L. "Emission of spin waves by a magnetic multilayer traversed by a current," Phys. Rev. B, 54:9353-9358, 1996.
Braganca, P. et al., "A Three-Terminal Approach to Developing Spin-Torque Written Magnetic Random Access Memory Cells," IEEE Transactions on Nanotechnology, vol. 8, No. 2, Mar. 2009.
Deac, et al., "Bias-driven high-power microwave emission from MgO-based tunnel maqnetoresistance devices," Nature Physics, 4:803-809, 2008.
Duan, et al, "Surface magnetoelectric effect in ferromagnetic metal films," Phys. Rev. Left., 101: 137201, 2008.
Dyakonov, et al., "Current-Induced Spin Orientation of Electrons in Semiconductors," Phys. Lett. A, 35:459, 1971.
Endo, et al., "Electric-field effects on thickness dependent magnetic anisotropy of sputtered Mg0/Co40Fe40B20/Ta structures," Appl. Phys. Lett., 96:212503, 2010.
First Office Action in Chinese Patent Application No. 201280050731.6, dated Oct. 27, 2015.
Gamble, et al, "Electric Field Induced Magnetic Anisotropy in a Ferromagnet," Phys. Rev. Lett., 102:217201, 2009.
Ha, et al., "Voltage induced magnetic anisotropy change in ultrathin Fe80Co20/Mg0 junctions with Brillouin liq ht scatterinq," Applied Physics Letters, 96.14: 142512, 2010.
Heath, et al., "A defect-tolerant computer architecture: Opportunities for nanotechnology," Science, 280:1716-1721, 1998.
Hirsch, J.E., "Spin Hall effect," Phys. Rev. Lett., 83:1834-1837, 1999.
Ikeda, et al., "A perpendicular-anisotropy CoFeB—MgO magnetic tunnel junction," Nature Mater, 9:721-724, 2010.
International Search Report and Written Opinion in International Application No. PCT/US2012/051351, dated Jan. 29, 2013.
International Search Report and Written Opinion in International Application No. PCT/US2013/053874, dated Nov. 28, 2013.
Julliere, M., "Tunnelinq between Ferromagnetic Films," Phys. Lett. A, 54:225-226, 1975.
Kajiwara, et al., "Transmission of electrical signals by spin-wave interconversion in a magnetic insulator," Nature, 464:262, 2010.
Katine, et al., "Current-driven magnetization reversal and spin-wave excitations in Co/Cu/Co pillars," Phys. Rev. Lett., 34:3149-3152, 2000.
Kato, et al., "Observation of the spin Hall effect in semiconductors," Science, 306:1910-1913, 2004.
Kimura, et al., "Room-temperature reversible spin Hall effect," Phys. Rev. Lett., 98: 156601, 2007.
Kiselev, et al., "Microwave oscillations of a nanomagnet driven by a spin-polarized current," Nature, 425:380-383, 2003.
Koch, et al., "Time-resolved reversal of spin-transfer switching in a nanomagnet," Phys. Rev. Lett., 92:088302, 2004.
Kuekes, et al., "The crossbar latch: Logic value storage, restoration, and inversion in crossbar circuits," J. Appl. Phys., 97:034301, 2005.
Kupferschmidt, et al., "Theory of the spin-torque-driven ferromagnetic resonance in a ferromagneUnormal-metal/ferromagnet structure," Physical Review B, 74:134416, 2006.
Linn, et al., "Complementary resistive switches for passive nanocrossbar memories," Nature Mat., 9:403-406, 2010.
Liu, et al., "Magnetic oscillations driven by the spin Hall effect in 3-terminal magnetic tunnel junction devices," Phys. Rev. Lett., 109:186602, 2008.
Liu, et al., "Magnetic switchinq by spin torque from the spin Hall effect," arXiv:1110.6846, 2011.
Liu, et al., "Spin torque switching with the giant spin Hall effect of tantalum," Science, 336:555-558, 2012.

(56) References Cited

OTHER PUBLICATIONS

Liu, et al., "Spin-Torque Ferromagnetic Resonance Induced by the Spin Hall Effect." Phys. Rev. Lett., 106:036601, 2011.
Maruyama, et al., "Large voltage-induced magnetic anisotropy change in a few atomic layers of iron," Nature Nanotech., 4:158-161, 2009.
Miron, et al., "Perpendicular switching of a single ferromagnetic layer induced by in-plane current injection," Nature, 476:189-193, 2011.
Murakami, et al., "Dissipation less quantum spin current at room temperature," Science, 301: 1348-1351, 2003.
Nakamura, et al., "Giant modification of the magnetocrystalline anisotropy in transition-metal monolayers by an external electric field," Phys. Rev. Lett., 102: 187201, 2009.
Nowak, et al., "Demonstration of Ultralow Bit Error Rates for Spin-Torque Magnetic Random-Access Memory With Perpendicular Magnetic Anisotropy," IEEE Maqn. Lett. 2, 3000204, 2011.
Nozaki, et al., "Voltage-induced perpendicular magnetic anisotropy change in magnetic tunnel junctions," Appl. Phys. Lett., 96:022506, 2010.
Office Action in Korean Patent Application No. 10-2015-7006023, dated Jun. 29, 2015.
Pai, et al, "Spin transfer torque devices utilizing the giant spin Hall effect of tungsten," Applied Physics Letters, 101:122404, 2012.
Petit, et al., "Influence of spin-transfer torque on thermally activated ferromagnetic resonance excitations in maqnetic tunnel junctions," Physical Review B, 78:184420, 2008.
Ralph, et al., "Spin transfer torques," J. Magn. Magn. Mater., 320:1190-1216, 2008.
Sankey, et al., "Measurement of the spin-transfer-torque vector in magnetic tunnel junctions," Nature Physics, 4:67-71, 2008.
Shiota, et al., "Induction of coherent magnetization switching in a few atomic layers of FeCo using voltaqe pulses," Nature Mat., 11:39-43, 2012.
Shiota, et al., "Voltage-Assisted Magnetization Switching in Ultrathin Fe(80)Co(20) Alloy Layers," Appl. Phys. Express, 2:063001, 2009.
Sinova, et al., "Universal intrinsic spin Hall effect," Physical review letters, 92:126603, 2004.
Slonczewski, J.C., "Current-driven excitation of magnetic multilayers," J. Magn. Magn. Mater., 159: L 1, 1996.
State Intellectual Property Office of China, Office Action, Chinese Patent Application No. 201380051532.1, dated Jun. 27, 2016.
Strukov et al., "Defect-tolerant architectures for nanoelectronic crossbar memories," J. Nanosci. Nanotech., 7:151-167, 2007.
Tulapurkar, et al, "Spin-torque diode effect in magnetic tunnel junctions," Nature, 438:339-342, 2005.
Valenzuela, et al., "Direct electronic measurement of the spin Hall effect," Nature, 442: 176-179, 2006.

* cited by examiner

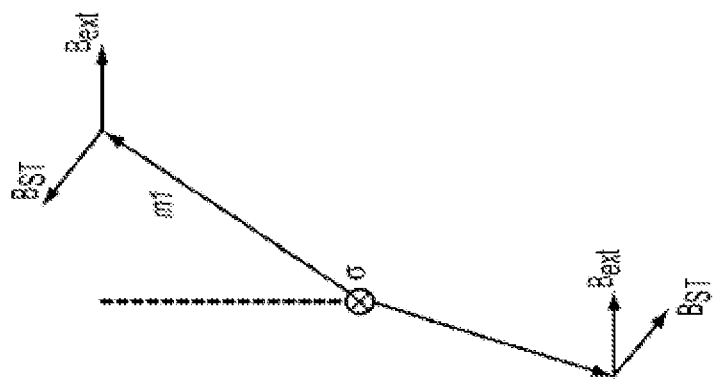
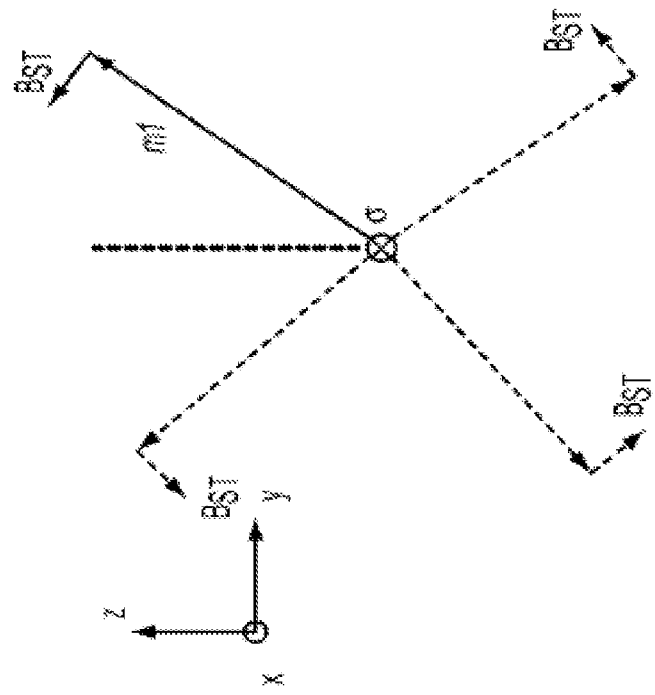
FIG. 17D
FIG. 17C

FIG. 20B (Read Operation)

FIG. 20A (Write Operation)

CIRCUITS AND DEVICES BASED ON ENHANCED SPIN HALL EFFECT FOR EFFICIENT SPIN TRANSFER TORQUE

PRIORITY CLAIMS AND RELATED PATENT APPLICATIONS

This patent document is the National Stage of International Application No. PCT/US2015/041039 entitled "CIRCUITS AND DEVICES BASED ON ENHANCED SPIN HALL EFFECT FOR EFFICIENT SPIN TRANSFER TORQUE", filed on Jul. 15, 2015, which claims the priorities and benefits of three U.S. Provisional Applications: (1) No. 62/026,012 entitled "ENHANCING THE EFFICIENCY OF THE SPIN HALL EFFECT FOR MAGNETIC EXCITATION AND MAGNETIC REVERSAL OF THIN FILM FERROMAGNETS" and filed on Jul. 17, 2014, (2) No. 62/063,337 entitled "ENHANCING THE EFFICIENCY OF THE SPIN HALL EFFECT FOR MAGNETIC EXCITATION AND MAGNETIC REVERSAL OF THIN FILM FERROMAGNETS" and filed on Oct. 13, 2014, and (3) No. 62/082,048 entitled "ENHANCING THE EFFICIENCY OF THE SPIN HALL EFFECT FOR MAGNETIC EXCITATION AND MAGNETIC REVERSAL OF THIN FILM FERROMAGNETS" and filed on Nov. 19, 2014. The entirety of the above three prior applications is incorporated by reference as part of the disclosure of this patent document.

STATEMENT REGARDING FEDERALLY SPONSORED RESEARCH OR DEVELOPMENT

This invention was made with government support under Project ID. DMR-1120296 by the National Science Foundation (CCMR). The government has certain rights in the invention.

TECHNICAL FIELD

This patent document relates to circuits and devices having magnetic materials or structures based on electron spin torque effects and their applications, including non-volatile magnetic memory circuits, non-volatile logic devices, and spin-torque excited nanomagnet oscillators.

BACKGROUND

Electrons and other charged particles process spins as one of their intrinsic particle properties and such a spin is associated with a spin angular momentum. A spin of an electron has two distinctive spin states. Electrons in an electrical current may be unpolarized by having the equal probabilities in the two spin states. The electrons in an electrical current are spin polarized by having more electrons in one spin state than electrons in the other spin state. A spin-polarized current can be achieved by manipulating the spin population via various methods, e.g., by passing the current through a magnetic layer having a particular magnetization. In various magnetic microstructures, a spin-polarized current can be directed into a magnetic layer to cause transfer of the angular momenta of the spin-polarized electrons to the magnetic layer and this transfer can lead to exertion of a spin-transfer torque (STT) on the local magnetic moments in the magnetic layer and precession of the magnetic moments in the magnetic layer. Under a proper condition, this spin-transfer torque can cause a flip or switch of the direction of the magnetization of the magnetic layer.

The above spin-transfer torque (STT) effect can be used for various applications including STT magnetic random access memory (MRAM) circuits and devices. For example, a STT-MRAM circuit can include a magnetic tunnel junction (MTJ) as a magnetoresistive element formed of two or more thin film ferromagnetic layers or electrodes, which are usually referred to as the free magnetic layer or free magnetic layer (FL) having a magnetic moment that can be switched or changed and the pinned magnetic layer (PL) whose magnetic moment is fixed in direction. The free magnetic layer (FL) and the pinned magnetic layer (PL) are separated by an insulating barrier layer (e.g., a MgO layer) that is sufficiently thin to allow electrons to transit through the barrier layer via quantum mechanical tunneling when an electrical bias voltage is applied between the electrodes. The electrical resistance across the MTJ depends upon the relative magnetic orientations of the PL and FL layers. The magnetic moment of the FL can be switched between two stable orientations in the FL. The resistance across the MTJ exhibits two different values under the two relative magnetic orientations of the PL and FL layers, which can be used to represent two binary states "1" and "0" for binary data storage, or, alternatively, for binary logic applications. The magnetoresistance of this element is used to read out this binary information from the memory or logic cell.

SUMMARY

Various aspects of devices or circuits based on STT and Spin Hall effect are disclosed by using a spin Hall effect (SHE) metal layer coupled to a magnetic free layer for various applications. The efficiency or strength of the STT effect based on this combination of SHE and STT can be enhanced by an interface modification between the SHE metal layer and the magnetic free layer or by modifying or engineering the SHE metal layer by doping the SHE metal with certain impurities or other means.

In one aspect, a device is provided based on a spin Hall effect (SHE) and spin transfer torque (STT) effect to include a magnetic structure including a ferromagnetic layer having a magnetization direction that can be changed by spin transfer torque; a SHE layer that is electrically conducting and exhibits a spin Hall effect to, in response to an applied charge current, generate a spin-polarized current that is perpendicular to the applied charge current, the SHE layer located adjacent to the ferromagnetic layer to inject the spin-polarized current into the ferromagnetic layer; and a metal insertion layer in contact with and located between, the ferromagnetic layer and the SHE layer, through which the spin-polarized current generated by the SHE layer enters the ferromagnetic layer. The metal insertion layer has a thickness less than a spin diffusion length of the SHE layer and exhibits an electrical resistivity greater than an electrical resistivity of the SHE layer to enhance a switching of the magnetization direction of the ferromagnetic layer by the spin transfer torque effect.

In another aspect, a device is provided based on a spin Hall effect (SHE) and spin transfer torque (STT) effect to include a magnetic structure including a ferromagnetic layer having a magnetization direction that can be changed by spin transfer torque; and a SHE layer that is electrically conducting and exhibits a spin Hall effect to, in response to an applied charge current, generate a spin-polarized current that is perpendicular to the applied charge current. The SHE layer is located adjacent to the ferromagnetic layer to inject the spin-polarized current into the ferromagnetic layer, and includes a SHE metal material that exhibits a first resistivity without any doping or alloying and a different metal element doped in or alloyed with the SHE metal material to cause the doped or alloyed SHE metal to exhibit a second resistivity higher than the first resistivity without degrading a spin Hall conductivity of the SHE metal material. The device also includes a first electrical contact in contact with a first location of the SHE layer; a second electrical contact in contact with a second location of the SHE layer so that the first and second locations are on two opposite sides of the magnetic structure; a third electrical contact in contact with the magnetic structure; a magnetic structure circuit coupled between one of the first and second electrical contacts and the third electrical contact to supply a small current across the ferromagnetic layer that co-propagates with the spin-polarized current and is insufficient to switch the magnetization of the ferromagnetic layer without the spin-polarized current and the small current and the spin-polarized current together are sufficient to switch the magnetization of the ferromagnetic layer; and a charge current circuit coupled between the first and second electrical contacts to supply the charge current into the SHE layer. In this device, the different metal element doped or alloyed with the SHE metal material is selected so that the doped or alloyed SHE metal reduces a total power of the magnetic structure circuit magnetic structure circuit that is needed to switch the magnetization of the ferromagnetic layer when comparing a total power needed without the different metal element doped or alloyed with the SHE metal material.

In another aspect, a magnetic structure is provided to include a spin Hall effect base layer located over a substrate; a thin high-resistivity normal metal insertion layer located over the substrate and contacting the spin Hall effect base layer; and a magnetic free layer located over the substrate and contacting the thin insertion layer. The spin Hall effect base layer includes a non-magnetic conductor material that exhibits a spin Hall angle greater than about 0.05 and has a thickness no greater than about 5 times a spin diffusion length in the non-magnetic conductor material in the spin Hall base layer. The thin high-resistivity normal metal insertion layer includes an insertion layer non-magnetic metal layer having a thickness of at least one atomic layer thick but no thicker than the spin diffusion length. An interface of the thin high-resistivity normal metal insertion layer with the magnetic free layer has a spin mixing conductance that is greater than the conductance of the insertion layer itself. The thin high-resistivity normal metal insertion layer is configured to exhibit an electrical resistivity of about two times or more greater than an electrical resistivity of the spin Hall effect base layer.

In another aspect, a magnetic structure is provided to include a magnetic metallic layer or ferromagnetic insulator layer located over a substrate; a spin Hall effect layer located adjacent to but not in direct contact with the magnetic layer; and a thin high-resistivity normal metal insertion layer that is located between and contacting the spin Hall effect layer and the magnetic free layer. The non-magnetic conductor material that comprises the spin Hall effect base layer includes: a spin Hall angle greater than about 0.05; and a thickness no greater than about 5 times a spin diffusion length in the non-magnetic conductor spin Hall base layer material. The non-magnetic metal layer that comprises the thin insertion layer is at least one atomic layer thick but is no thicker than approximately its spin diffusion length. The interface of the insertion layer with the magnetic free layer has a spin mixing conductance that greater than the conductance of the insertion layer itself. The electrical resistivity of the insertion layer is about two times or more greater than that of the spin Hall effect base layer.

In another aspect, a magnetic memory device is provided to include a free magnetic layer having a magnetization direction that is changeable; a spin Hall effect layer comprising a first material having a first electrical resistivity, a first thickness, and having a relatively large spin Hall angle greater than 0.05, wherein the spin Hall effect layer is nonmagnetic and includes a metal exhibiting a large spin Hall effect to react to a charge current directed into the spin Hall effect layer to produce a spin-polarized current that is perpendicular to the charge current, the spin Hall effect layer being parallel to the free magnetic layer to direct the spin-polarized current generated in the spin Hall effect layer into the free magnetic layer; and an insertion layer comprising a second material having a second electrical resistivity, a second thickness, and a conductance, wherein the insertion layer is nonmagnetic and coupled between the free magnetic layer and the spin Hall effect metal layer, and wherein a spin mixing conductance between the insertion layer and the free magnetic layer is greater that the conductance. The second thickness is at least one atomic layer thick, wherein the second thickness is less than the first thickness, and wherein the second electrical resistivity is at least twice the first electrical resistivity.

In another aspect, a magnetic structure is provided to include a free magnetic layer having a magnetization direction that is changeable; a spin Hall effect layer comprising a first material having a first electrical resistivity, a first thickness, wherein the spin Hall effect layer is nonmagnetic and includes a metal exhibiting a large spin Hall effect to react to a charge current directed into the spin Hall effect layer to produce a spin-polarized current that is perpendicular to the charge current, the spin Hall effect layer being parallel to the free magnetic layer to direct the spin-polarized current generated in the spin Hall effect layer into the free magnetic layer; and an insertion layer comprising a second material having a second electrical resistivity, a second thickness, and a conductance, wherein the insertion layer is nonmagnetic and coupled between the free magnetic layer and the spin Hall effect metal layer, and wherein a spin mixing conductance between the insertion layer and the free magnetic layer is greater than the conductance. The second thickness is at greatest a spin relaxation length of the second material, wherein the second electrical resistivity is at least twice the first electrical resistivity.

In another aspect, a magnetic structure is provided to include a magnetic tunneling junction (MTJ) that includes (1) a pinned magnetic layer having a fixed magnetization direction, (2) a free magnetic layer having a magnetization direction that is changeable, and (3) a non-magnetic junction layer between the magnetic free layer and the pinned magnetic layer and formed of an insulator material sufficiently thin to allow tunneling of electrons between the magnetic free layer and the pinned magnetic layer; a spin Hall effect metal layer that is nonmagnetic and includes a metal exhibiting a large spin Hall effect to react to a charge current directed into the spin Hall effect metal layer to produce a spin-polarized current that is perpendicular to the charge current, the spin Hall effect metal layer being parallel to and in contact with the free magnetic layer to direct the spin-polarized current generated in the spin Hall effect metal layer into the free magnetic layer; and a metal insertion layer positioned between the spin Hall effect metal layer and the MTJ and structured to include a nonmagnetic metal material of a thickness not greater than a thickness of the spin Hall effect metal layer and exhibiting a high-resistivity greater than a resistivity of the spin Hall effect metal layer.

In another aspect, a magnetic structure is disclosed to include a spin Hall effect base layer located over a substrate; a thin high-resistivity normal metal insertion layer located over the substrate and contacting the spin Hall effect base layer; and a magnetic free layer located over the substrate and contacting the thin insertion layer. The spin Hall effect base layer includes a non-magnetic conductor material that exhibits a spin Hall angle greater than about 0.05 and has a thickness no greater than about 5 times a spin diffusion length in the non-magnetic conductor material in the spin Hall base layer. The thin high-resistivity normal metal insertion layer includes an insertion layer non-magnetic metal layer having a thickness of at least one atomic layer thick but no thicker than the spin diffusion length; and an interface of the thin high-resistivity normal metal insertion layer with the magnetic free layer has a spin mixing conductance that is greater than the conductance of the insertion layer itself; and the thin high-resistivity normal metal insertion layer is configured to exhibit an electrical resistivity of about two times or more greater than an electrical resistivity of the spin Hall effect base layer.

In another aspect, the above-mentioned magnetic structures can be used to form 3-terminal or 2-terminal devices. For example, a magnetic tunneling junction memory device based on a three-terminal circuit configuration is disclosed to include an array of memory cells for storing data; and a memory control circuit coupled to the array of memory cells and operable to read or write data in the memory cells. Each memory cell is a 3-terminal circuit and includes a magnetic structure as any one of the above-mentioned magnetic structures, and further includes (1) a first electrical terminal in electrical contact with the MTJ from a side having the pinned magnetic layer to receive a gate voltage that modifies a current threshold of a spin-polarized current flowing across the MTJ for switching the magnetization of the free magnetic layer; and second and third electrical terminals in electrical contact with two contact locations of the spin Hall effect metal layer on two opposite sides of the free magnetic layer to supply the charge current in the spin Hall effect metal layer. For example, a magnetic tunneling junction memory device based on a two-terminal circuit configuration is disclosed to include an array of memory cells for storing data; and a memory control circuit coupled to the array of memory cells and operable to read or write data in the memory cells. Each memory cell is a 2-terminal circuit and includes a magnetic structure as any one of the above-mentioned magnetic structures, and further includes (1) a first electrical terminal in electrical contact with the MTJ from a side having the pinned magnetic layer to receive a gate voltage that modifies a current threshold of a spin-polarized current flowing across the MTJ for switching the magnetization of the free magnetic layer; and (2) a second terminal in electrical contact with a contact location of the spin Hall effect metal layer.

In yet another aspect, a magnetic structure based device based on a spin Hall effect a magnetic circuit element is disclosed to include a free magnetic layer having a magnetization direction that is changeable; and a spin Hall effect layer comprising a first material having a first electrical resistivity, a first thickness, wherein the spin Hall effect layer is nonmagnetic and includes a metal exhibiting a large spin Hall effect to react to a charge current directed into the spin Hall effect layer to produce a spin-polarized current that is perpendicular to the charge current, the spin Hall effect layer being parallel to the free magnetic layer to direct the spin-polarized current generated in the spin Hall effect layer into the free magnetic layer. The structure also includes an insertion layer comprising a second material having a second electrical resistivity, a second thickness, and a conductance, wherein the insertion layer is nonmagnetic and coupled between the free magnetic layer and the spin Hall effect metal layer. The first material includes Pt and the second material includes Hf so that a combined structure of the spin hall effect layer including Pt and the insertion layer including Hf forms a composite structure of a high resistivity.

The above and other aspects and features, and exemplary implementations and applications, are described in greater detail in drawings, the description and the claims.

BRIEF DESCRIPTION OF DRAWINGS

FIG. 17C shows a diagram illustrating the direction of an effective spin torque field $B_{ST}$ under different orientations of a FL magnetic moment. The injected spins are assumed to be along the x direction as an example.

FIG. 17D shows a diagram illustrating the relationship between the direction of the effective spin torque field $B_{ST}$ and that of the applied field $B_{ext}$.

DETAILED DESCRIPTION

Figure 1A:
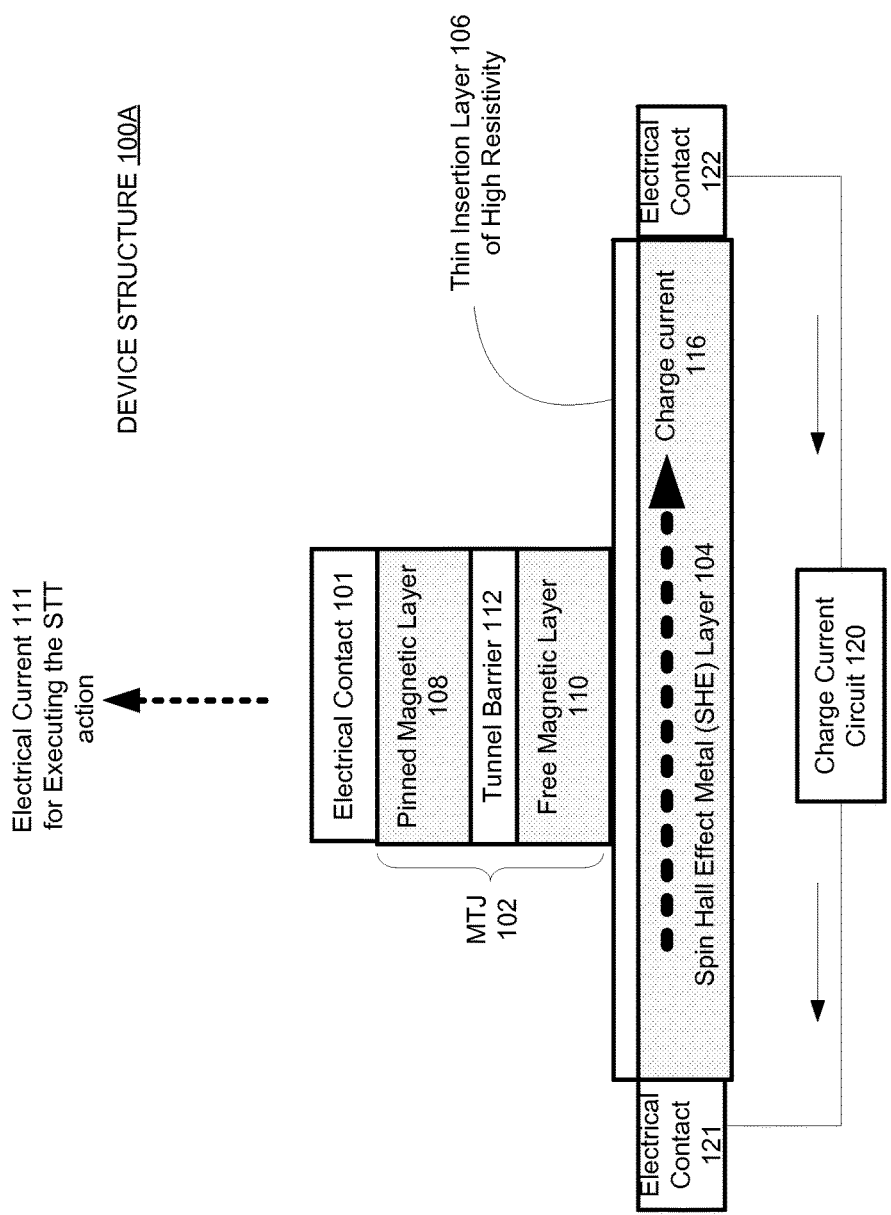
FIG. 1A shows an example of a magnetic tunneling junction (MTJ) device structure having a spin Hall effect (SHE) metal and a thin insertion layer of high resistivity configured to modify the interfacing between the SHE metal and the MTJ for enhancing the STT effect.

The techniques and devices disclosed in this document provide magnetic circuits and devices based on the spin-transfer torque (STT) effect via injection of spin-polarized electrons or charged particles by using a charge current in a spin Hall effect (SHE) metal layer coupled to a magnetic free layer for various applications, including non-volatile memory functions, logic functions and others. The spin Hall effect metal layer can be located adjacent to the free magnetic layer or in direct contact with the magnetic free layer. The charge current is applied to the spin Hall effect metal layer via first and second electrical terminals at two different locations of the spin Hall effect metal layer to generate a spin-polarized current via a spin Hall effect to enter the magnetic free layer. The injected spin-polarized current in the magnetic free layer can cause the magnetization direction of the magnetic free layer to change based on the spin-transfer torque (STT) effect.

In spin-transfer-torque magnetic random access memory (STT-MRAM) and STT magnetic logic devices, both perpendicular and in-plane magnetic anisotropy structures can be used. For example, magnetic free layers with perpendicular magnetic anisotropy (PMA) can be advantageously used for certain circuit or device applications. For a given degree of thermal stability, free layers with PMA can undergo anti-damping switching driven by spin-transfer torque using smaller values of applied spin torque compared to layers with in-plane anisotropy. This is because for devices with PMA the critical torque for switching is typically directly proportional to the anisotropy energy barrier that determines thermal stability, whereas for devices with in-plane magnetic anisotropy, the critical torque for switching is typically increased by an additional term proportional to the demagnetization field, a term that does not contribute to thermal stability. This difference makes devices with PMA in principle more energy efficient. For another example, PMA structures can also be scaled down to smaller sizes while remaining thermally stable than devices with in-plane anisotropy, which should enable memories and logic circuits with greater density.

One efficient way for applying a spin-transfer torque to a magnetic layer is to use the spin Hall effect in a material with strong spin orbit coupling to generate a current that flows perpendicular to an applied charge current, and to have this spin-polarized current be absorbed by an adjacent magnetic layer to apply a spin torque. This effect can be used to switch in-plane polarized magnetic layers through an anti-damping mechanism. This SHE-based STT is different from the STT process using a fixed or pinned ferromagnetic layer as a spin polarization layer to control the spin of an injected current passing through the fixed or pinned ferromagnetic layer and, notably, can have a higher transfer efficiency and produce stronger spin-transfer torque in the magnetic free layer. As such, a lower charge current can be used in the SHE-based STT design to achieve the same STT effect which requires a higher driving current in the STT process using a fixed or pinned ferromagnetic layer as a spin polarization layer. The efficiency or strength of the STT effect based on this combination of SHE and STT can be enhanced by an interface modification between the SHE metal layer and the magnetic free layer or by modifying or engineering the SHE metal layer by doping the SHE metal with certain impurities or other means.

FIG. 1A shows an example of a magnetic tunneling junction (MTJ) device structure 100A having a conductive SHE layer exhibiting spin Hall effect and an insertion layer for improving the interfacing between the MTJ and the SHE layer. The device structure 100 includes a top electrical contact 101 in contact with a MTJ 102, a conductive SHE layer 104, and a thin insertion layer 106 coupled between MTJ 102 and conductive magnetic layer 104. MTJ 102 further includes a pinned (or "reference") magnetic layer 108, a free magnetic layer 110 in contact with electrical contact 101, and a tunnel barrier layer 112 sandwiched between and in contact with both the pinned and free magnetic layers. The multiple layers in MTJ 102, the conductive SHE layer 104, and the insertion layer 106, having specific selection of the materials and dimensions, are configured to provide a desired interfacial electronic coupling between the free magnetic layer and conductive SHE layer 104 to allow a large flow of spin-polarized electrons or charged particles in conductive SHE layer 104 in response to a given charge current injected into conductive SHE layer 104 and to provide efficient injection of the generated spin-polarized electrons or charged particles into the free magnetic layer of MTJ 102. Two electrical contacts 121 and 122 are placed at two locations of the conductive SHE layer 104 and are coupled to a charge current circuit 120 to supply the charge current 116 to the conductive SHE layer 104. In implementations, the free and pinned magnetic layers 108 and 110 may have a magnetization that is perpendicular to the layers or a magnetization that is parallel to the layer.

In addition to the two electrical terminals formed by the two electrical contacts 121 and 122, the SHE-based MTJ device structure 100A in FIG. 1A has a third electrical terminal by the electrical contact 101 on the top of the MTJ 102. Therefore, different from other STT-MTJ devices using a fixed or pinned ferromagnetic layer as a spin polarization layer, the SHE-based MTJ device structure 100 is a three-terminal device with two circuits—the first circuit is the charge current circuit 120 formed by the two terminals 121 and 122 with the conductive SHE layer 104, and the second circuit is an MTJ circuit coupled to the MTJ 102 via the first electrical contact 101 on the top of the MTJ 102 and either one of the contacts 121 and 122.

The two circuits in FIG. 1A can operate independently from each other in some implementations. For example, the charge current circuit is activated to perform a writing operation to write new date into the MTJ 102 by using the SHE charge current to flip the free layer 110 while the MTJ circuit is used as a sensing circuit in reading the stored data in the MTJ 102 with a low read current flowing across the MTJ 102 without changing the magnetization of the free layer 110 in the MTJ 102.

In other implementations, the two circuits in FIG. 1A can operate together or collectively at the same time to achieve a desired operation. For example, the 3-terminal magnetic circuit in FIG. 1A can achieve enhanced spin-transfer torque (STT) via a combination of (1) injection of spin-polarized electrons or charged particles by using a charge current in a spin Hall effect metal layer and (2) application of a gate voltage to the free magnetic layer to manipulate the magnetization of the free magnetic layer for various applications, including non-volatile memory functions, logic functions and others.

The disclosed MRAM cell employing the SHE as the writing mechanism avoids running a large writing current through the tunnel barrier of the MTJ 102 in the example in FIG. 1A because the charge current 106 in the conductive SHE layer 106 is primarily responsible for flipping the magnetization of the free layer 110 in a writing operation. This feature can greatly increase the lifetime of the memory cell and greatly ease the reproducibility margins needed to achieve reliable reading and writing. In many two-terminal ST-MRAM devices based on the STT process using a fixed or pinned ferromagnetic layer as a spin polarization layer, both the writing and reading operation rely on running a current through the tunneling barrier and this has an undesirable trade-off in order to get a large tunneling magnetoresistance and at the same time allow for a large current to flow through the barrier. In many cases, it can be difficult to satisfy these two requirements simultaneously. The three-terminal MRAM cell that uses the SHE as the writing mechanism avoids such issues and enables optimization of the device performance of the MTJ for the reading operation alone without affecting the writing operation. Therefore, the disclosed 3-terminal devices using SHE-based SST provide considerable freedom in the design of the MTJ, for example, the thickness of the tunnel barrier can be adjusted to get the optimum tunneling magnetoresistance and the appropriate impedance match with the circuitry that provides the write currents and the circuitry that reads the sensing voltage.

In FIG. 1A, the charge current circuit 120 coupled between the contacts 121 and 122 injects the charge current 116 in the SHE metal layer 104, such as Pt, W or Ta in some implementations. This can create a transverse spin current that would, through the spin transfer, exert a magnetic torque on an adjacent ferromagnetic thin film layer (e.g., free layer 110) or thin film patterned nanomagnetic element whereby the magnetic configuration of the ferromagnetic layer or the magnetic orientation of the nanomagnetic element can be altered for the purpose of non-volatile information storage, executing a non-volatile logic operation, or creating a microwave signal by driving the magnetic oscillation.

Specifically, the example device 100A in FIG. 1A uses the thin metal insertion layer 106 of near atomic thickness to improve the spin transparency of the interface (reduce any spin attenuation that would otherwise occur when the spin current passes from the surface of the spin Hall metal into the surface of the ferromagnetic metal. For example, a Hf insertion layer can be used as the layer 106. Other insertion materials that suppress detrimental intermixing or any other process that results in enhanced spin scattering at the interface may also be used provided that such an insertion layer does not add any significant spin scattering of its own.

The insertion layer 106, in most applications, should be an ultra-thin layer, of one to up to five atoms thick, of another conducting material between the spin Hall metal 104 and the ferromagnetic layer 110 (e.g., a free layer). This insertion layer 106, if properly selected, can materially reduce the undesirable "pumping" of spin currents from the spin-torque-excited ferromagnetic material in the layer 110 or nanomagnetic element back into the spin Hall material of the SHE layer 104. Such spin pumping would otherwise increase the magnetic damping of the ferromagnetic layer 110, and hence otherwise lead to the requirement of an increased electrical current 111 through the ferromagnetic layer 110 to execute the desired spin torque action; magnetic reversal or persistent magnetic excitation, on the ferromagnetic layer 110. An increased operating current 111 is equivalent to the spin Hall device being less energy efficient. As such, it is desirable to minimize both the electrical current 111 and the total electrical energy required (e.g., also reducing the charge current 116 in the SHE metal layer 104) to effect the desired spin torque action on the ferromagnetic element and this is of primary importance to the implementation of spin Hall devices in magnetic memory and non-volatile logic applications.

The insertion layer 106 may also be structured to improve the overall spin transparency of the interface between the MTJ 102 and the SHE metal layer 104 by creating a more ideal interface through which the spin current generated by the spin Hall effect in the spin Hall metal 104 as part of the electrical current 111 flowing through the MTJ 102 can pass with a reduced probability of spin-flip scattering, that is with a substantially reduced spin current attenuation. This aspect of the insertion layer 106 can be used to result in more of the initial spin current that is generated in the spin Hall layer 104 impinging on the ferromagnetic layer 110 or element 102 and exerting its spin torque effect thereupon. This improvement of the spin transparency of the interface will also directly increase the energy efficiency of the device 100A.

For the suppression of spin pumping, the insertion layer 106 should have an electronic structure that results in a low spin mixing conductance at the interface between the insertion layer 106 and the ferromagnetic layer 110. One effective way is to use the combination with a low resistivity spin Hall metal that has a relatively high Sharvin conductance such as Pt which results in a high spin mixing conductance at the Pt ferromagnetic interface, rather than with spin Hall metals, such as the beta phase of W, that has a high resistivity and hence a low Sharvin conductance. Tests were conducted to demonstrate that a thin layer of amorphous, high resistivity Hf can be quite effective for use as the insertion layer 106. Other amorphous and/or high resistivity metal layers of materials that have low spin scattering rates can also be effectively used for the insertion layer 106.

For enhancement of the interfacial spin transparency, the insertion layer 106 can be configured to suppress the intermixing of the spin Hall metal 104 with the ferromagnetic material 110 that, in the absence of the insertion layer 106, the structure would otherwise have excessive spin scattering at the spin Hall metal ferromagnetic metal interface. Such scattering attenuates the spin current passing through the interface and thus is desirable. Moreover the insertion layer 106 may be structured so that it does not have a high spin scattering rate either by itself or when intermixed with either the ferromagnetic layer or the spin Hall metal, so that the overall spin transparency of the interface with the insertion layer included is materially higher than when it is absent. Tests were conducted to demonstrate that approximately 0.5 nm layer of Hf inserted between Pt and an FeCo alloy can be effective at suppressing this intermixing and results in an enhanced interfacial spin transparency. A metallic element that has a high negative enthalpy for reaction with the spin Hall metal (high heat of formation), such as Hf with Pt or Al with Pt, can be effective in suppressing the intermixing with the ferromagnetic material and enhancing the spin transparency of the interface.

Figure 1B:
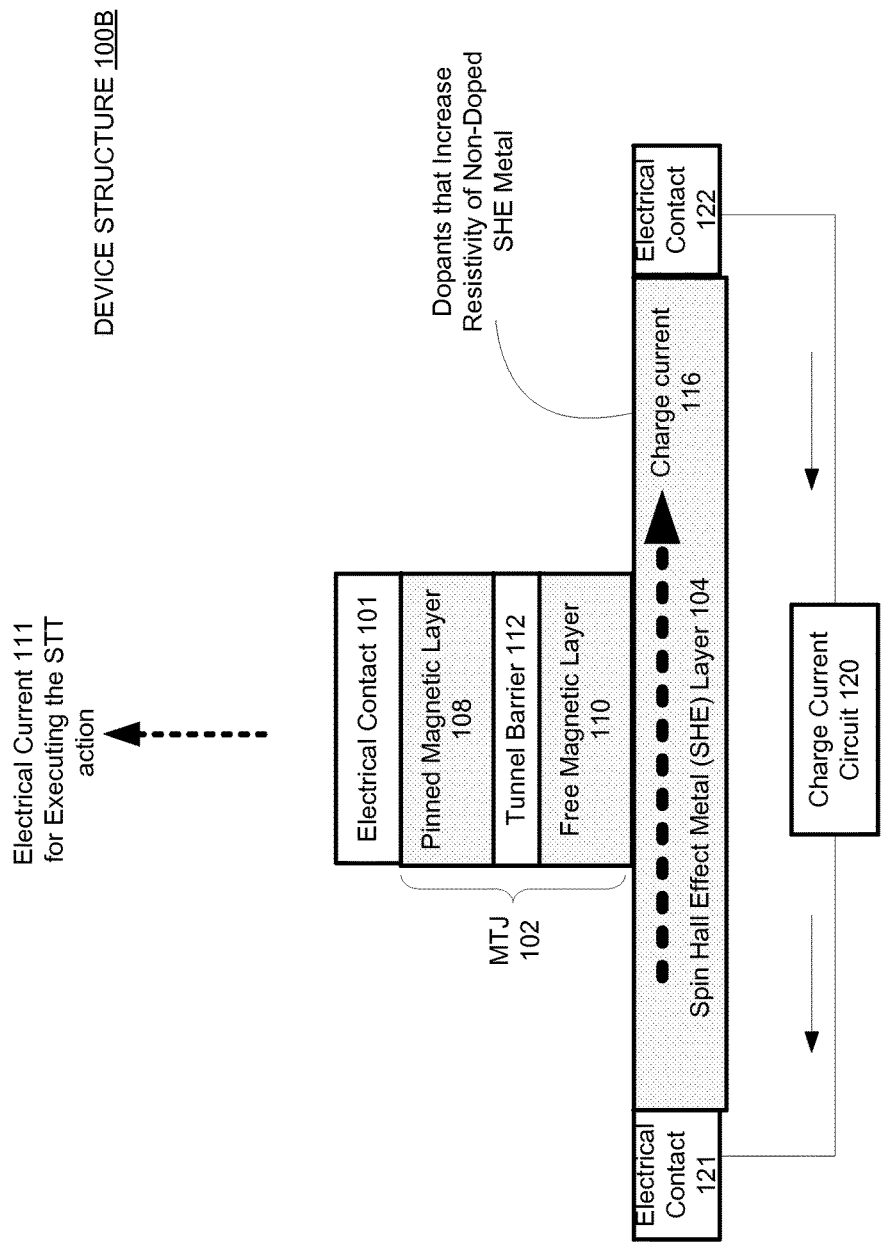
FIG. 1B shows an example of a magnetic tunneling junction (MTJ) device structure having a spin Hall effect (SHE) metal that is doped to exhibit a high resistivity for enhancing the STT effect.

FIG. 1B shows another approach to improving the SHE-STT effect by enhancing the spin Hall angle or spin Hall ratio in the spin Hall metal itself, by the means of increasing the average resistivity of the spin Hall metal. In the intrinsic limit of the spin Hall effect, the strength of the spin current density that is generated in the SHE metal varies with the spin Hall conductivity of the metal times its electrical resistivity. By increasing the resistivity of the SHE metal (e.g., Pt) via surface scattering and impurity scattering, the spin current density can be increased by at least a factor of two and potentially much more.

Tests were conducted to demonstrate this use of increasing the resistivity of a low resistivity spin Hall metal film to enhance the amplitude of the spin current that is generated by an applied electrical current. For Pt and other spin Hall metals of technological interest the spin Hall effect is in the "intrinsic" limit. In that case the spin Hall conductivity is determined by the electronic band structure of the SHE metal, defect and phonon scattering determines the electrical resistivity of the metal. Since the amplitude of the spin current density generated by the spin Hall effect is determined by the product of the spin Hall conductivity times the electrical resistivity of the spin Hall metal, increasing the resistivity of the spin Hall metal can increase the efficiency of the spin Hall effect for effecting spin torque operations. This is because energy efficiency of the spin Hall effect will scale as the square of the spin current density divided by the electrical resistivity and hence in the intrinsic limit the energy efficiency will vary inversely with the electrical resistivity of the spin Hall metal. It is required however that whatever means that is employed to increase the electrical resistivity does not degrade the spin Hall conductivity, or materially increase the spin flip scattering rate within the spin Hall metal.

The electrical resistivity of a spin Hall metal film, such as Pt, can be increased by the use of either surface-enhanced scattering or the use of impurities in the bulk of the film. Our tests demonstrated that for Pt films of the order of approximately 5 nm or less in thickness the placement of a high resistivity metal, such as Ta or another suitable metal adjacent to one or both sides of the Pt can substantially increase the average resistivity of the Pt layer, with the increase growing approximately inversely with the Pt thickness. In our tests, the transverse spin current density generated within the Pt layer by the spin Hall effect varies linearly with this enhanced electrical resistivity.

The introduction of impurities into the SHE metal layer (e.g., Pt) can also increase the electrical resistivity of the Pt, and hence enhance the efficiency of its generation of the spin current. Our tests have demonstrated that 1% Hf concentration mixed into the Pt can approximately double the electrical resistivity of the film, and increases the spin current density by factor of two in comparison to that produced by the same electrical current flowing through an un-doped Pt layer. The dopant material should be selected such that, either due to it type or concentration, the dopant material does not degrade the spin Hall conductivity of the host spin Hall metal, or increase the spin relaxation rate in the metal.

Figure 1C:
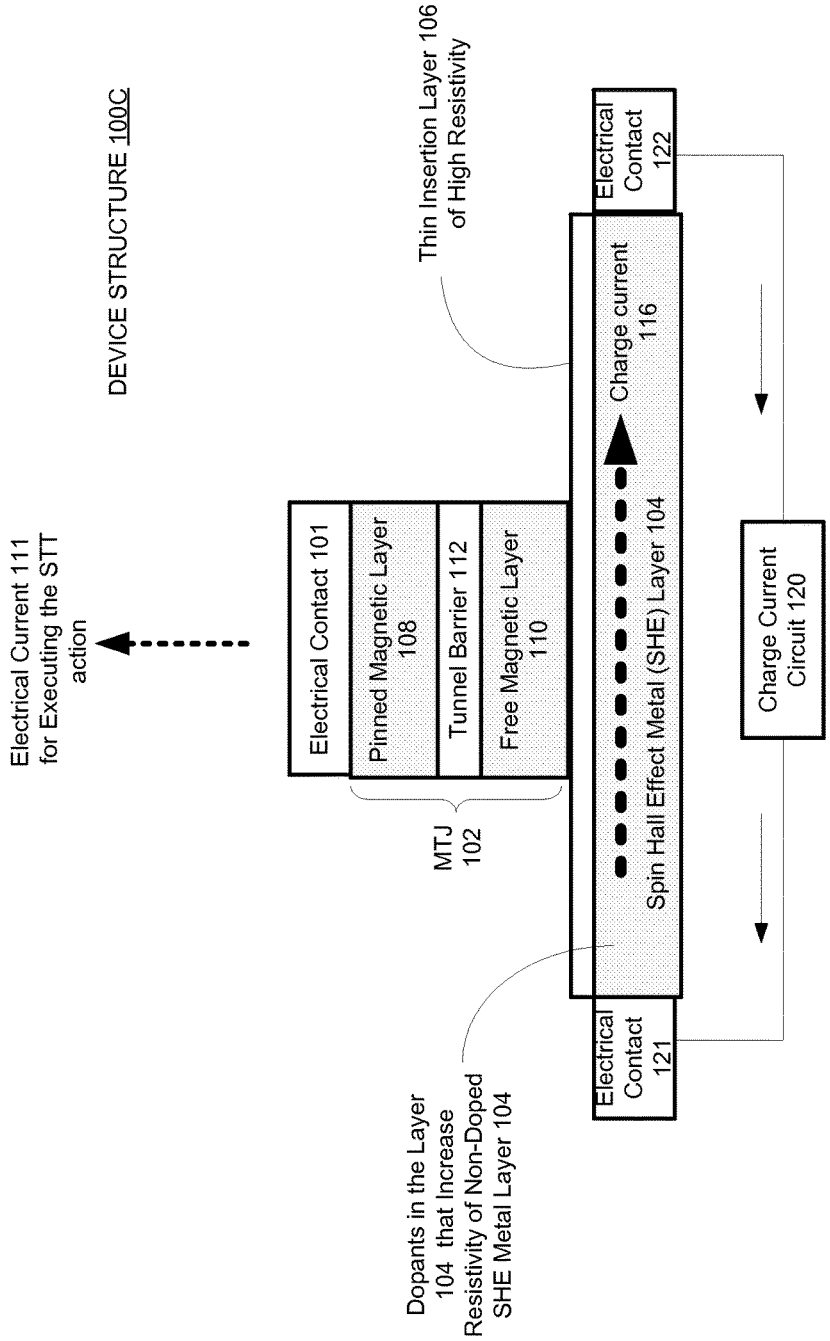
FIG. 1C shows another example of a MTJ device structure having a spin Hall effect (SHE) metal that is doped to exhibit a high resistivity for enhancing the STT effect.

FIG. 1C shows another example device based on the SHE-STT effect by enhancing the spin Hall effect using both the insertion layer in FIG. 1A and the doping or alloying of the SHE metal in FIG. 1B.

As will be described in greater detail below, a three terminal device configuration can be constructed based on the spin Hall effect to reversibly switch the magnetic orientation of a thin film ferromagnetic element that is placed adjacent to the spin Hall effect metal layer, while the magnetic orientation of the ferromagnetic element is determined through the resistance of a magnetic tunnel junction of which the reversible ferromagnetic element forms one of the magnetic electrodes. Notably, such a three terminal device enables separation of the write current path from the read current path, write upon read errors can be significantly reduced or eliminated as is tunnel barrier wear-out during the repetitive write cycles. In addition, such a three terminal device configuration allows the use of higher write current pulses with a significantly reduced risk of tunnel junction electrical breakdown. This enables the use of the three-terminal spin Hall device as a high speed (e.g., 2 ns in some cases), non-volatile memory cell. Furthermore, the three terminal spin Hall device allows the use of higher resistance tunnel junctions for read-out which will improve the voltage signal change between the low resistance (zero) and high resistance (one) states. This feature enables a much faster read time than various two-terminal SST-MRAM circuitry. The non-volatility, and high energy efficiency, of high performance spin Hall memory will be a major enabler for the development of "green" electronics for both mobile and high-performance digital applications.

In device 100A, 100B or 100C, each of the free magnetic layer or the pinned magnetic layer can be a single layer of a suitable magnetic material or a composite layer with two or more layers of different materials. The free magnetic layer and the pinned magnetic layer can be electrically conducting while the barrier layer between them is electrically insulating and sufficiently thin to allow for electrons to pass through via tunneling. The conductive magnetic layer 104 can be adjacent to the free magnetic layer or in direct contact with the free magnetic layer to allow the spin-polarized current generated via a spin Hall effect under the charge current to enter the free magnetic. Moreover, conductive magnetic layer 104 can be implemented as a single layer of a suitable magnetic material exhibiting spin Hall effect, or a composite layer with two or more layers of different materials.

Various embodiments disclosed in this patent document provide device structures which are configured to utilize anomalous Hall effect, which combines the physics of the spin Hall effect with ferromagnetism or ferromagnetism, to produce efficient SHE-STT operations. Embodiments in conjunction with FIGS. 2, 3, 4A and 4B below provide different embodiments based on the device structure 100A in FIG. 1A. Similarly, those embodiments can be implemented based on the device structure 100B in FIG. 1B or the device structure 100C in FIG. 1C.

Figure 2:
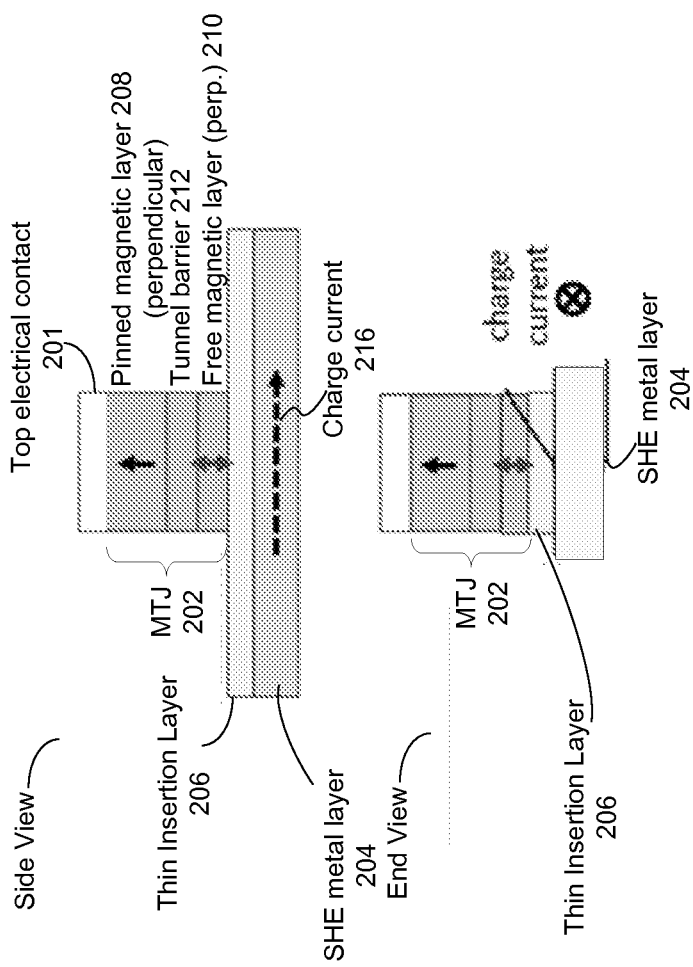
FIG. 2 shows a schematic of an exemplary device structure having a free magnetic layer of perpendicular magnetic anisotropy.

FIG. 2 shows a schematic of an exemplary device structure 200 that supports SHE-STT switching of an magnetic free layer having perpendicular magnetic anisotropy. More specifically, FIG. 2 provides two views of the same device structure 200: one side view on the top of FIG. 2 displaying the long side of the SHE layer and one end view at the bottom of FIG. 2 displaying the short side of the SHE layer. As can be seen in the side view of device structure 200, device structure 200 includes a top electrical contact 201 in contact a MTJ 202, a SHE layer 204, and an insertion layer 206. MTJ 202 further includes a pinned (or "reference") magnetic layer 208, a free magnetic layer 210 in contact with top electrical contact 201, both magnetic layers 208 and 210 are structured to having a perpendicular magnetic anisotropy, and a tunnel barrier layer 212 sandwiched between and in contact with both the pinned and free magnetic layers. In the embodiment shown, pinned magnetic layer 208 also has a perpendicular magnetization pointing upward (but can also point downward in other embodiments). Free magnetic layer 210 also has a perpendicular magnetization but its orientation can be changed between an up state and a down state depending on the applied spin-transfer torque.

The SHE layer 204 is positioned at the bottom of device structure 200 and coupled to free magnetic layer 210 of MTJ 202 through the insertion layer 206 disposed between THE SHE layer 204 and free magnetic layer 210. To cause the spin Hall effect in device structure 200, an exemplary in-plane charge current 216 passing through conductive magnetic layer 204 along the long side of the device may be used (shown as a dashed black arrow in the end view of device structure 200).

Figure 3:
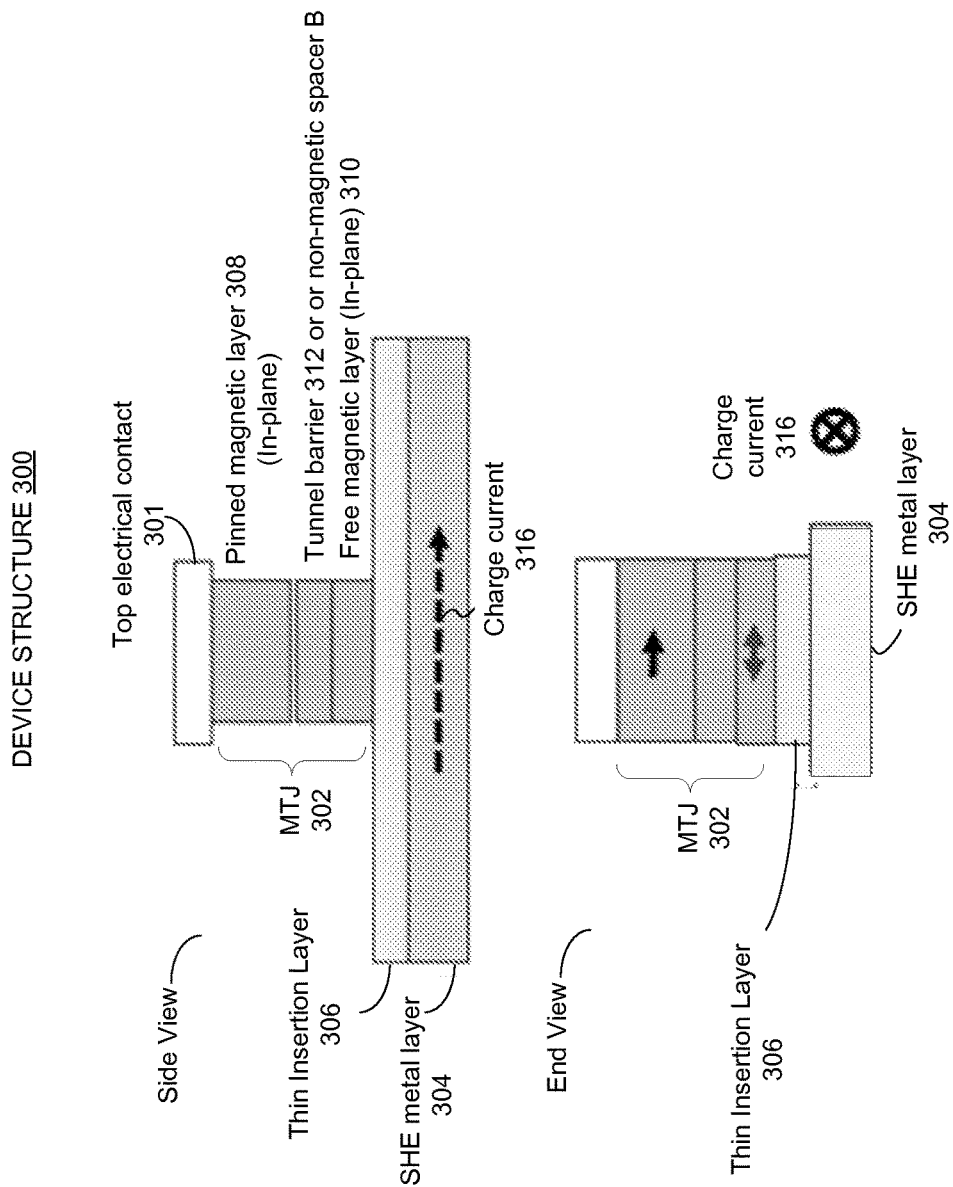
FIG. 3 shows a schematic of an exemplary device structure having an in-plane free magnetic layer.

For high-speed and low-total-energy magnetic memory and logic applications, it can be advantageous to use an in-plane-polarized magnetic free layer and to drive switching by applying a short pulse of perpendicularly-oriented spin torque (or a combination of perpendicular and in-plane torque) to achieve processional reversal of the free layer. FIG. 3 shows a schematic of an exemplary device structure 300 having an in-plane free magnetic layer. Similarly to FIG. 2, FIG. 3 provides two views of the same device structure 300: one side view on the top of FIG. 3 displaying the long side of the SHE layer and one end view at the bottom of FIG. 3 displaying the short side of the SHE layer. The side view also shows the in-plane charge current 316 passing through the SHE 304. Device structure 300 also has substantially the same multi-layer structure as device structure 200, which includes a top electrical contact 301, a MTJ 302, a SHE layer 304, and an insertion layer 306. MTJ 302 further includes a pinned magnetic layer 308 and a free magnetic layer 310, and, a tunnel barrier layer 312 sandwiched between and in contact with both the pinned and free magnetic layers. In device structure 300, pinned magnetic layer 308 has an in-plane magnetization pointing to the right (but can also point to the left in other embodiments). Free magnetic layer 310 also has an in-plane magnetization but its orientation can be changed between parallel to and antiparallel to the magnetization of layer 308 depending on the applied spin-transfer torque. The spin-transfer torque produced by the Hall effect may be used to drive the switching of the in-plane magnetization of free magnetic layer 310 at low current levels (with respect to conventional magnetic tunnel junctions). The magnetic moment 314 can be switched back and forth between its two stable in-plane orientations by applying pulses of positive or negative in-plane current.

In the examples in FIGS. 2 and 3, the free layer is shown to have one magnetic domain. In some implementations, the ST-MRAM magnetic memory devices based on the design in FIG. 1A or FIG. 1B may use a magnetic free layer including two or more different magnetic domains in which adjacent domains are structured to have opposite magnetization directions and a magnetic domain wall between two adjacent magnetic domains is changeable in position within the magnetic free layer. Such magnetic domains may have magnetization directions that are parallel to the magnetic free layer or perpendicular to the magnetic free layer. The SHE-injected spin-polarized current can be used to shift the position of such a domain wall by shifting one domain in one magnetization under the MTJ junction to achieve one digital state and an adjacent domain in the opposite magnetization under the MTJ junction to achieve another digital state.

Figure 4A:
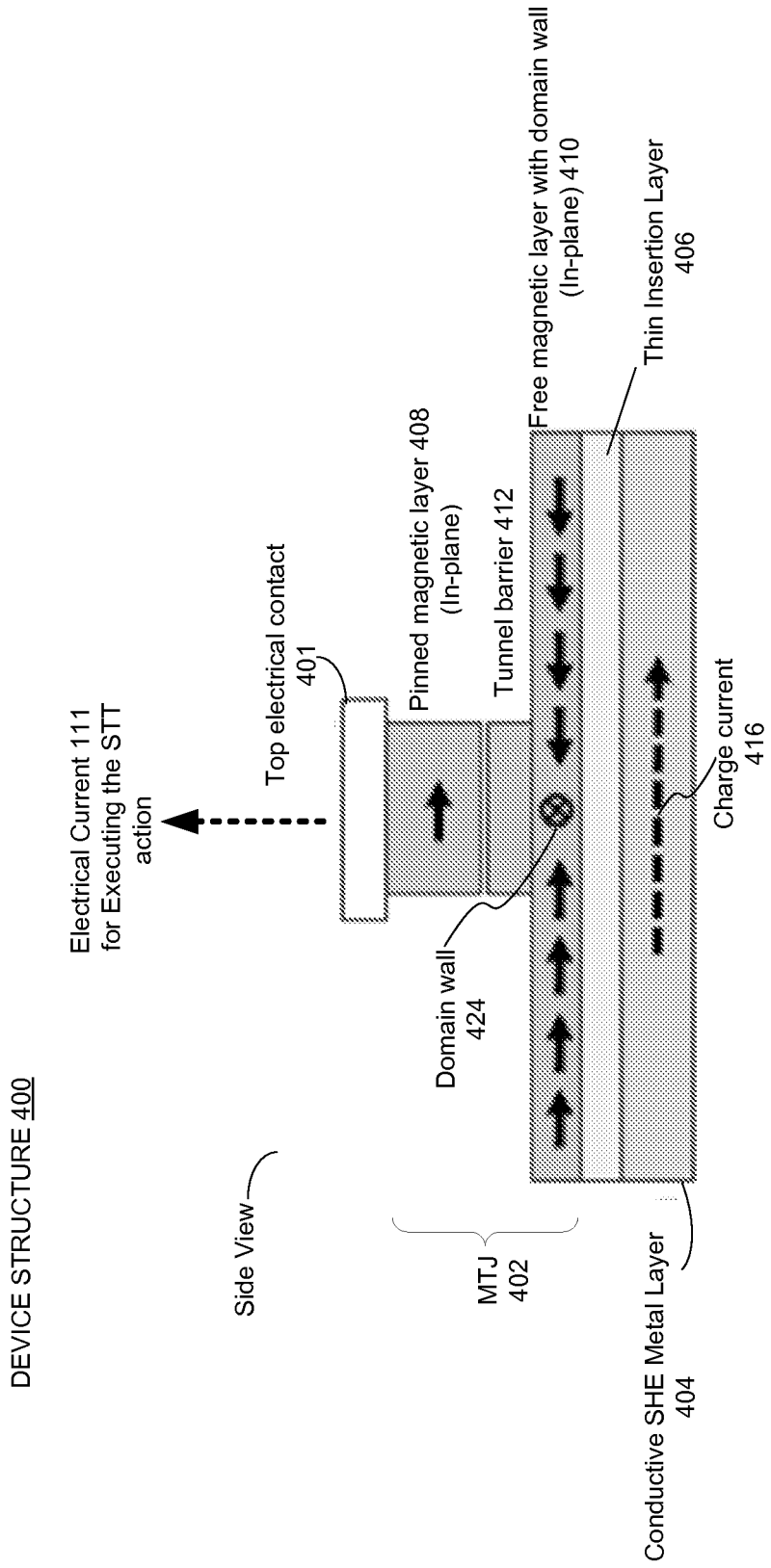
FIGS. 4A, 4B and 4C show examples of MTJ device structures for using at least the perpendicular spin torque from the spin Hall effect to manipulate a magnetic domain wall within the magnetic free layer of an MTJ.

FIG. 4A shows a schematic of an exemplary device structure 400 for using the spin Hall effect to manipulate a magnetic domain wall within the in-plane magnetic free layer. Such a device structure can also be used to build magnetic memory based on changing the domain wall location from one side of the magnetic free layer to the other side of the magnetic free layer. The device structure 400 has substantially the same multi-layer structure as device structure 300, which includes a top electrical contact 401, a MTJ 402, a SHE metal layer 404, and an insertion layer 406. MTJ 402 further includes a pinned magnetic layer 408 and a free magnetic layer 410, and a tunnel barrier layer 412 sandwiched between and in contact with both the pinned and free magnetic layers. In device structure 400, pinned magnetic layer 408 has an in-plane magnetization pointing to the right (but can also point to the left in other embodiments). Free magnetic layer 410 also has an in-plane magnetization. However, the in-plane magnetization is configured as two opposing magnetic domains of opposing magnetizations and a domain wall 424 formed between the two magnetic domains. To maintain the stability of the two opposing in-plane magnetizations, free magnetic layer 410 is configured with high in-plain magnetic anisotropy, for example, by using a large dimension in the direction of the magnetization (as shown in FIG. 4A). In some embodiments, free magnetic layer 410 are implemented with magnetic wires.

FIG. 4A shows the domain wall location to be substantially in the middle of free magnetic layer 410 directly under the tunneling junction. In this scenario, the magnetizations of the two opposing magnetic domains substantially cancel out each other. However, a charge current in the SHE metal layer 404 can be used to move the domain wall location either all the way to the left or all the way to the right to implement a controlled switching. For example, when a charge current 416 flows in the direction shown in FIG. 4A, the generated spin-transfer torque will move domain wall 424 all the way to the right in free magnetic layer 410, thereby creating a net magnetization which is parallel to the magnetization of the pinned magnetic layer 408. In this scenario, the MTJ 402 can be in a low resistance state. Next, when charge current 416 flows in the opposite direction to the one shown in FIG. 4A, the direction of the generated spin-transfer torque is reversed, and the spin-transfer torque will move domain wall 424 all the way to the left in free magnetic layer 410, thereby creating a net magnetization which is antiparallel to the magnetization of the pinned magnetic layer 408. In this scenario, the MTJ 402 can be in a high resistance state. Hence, the domain wall can be controllably and efficiently moved back and forth in two stable states. Because the charge current is not used to switch the magnetization in each domain, the amplitude of the charge current may be smaller than when those used to switch the magnetization in the free magnetic layer 410.

Figure 4B:
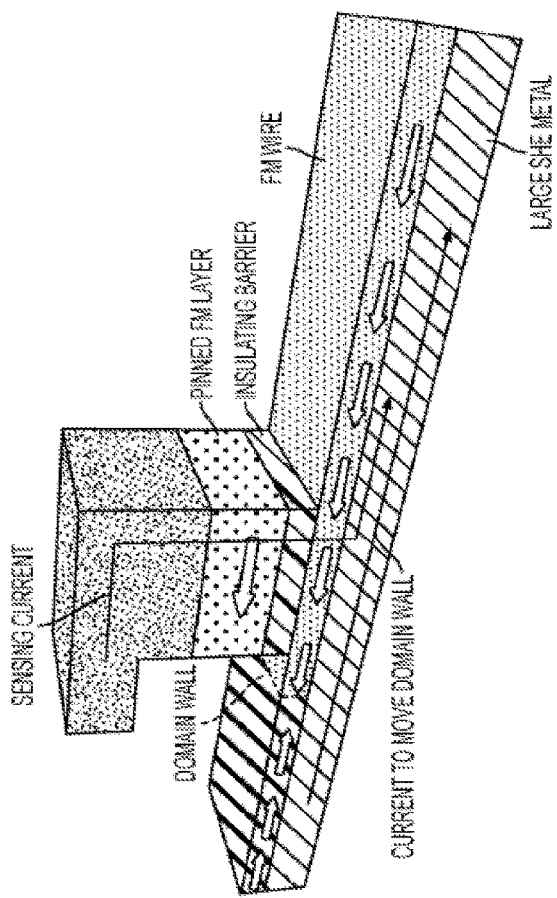
Figure 4C:
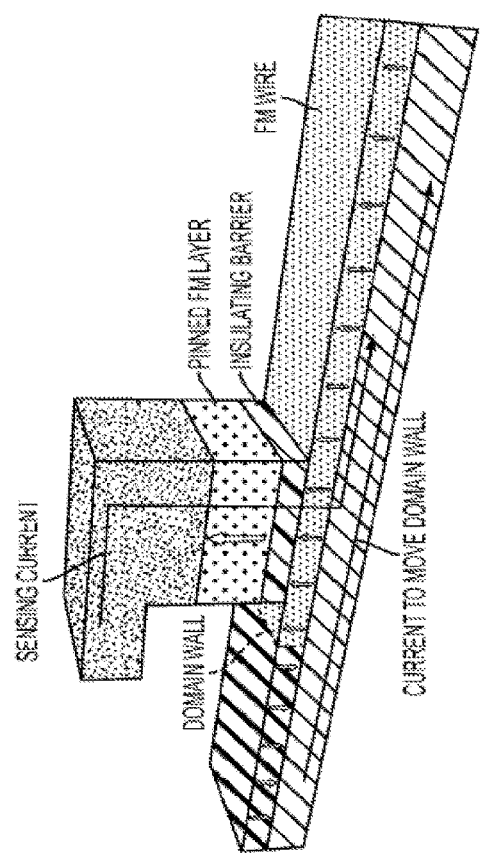

In some implementations, the free layer with different domains can be configured as a long wire or wire segment in which information is stored via the positions of magnetic domain walls which separate domains with different magnetization directions. The torque from the SHE-generated spin-polarized current can be used to enhance the ability of an electrical current to manipulate the positions of magnetic domain walls by using samples in which the magnetic free layer wire is in contact with a non-magnetic thin film that exhibits a strong SHE, in combination with a pinned magnetic layer to read out the magnetic orientation of the free layer, as illustrated in FIG. 4B and FIG. 4C. The current may flow laterally parallel to the sample plane or a lateral current may be applied in combination with a vertical current. The torque from the SHE effect may directly assist in moving the domain wall and it may also stabilize the configuration of the domain wall enabling it to be moved at greater velocity and improved efficiency compared to the influence of the conventional spin transfer torque effect alone.

The following sections provide various examples for implementing the insertion layer design in FIG. 1A.

Figure 5:
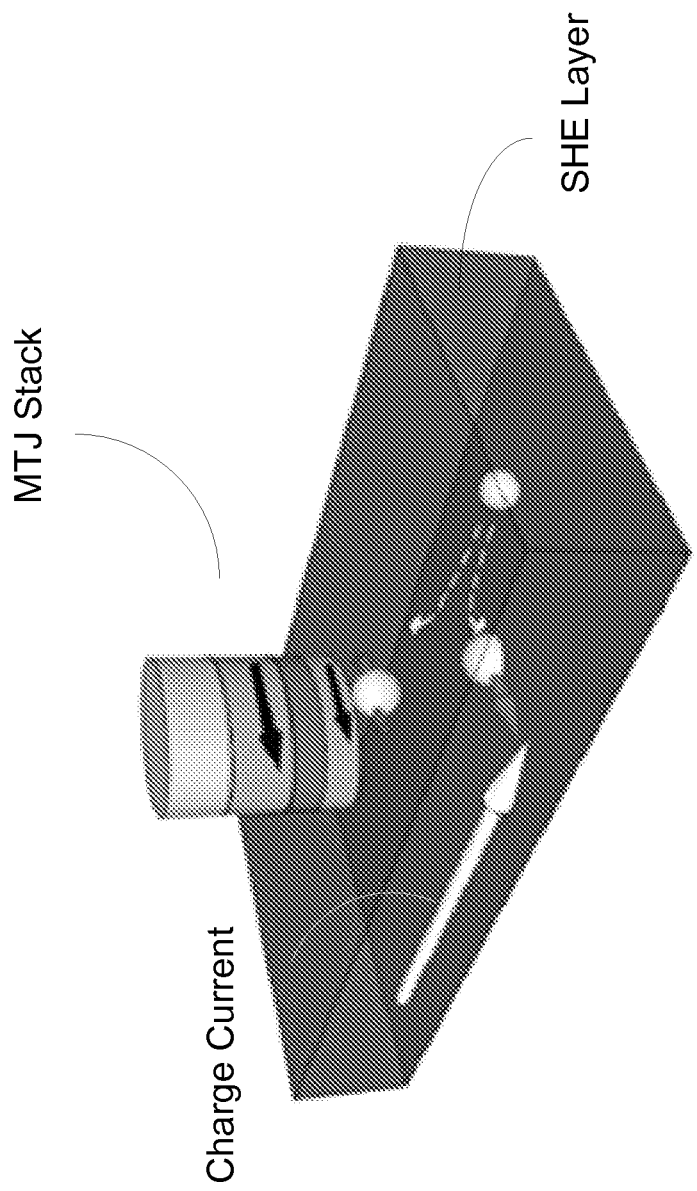
FIG. 5 depicts an example of a schematic device structure for anti-damping switching of an in-plane polarized magnetic free layer driven by the spin Hall effect in a high atomic number normal-metal underlayer.

The spin Hall effect arises from the current that flows in a normal metal (NM) thin film strip formed from certain metals with high atomic number Z wherein, due to a strong spin-orbit interaction of the conduction electrons with ions within the metal, electrons having one spin orientation are deflected preferentially in one direction that is transverse to the direction of electron current flow and those electrons with their spin orientation in the opposite orientation are defected in the opposite transverse direction. The result is a diffusion of oppositely spin-polarized electrons to the two opposing surfaces of the normal metal strip. This generation of a transverse "spin current" is known as the spin Hall effect. If this spin current impinges onto the surface of an ferromagnetic thin film placed on the surface of the thin film microstrip within which the spin current is generated, this spin current can exert a magnetic torque on the ferromagnet through the now well-known phenomena of spin transfer. This is illustrated in FIG. 5. This occurs because the quantum mechanical spin angular momentum of the electrons entering or reflected from the nanomagnet that is transverse to the local magnetic moment of the nanomagnet has to be absorbed by that moment. Depending on strength of the spin Hall effect and the configuration of the ferromagnet, this spin transfer torque can efficiently drive the lateral displacement of magnetic domain walls in the adjacent ferromagnet (FM), create persistent magnetic excitations in the ferromagnetic structure due to the anti-damping nature of the spin transfer torque, and in the case when a small nanoscale ferromagnet is placed adjacent to, and in electrical contact with the normal metal strip efficiently drive the magnetic reversal of the magnetic moment between two bistable orientations, with the final orientation of the magnetic moment being dependent upon the direction of the electrical current that is the origin of the spin current.

The efficiency by which a longitudinal electrical current within a thin-film NM strip generates a transverse spin current is characterized by the spin Hall angle $\theta_{SH}=J_s/J_e$ where $J_s$ is the transverse spin current density and $J_e$ is the applied, longitudinal electrical current density. Currently accepted values of $\theta_{SH}$ from experimental studies may range from greater than or approximately 0.06 for Pt, to approximately 0.12 for Ta in its high-resistivity beta-Ta phase, and approximately 0.3 for W when in its high-resistivity beta-tungsten phase. The amplitude of a spin current, once created, may decrease exponentially with distance from the source with the decrease that may be characterized by the spin relaxation length $\lambda_s$, which varies from one spin Hall metal to another, but for materials such as those listed above, with large values of $\theta_{SH}$ typically may range from about 1 nanometer to several nanometers. To obtain the maximum spin current density in an efficient manner the thickness of the spin Hall layer may be two to three times this spin relaxation length.

Another factor that effects the efficiency of the spin current in exerting a spin transfer torque on the ferromagnet may be the relative amplitude of the spin-mixing conductance $G_{SM}$ of the interface between the NM and the FM, compared to the electrical conductance per unit area of the NM layer as determined by its electrical conductivity $\sigma_{NM}$ divided by its spin relaxation length $\lambda_s$. When the spin mixing conductance of the interface is much higher than $G_{NM}=\sigma_{NM}/\lambda_s$ the incident spin current may have its maximum impact on the FM, but if $G_{SM} \lesssim G_{NM}$ then there will be a significant backflow of the spin current from the interface and a build-up of spins, a spin accumulation in the NM layer immediately adjacent to the FM. This may be understood to reduce the spin torque effectiveness of the spin current generated by the spin Hall effect.

A further factor that affects the ability of the incident spin current to excite or reverse the magnetic moment of the FM element may be the total effective magnetic damping rate of the FM. For an isolated FM layer the so-called intrinsic Gilbert damping parameter may characterize this magnetic damping rate $\alpha_G$. If the FM is in electrical contact with a NM the magnetic damping rate can be enhanced by the so-called spin pumping effect, whereby magnetic precession causes spins to be "pumped" across the interface where they can relax. The effectiveness of this spin pumping may also depend on the spin mixing conductance of the FM-NM interface $G_{SM}$ and on the relative value of the conductance of the NM layer within a spin relaxation length $G_{NM}$, but in a somewhat different manner than the effect that the relative values of these parameters have on the incident spin current. In particular, analyses and experiments indicate that the enhancement of the damping $\Delta\alpha_{SP}$ may vary as $\Delta\alpha_G \sim G_{SM}/(1+G_{SM}/G_{NM})$. Thus if $G_{NM} \ll G_{SM}$ there may be little enhancement of the damping. This may be optimal for the anti-damping spin torque excitation and/or reversal of a ferromagnet since to be effective the rate of magnetic excitation has to exceed the rate of magnetic damping and hence the critical current for initiating a magnetic reversal scales inversely with the overall magnetic damping rate of the ferromagnet, $\alpha_G+\Delta\alpha_{SP}$. For some NMs with high spin Hall angles the conductivity may be quite low and hence $G_{NM} \ll G_{SM}$ and there is little damping enhancement. However, a low $G_{NM}$ poses a different challenge for the successful implementation of spin Hall phenomenon in magnetic device technologies. This challenge may be the electrical energy cost required to effect the excitation or reversal of a ferromagnetic element.

The current density $J_e$ in the NM layer required to effect, for example, the magnetic reversal of a thermally stable ferromagnetic element may decrease inversely with the spin Hall angle of the NM. The electrical energy $E_R$ required for such a reversal may scale with the square of this current density times the inverse of the conductivity of the NM, or $E_R \sim J_e^2/\sigma_{NM}$. So while a low $\sigma_{Nm}$, and hence a low $G_{NM}$, may be beneficial for reducing spin pumping it may also detrimental in that it increases the resistive energy losses during the reversal process. Moreover this increase in energy loss may amplified by the parasitic ohmic losses in the NM strip away from region above which the ferromagnetic layer is located. The optimal situation would then be for a NM to have a relatively high spin Hall angle and a relatively high electrical conductivity but to also have a low effective spin-mixing conductance.

This disclosure provides a new technique for significantly improving the electrical efficiency of the spin Hall effect for the reversal by spin transfer torque of the magnetic orientation of the magnetic moment of a thin film ferromagnetic element that may be the active data element in spin torque magnetic random access memory devices and in non-volatile logic devices. This technique may also improve the electrical efficiency of the spin transfer torque excitation of the magnetization of nanoscale magnetic structures into persistent microwave oscillations for the applications as spin-torque nanoscale oscillators. This new technique may accomplish the objectives of having a spin Hall system in which the spin current may be generated in a normal metal layer that has a relatively low resistivity and a significant spin Hall angle, but also where the normal metal ferromagnet interface may have a spin mixing conductance that is higher than the effective conductance $G_{NM}$, as measured in the direction normal to the FM-NM interface, of the normal metal.

Figure 6:
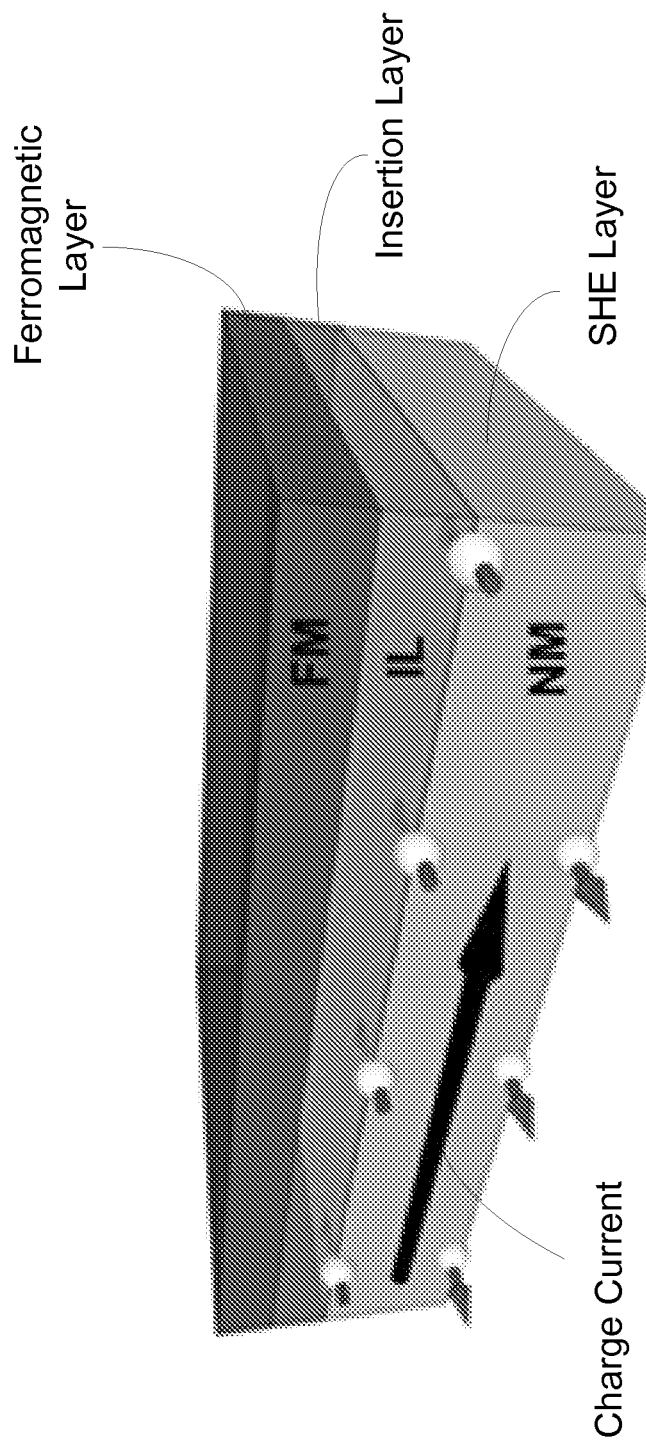
FIG. 6 depicts an example of a schematic representation of a normal metal (NM) that has high spin Hall angle, a thin, high resistivity insertion layer (IL) of the order of 1 nm or less in thickness, and a thin ferromagnetic layer (FM) where the IL is located between the other two and in electrical contact with both.

The disclosed technique may accomplish this by separating the NM layer within which the transverse spin current is generated by the spin Hall effect from the FM layer by the insertion of a thin, high resistivity normal metal layer between the two as illustrated in FIG. 6. Possible insertion layer (IL) materials may include but are not limited to Hf, Ta, W, Re, Ir, Nb, Ti, and any other 3d, 4d, or 5d metallic element or alloy thereof that is not magnetic, and which may have both a low spin mixing conductance $G_{SA}$, when in contact with an appropriate FM layer, and may have a still lower conductance $G_{IL}=\sigma_{IL}/\lambda_{s,IL}$, where $\lambda_{s,IL}$ may be the spin relaxation length in the IL material. The FM layer may be but is not limited to being Fe, Co or Ni, or Fe—Co alloy, Fe—Co—B alloy or Fe—Co—Al alloy, or any other ferromagnetic layer that includes transition metal components. The FM layer can also be uniform, or comprised of a multilayer of different composition. The low spin mixing conductance of the FM/IL interface can, but does not need to, arise from a strong difference between the electronic band structure of the FM metal and that of the insertion layer IL. The low conductivity of the IL layer may arise from the band structure or from the amorphous nature of that material, as can be the case for thin sputter-deposited Hf and Ta layers.

In implementations, the thickness $t_{IL}$ of the IL may be less than its spin relaxation length so that the spin current originating from the spin Hall effect in the underlying high conductivity NM layer is not substantially attenuated. The thickness of the IL may also have to be thick enough for the spin-mixing conductance to be determined by the IL and not the underlying NM. This may mean that the IL be at least one atomic layer thick. Together the requirements may be approximately that $0.2$ nm$\leq t_{IL} \leq \lambda_{s,IL}$. The difference in the longitudinal conductance of the IL and that of the underlying NM layer may be large enough that the majority of the applied current flows through the NM layer and not through the IL. A resistivity ratio of 2.5 or greater between that of the IL layer and that of the NM spin Hall material has been shown to be sufficient in achieving this criterion. The IL however may have to be thick enough that the effective normal conductance of the IL/NM bilayer is much less than the spin mixing conductance of the FM/IL interface. Experiments with Hf as the IL and Pt as the spin Hall metal layer have demonstrated that $t_{IL}$ ranging from 0.25 to 1.0 nm and above can provide this result. Other materials and other thickness may also be effective.

To demonstrate the effectiveness of the techniques disclosed herein, first a thin film trilayer structure prepared consisting of a 3 nm thick Pt film, a 0.5 nm thick Hf layer and a 4 nm thick $Fe_{60}Co_{20}B_{20}$ sequentially deposited on an oxidized Si wafer by direct current magnetron sputtering and capped by thin MgO and Ta layers for protection from the atmosphere. The trilayer film structure was patterned into a microstrip and a microwave current was applied to the microstrip in the presence of an in-plane applied magnetic field. At the proper microwave frequency a resonant condition was established where the rf current in the normal metal layers generated both an in-plane rf Oersted field due to Ampere's Law which exerted an out-of-plane magnetic torque on the FeCoB layer, and the spin Hall effect in the Pt layer generated a transverse microwave frequency spin current that exerted, by the spin transfer effect, an in-plane torque on the FeCoB. This technique, known as spin torque ferromagnetic resonance (ST-FMR), may enable the determination of both the transverse spin current amplitude and the effective magnetic damping of structure.

The ST-FMR measured revealed that the effective Gilbert damping parameter for the Pt/FeCoB bilayer was 0.015 as opposed to the value of 0.006 obtained for an isolated FeCoB film. This may be indicative of a strong damping enhancement due to spin pumping across the Pt/FeCoB interface. However the device with the 0.5 nm Hf insertion layer exhibited a damping parameter value of only 0.01, indicating a much smaller enhancement of damping of only 0.004, demonstrating that the Hf insertion layer may work to reducing spin pumping effect. At the same time the spin Hall angle was reduced by a smaller percentage for the Pt/Hf(0.5 nm)/FeCoB trilayer sample demonstrating that a strong spin Hall generated spin current can still pass through the Hf layer and exert a strong spin transfer torque on the FM. Subsequent measurements with thicker Hf insertion layers indicated a spin relaxation length for the Hf of approximately 1.5 nm. The measured resistivity of the FeCoB layer ($\approx 160 \times 10^{-6}$ Ohm-cm) and for the Hf layer ($\approx 60 \times 10^{-6}$ Ohm-cm), in comparison to that of the Pt layer ($=25 \times 10^{-6}$ Ohm-cm) confirmed that the great majority of the bias current flowed through the Pt layer, as designed.

To complete the demonstration of the effectiveness of the techniques disclosed herein to enhance the anti-damping spin torque effect by the insertion of a very thin, high resistivity layer between the FM layer and a NM layer, where the NM has a substantial spin Hall angle but a relatively low resistivity, a three-terminal spin Hall device was fabricated in the same manner as reported previously for the case of a three terminal spin Hall device that utilized a high resistivity ($\approx 180 \times 10^{-6}$ Ohm-cm) Ta NM layer. In this case a Pt(4)/Hf(0.5)/FCB(1.8)/MgO(1.6)/FCB(3.8)/Hf(5)/Ru(5) multilayer thin film stack was produced by magnetron sputter deposition, where the number in parentheses indicates the each layer's thickness in nm and where the top two layers were included to provide protection of the magnetic tunnel junction (MTJ) layers (FCB/MgO/FCB) from the atmosphere. Electron beam lithography and ion-beam etching were employed to structure all but the bottom two films into an elongated ~70 nm×240 nm MTJ on top of the Pt/Hf microstrip, as illustrated schematically in FIG. 7. The magnetoresistance of the MTJ as measured as a function of the current flowing longitudinally through the Pt/Hf bilayer is shown in FIG. 8. Clear deterministic reversal of the bottom magnetic layer of the MTJ is observed through measurement of the magnetoresistance value of the MTJ. The Pt/Hf device may demonstrate the effectiveness of the Pt/Hf bilayer in providing a combination of a low resistivity spin Hall material, due to the Pt, and a low effective damping, due to the high resistivity of the Hf IL.

The effective damping parameter $\alpha_{\text{eff}}$ of the bottom FeCoB free layer when in contact with the Pt/Hf base layer was measured by ST-FMR, the demagnetization field $M_{\text{eff}}$ of the 1.8-nm FeCoB free layer was determined by vibrating sample magnetometry, and the spin Hall switching current density $J_{c0}$ in the absence of thermal fluctuation effects was measured by the standard ramp rate technique. The standard equation for the switching current density $$J_{c0} = \frac{2e}{\hbar} \frac{\mu_0 M_s t \alpha_{\text{eff}} (H_c + M_{\text{eff}}/2)}{\theta_{SH}}$$

was then used to determine that the effective spin Hall angle in this system is approximately $\theta_{SH} \approx 0.08$. Here $M_s$ is the saturation magnetization of the FeCoB free layer, t is its thickness and $H_c$ is the in-plane coercive field of the free layer. This result may be similar to that of a single layer of Ta but may be achieved with a spin Hall metal that has seven times lower resistance. This demonstrates the value of the NM/IF structure of this disclosure as possibly being a major improvement over high resistivity NM spin Hall devices. While the above example is of a Pt(4 nm)/Hf(0.5 nm) bilayer, other relatively low resistivity NMs with reasonably high spin Hall angles and other high resistivity insertion layers, instead of Pt and Hf respectively can also be employed.

For example, in the case in which the material used as the NM is Platinum (Pt), which so far is the spin Hall metal with the lowest resistivity of about 25 micro-ohm centimeters at room temperature, we may be able to achieve a considerably higher spin Hall angle than we observed before with permalloy and $Co_{40}Fe_{40}B_{20}$ ferromagnetic layers if we use $Fe_{60}Co_{20}B_{20}$. This may be useful because the lower Pt resistivity may make it more suitable than Ta, which has the higher spin Hall effect but about 9 times higher resistivity. With the Fe rich ferromagnetic layer our spin Hall effect with Pt may be about equal to that with Ta. The switching current needed to reverse the orientation of a ferromagnetic free layer may depend inversely on the spin Hall efficiency, and linearly on the magnetic moment of the free layer, its magnetic anisotropy or demagnetization field, and the magnetic damping parameter. In this latter category Pt may act, in some instances, to enhance the damping of the adjacent ferromagnet by what is known as the spin pumping effect. Ta and W may have weak spin pumping and hence the damping in those cases is low, close to the intrinsic value of the ferromagnet. For example, a very thin, 0.5 nm layer of Hf may be inserted between the Pt and FeCoB layer. This may weakly depress the strength of the spin Hall effect but may strongly reduce the spin pumping effect. The results of such insertion of the Hf reveals that the spin torque switching in three terminal devices at current densities may be nearly the same as with previous work with Ta, but with about 8× less resistance and hence energy loss.

Various tests were conducted for the above disclosed technique of modifying the FM-HM interface of an existing HM to enhance the effectiveness of its intrinsic SHE. The conducted tests show strong enhancement of the effective spin Hall angle of Pt, in combination with a substantial suppression of spin pumping, by the insertion of a thin amorphous layer of Hf (about 0.5 nm) between a Pt film and a thin $Fe_{60}Co_{20}B_{20}$ ferromagnetic (FM) layer of around or less than 2 nm. These effects are quantified by spin torque ferromagnetic resonance and by the measurement of the switching current density when the ferromagnetic layer is the free electrode in a magnetic tunnel junction. The results are qualitatively explained as the result of an increased ratio of the spin-mixing conductance of the FM-normal metal interface to the spin conductance of the Hf|Pt bi-layer. This interface modification makes Pt—Hf bilayers an attractive candidate as the spin Hall element in three-terminal spin logic devices and in magnetic memory cells where a low write energy is required The multilayer films used in conducted tests were produced by DC sputtering (radio frequency sputtering for the MgO layer) from 2-inch planar magnetron sources onto thermally-oxidized Si substrates in a near-UHV vacuum system with a base pressure less than $4\times10^{-8}$ Torr by AJA ATC2200 Sputter system. The target to substrate separation was approximately 43 cm. This separation together with an oblique orientation of the target to the substrate resulted in a low deposition rate of (Pt: 0.017 nm/s, Hf: 0.021 nm/s, FeCoB: 0.0077 nm/s) with the employed DC sputtering conditions of 2 mTorr Ar and power of 30 watts, and may also have served to reduce energetic ion and energetic neutral bombardment of the substrate during the deposition. The Hf films were deposited with a "wedge structure" whose thickness varied from 0.33 nm to 0.76 nm across the wafer by sputtering from an oblique gun to a stationary substrate. The other layers were grown with a rotating substrate.

The multilayer stacks $||Ta(1)|Pt(4)|Hf(t_{Hf})|FeCoB(\ )|MgO(1.6)|Ru(2)$ prepared for ST-FMR, anomalous Hall and SQUID magnetometry measurements were patterned into microstrips of 10 μm×20 μm by conventional photolithography using GCA6300 5×g-line Stepper. The stacks $||Ta(1)|Pt(4)|Hf(t_{Hf})|FeCoB(t_{FECoB})|MgO(1.6)|FeCoB(4)|Hf(5)|Ru(5)$ prepared for current switching were patterned into 3-terminal SHE-MTJ devices which consist of an elliptical FeCoB|MgO|FeCoB magnetic tunnel junction of a typical size of 50 nm×80 nm on top of a Hf|Pt|Ta channel of width from 0.6 μm to 1.2 μm by e-beam lithography using the JEOL6300 system. The films were etched by Intivac10232 Ion Mill system equipped with a mass spectroscopy system. Some of the samples were annealed at 300 C for 30 minutes in a Lindberg vacuum tube furnace with a background pressure less than $10^{-7}$ Torr.

The damping parameters were measured by frequency-dependent spin torque ferromagnetic resonance (ST-FMR) technique in which an external magnetic field generated by GMW5201 Projected Field Electromagnet was applied in-plane at 45 degrees with the microstrip. An radio frequency signal of power 12 dBm and frequency 5-10 GHz generated by an Agilent 20 GHz PSG Signal Generator was sent to the microstrip and the output signal was picked up through a bias-tee by a Signal Recovery 7265 DSP lock-in. From the frequency f dependence of the linewidth, the damping coefficient was calculated from the linear fit. The demagnetization fields were determined by anomalous Hall measurement with sweeping perpendicular external magnetic field up to 1.5 T created by Quantum Design PPMS6000. The magnetic moments were measured by Quantum Design MPMS-XL SQUID magnetometry with in-plane external field. The current switching measurement on three-terminal devices was performed by applying an external magnetic field from a Helmholtz electric magnet controlled by a Kepco BOP20-20M bipolar operational power supply parallel to the major axis of the nanopillars. A DC current from a Yokogawa 7651 DC power source was sent through the Pt channel. The tunnel junction was connected in series with a 10 MΩ resistor and the total differential resistance was measured by a Signal Recovery 7265 DSP lock-in.

Figure 9:
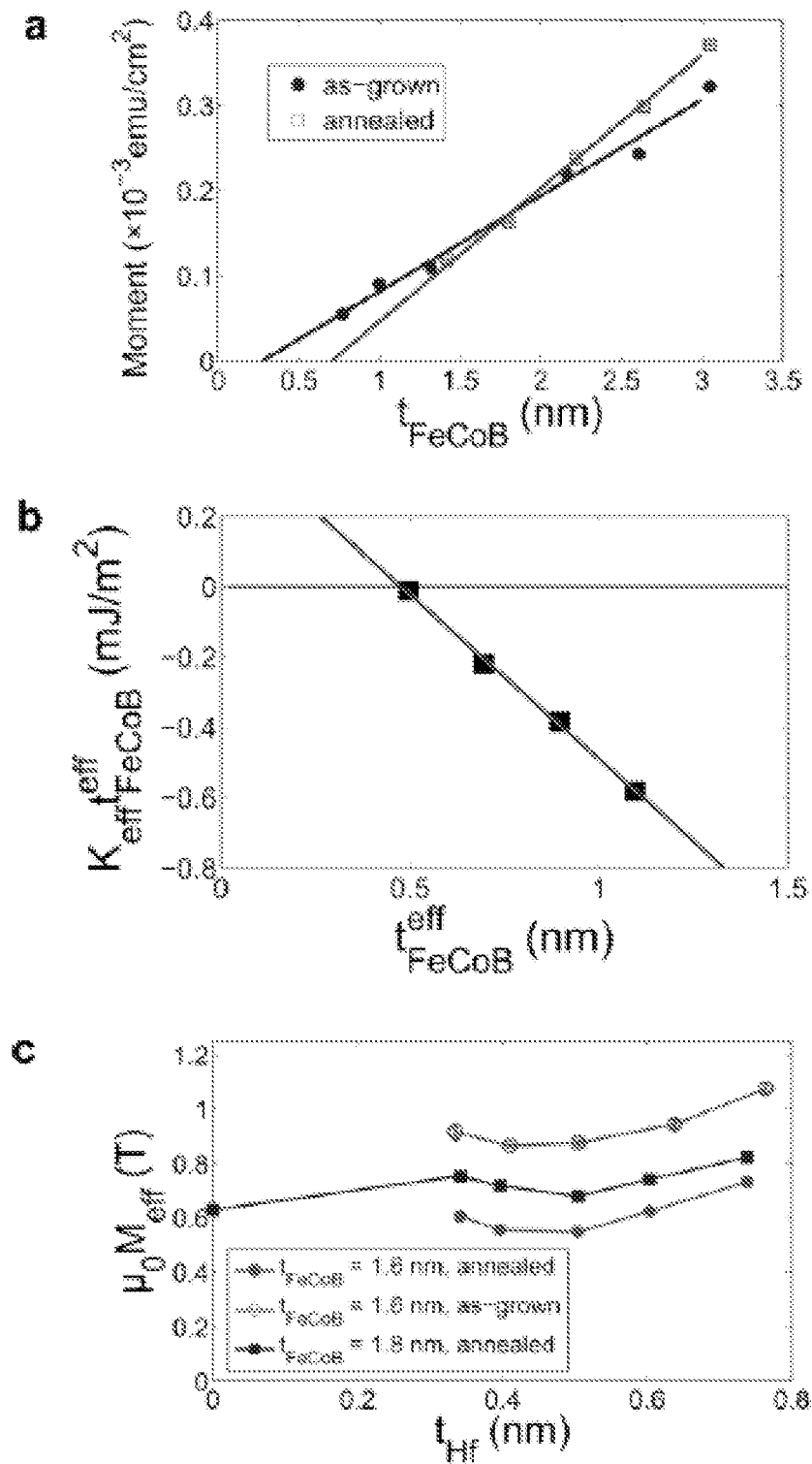
FIGS. 9, 10, 11 and 12 show measurements of various tests conducted for samples based on the disclosed modification the FM-HM interface of an existing HM to enhance the effectiveness of its intrinsic SHE.

FIG. 9 shows measurements of magnetic properties of $||Ta(1)|Pt(4)|Hf(t_{Hf})|FeCoB(t_{FeCoB})|MgO(1.6)$ samples. FIG. 9(a) shows magnetic moment per unit area versus FeCoB thickness of $t_{Hf}$ at 0.5 nm as-grown (solid circles) and annealed (open squares) samples. From the linear fits (lines), the saturation magnetization and thickness of dead layer of FeCoB are $1.12+/-0.07\times10^6$ A/m and $0.3+/-0.1$ nm, respectively, for the as-grown sample, and $1.56+/-0.06\times10^6$ A/m and $0.7+/-0.1$ nm, respectively, for the annealed sample. FIG. 9(b) shows the magnetic anisotropy energy as a function of FeCoB effective thickness. From the linear fit (line), the interface and bulk anisotropy energy densities are $0.45+/-0.03$ mJ/m$^2$ and $0.60+/-0.03$ mJ/m$^3$, respectively. FIG. 9(c) shows effective field versus Hf thickness of 1.6 nm annealed (solid circles) and as-grown (open circles), and FeCoB thickness of 1.8 nm annealed (solid squares) samples. The broken lines indicate the value of Hf thickness at zero (no spacer) and FeCoB thickness of 1.8 nm annealed sample. Solid lines are to connect the data points.

Figure 10:
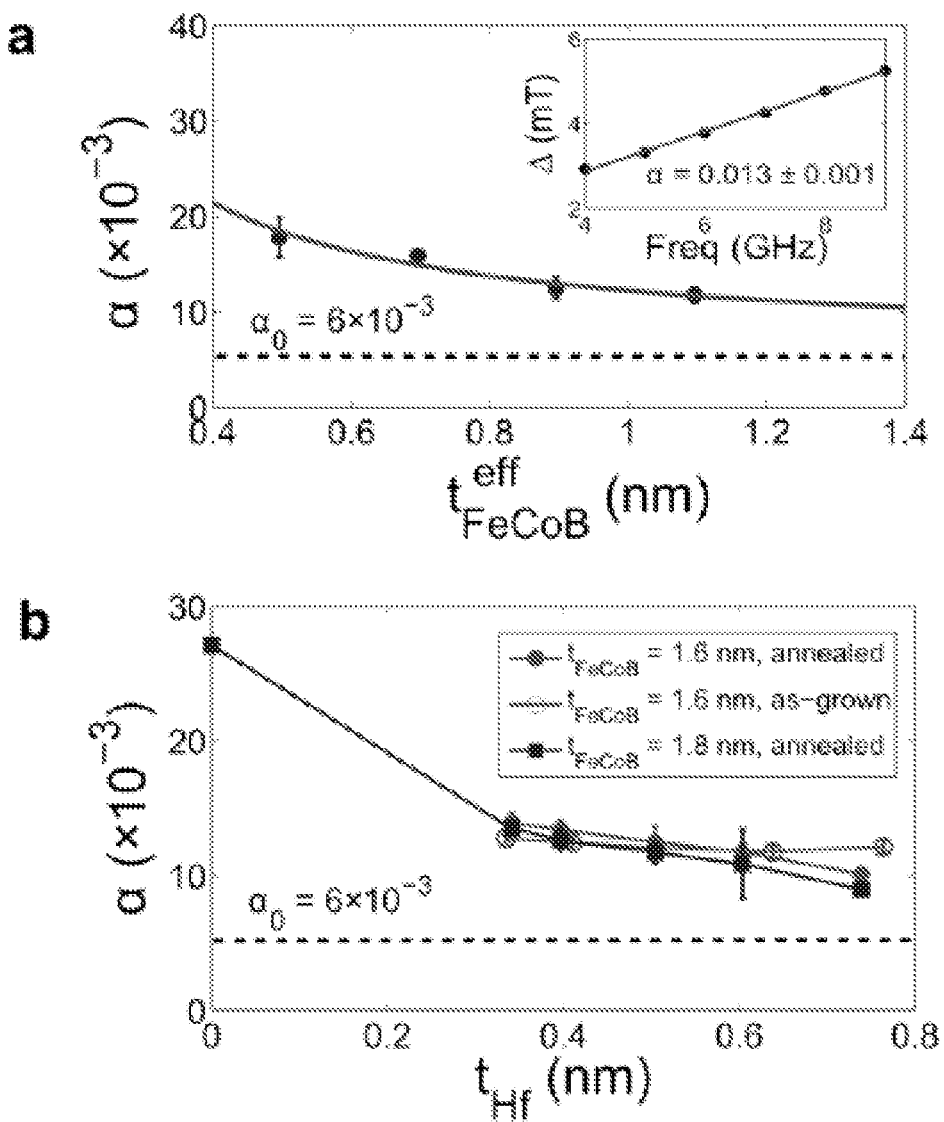

FIG. 10 shows measurements of damping parameter α of $||Ta(1)|Pt(4)|Hf(t_{Hf})|FeCoB(t_{FeCoB})|MgO(1.6)$ samples measured by frequency-dependent ST-FMR. FIG. 10(a) shows measurements of damping coefficient versus effective thickness of FeCoB of a thickness at 0.5 nm for the annealed samples. The solid line shows the fitting result from which the intrinsic magnetic damping coefficient of isolated FeCoB film is estimated to be 0.006 (broken line). The inset in FIG. 10(a) shows a typical plot of linewidth A versus frequency determined from ST-FMR measurement for an annealed sample having FeCoB at 1.6 nm and Hf at 0.5 nm. The solid line shows linearly fitted result. FIG. 10(b) shows measurements of damping coefficient versus Hf thickness of 1.6 nm for annealed samples (solid circles) and as-grown samples (open circles), and measurements of a FeCoB thickness of 1.8 nm (solid squares). The broken line indicates the estimated damping coefficient of isolated FeCoB. Solid lines are to connect the data points.

Figure 11:
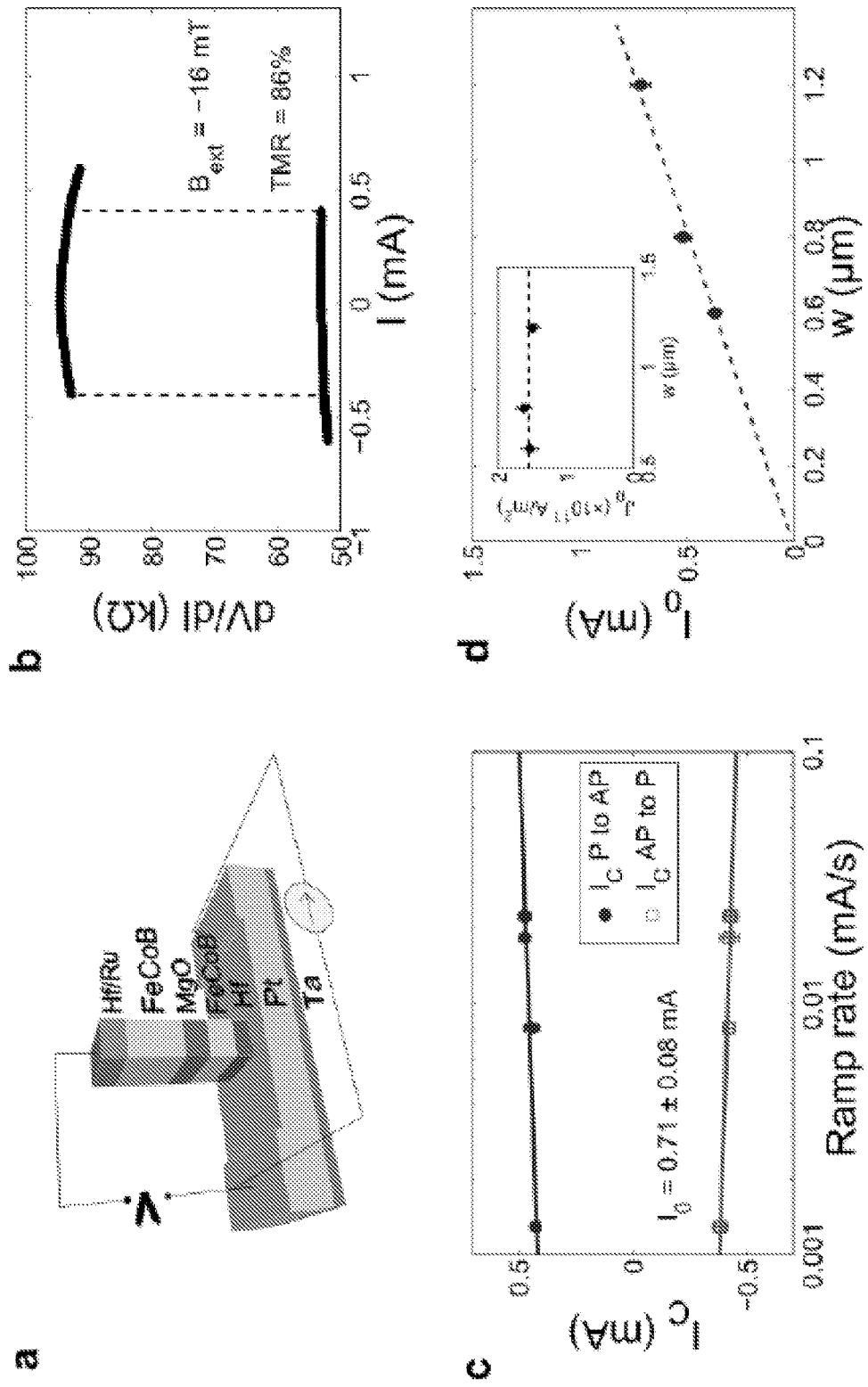

FIG. 11 shows measurements of the current switching behavior of $||Ta(1)|Pt(4)|Hf(t_{HF})|FeCoB(t_{FeCoB})|MgO(1.6)|FeCoB(4)$ samples for annealed three-terminal devices. FIG. 11(a) shows the schematic structure of the three-terminal SHE-MTJ device structure. FIG. 11(b) shows the measurements of the differential resistance versus current at ramp rate 0.0013 mA/s for a device of 50 nm×180 nm-1.2

μm. The switching currents are determined to be of +/−0.4 mA. Broken lines are to connect the data points. FIG. 11(c) shows a plot of switching currents at different ramp rates of this device. Solid lines show fitted results. FIG. 11(d) shows measurements of $I_0$ versus channel width w of devices of 70 nm×240 nm. The broken line is to guide the eye. The inset in FIG. 11(d) shows the measurements for the switching current density versus channel width w, which are consistent with the average value of $1.55+/−0.12×10^{11}$ A/m².

Figure 12:
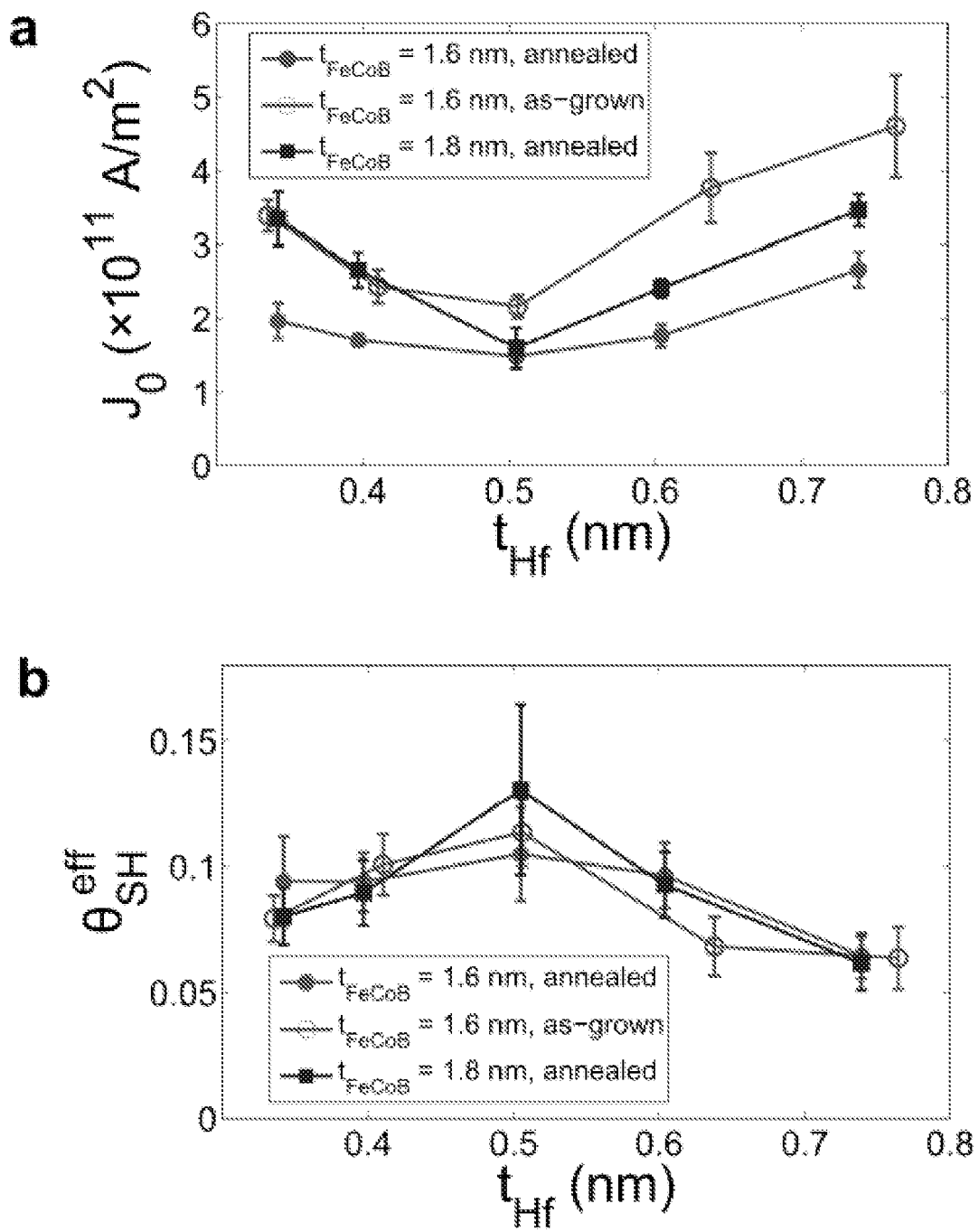

FIG. 12 shows measurements of the switching current density and effective spin Hall angle versus Hf thickness of a FeCoB at 1.6 nm for the annealed samples (solid circles) and as-grown samples (open circles), and annealed samples having FeCoB at 1.8 nm (solid squares). The switching current density reaches a minimum and the effective spin Hall angle reaches a maximum at a Hf thickness of 0.5 nm. Solid lines are to connect the data points.

The following sections provide various details for implementing the design based on doping or alloying the SHE metal to achieve the improved SHE-STT performance in FIG. 1B. This aspect of the disclosed technology relates to devices and circuits having magnetic materials or structures that operate on the basis of the transfer of spin angular momentum from conduction electrons to localized magnetic moments, a phenomenon known as spin transfer torque. Applications include non-volatile magnetic memory circuits and non-volatile magnetic logic devices that operate via the controlled reversal of a magnetic moment, memory and logic devices that operate by the controlled displacement of a magnetic domain wall, and spin-torque excited nanoscale magnetic oscillators that operate in the microwave and millimeter wave regime.

Specifically, the design in FIG. 1B can be used to provide a method and system that substantially increase the efficiency by which an electrical current flowing in certain high atomic number metals generates a transverse flowing spin current via the spin Hall effect (SHE) that occurs where there is a strong spin-orbit interaction between the conduction electrons and the ionic lattice. This transverse spin current can, by the mechanism of spin transfer torque, efficiently effect the reversal of the magnetic orientation of a bi-stable magnetic element in a memory device or a non-volatile logic device, efficiently drive the rapid displacement of magnetic domain walls in thin film nanostructures, and can also generate persistent, steady-state magnetic excitations at microwave frequencies in thin film ferromagnets. The design in FIG. 1B can be implemented to achieve more efficient and effective magnetic random access memory circuits and of non-volatile logic circuits that operate by utilizing the current-driven spin Hall effect to cause the reversal of the bistable orientation of the magnetic moments of nanoscale ferromagnetic thin film elements. The design in FIG. 1B may also be used to substantially improves the energy efficiency of devices and circuits that operate by the rapid and efficient displacement by spin transfer torque of magnetic domain walls in nanostructured magnetic thin films for logic and memory operations. Furthermore, the design in FIG. 1B can be used to implement more power-efficient and more versatile spin torque nanoscale oscillators. The spin transfer in FIG. 1B occurs because the quantum mechanical spin angular momentum of the electrons entering or reflected from the nanomagnet that is transverse to the local magnetic moment of the nanomagnet has to be absorbed by that moment. Depending on strength of the spin Hall effect and the configuration of the ferromagnet, this spin transfer torque can efficiently drive the lateral displacement of magnetic domain walls in the adjacent ferromagnet (FM), create persistent magnetic excitations in the ferromagnetic structure due to the anti-damping nature of the spin transfer torque, and in the case when a small nanoscale ferromagnet is placed adjacent to, and in electrical contact with the normal metal strip efficiently drive the magnetic reversal of the magnetic moment between two bistable orientations, with the final orientation of the magnetic moment being dependent upon the direction of the electrical current that is the origin of the spin current.

The efficiency by which a longitudinal electrical current density within a thin-film NM strip generates a transverse spin current density is characterized by the spin Hall angle $\theta_{SH}=(2e/\hbar)\cdot J_s/J_e$ where $J_s$ is the transverse spin current density and $J_e$ is the applied, longitudinal electrical current density in the spin Hall metal. Alternatively, the spin Hall angle can be characterized as the ratio of the spin Hall conductivity of the metal $\sigma_{SH}$ to its electrical conductivity $\sigma_{HM}$ or $\equiv(2e/\hbar)\cdot\sigma_{SH}/\sigma_{HM}$. Currently accepted values for lower bounds on $\theta_{SH}$ from experimental studies range from greater than or approximately 0.06 for Pt, to approximately 0.12 for Ta in its high-resistivity beta-Ta phase, and approximately 0.3 for W when in its high-resistivity beta-tungsten phase. The amplitude of a spin current, once created, decreases exponentially with distance from the source with the decrease characterized by the spin relaxation length $\lambda_s$, which varies from one spin Hall metal to another, but for materials such as those listed above, with large values of $\theta_{SH}$, typically ranges from about 1 nanometer to several nanometers. To obtain the maximum spin current density in the most efficient manner the thickness of the spin Hall layer should be preferably approximately two to three times this spin relaxation length but no more than five times this length.

The magnitude of the spin Hall angle in a normal metal depends on the strength of the spin-orbit interaction between the conduction electrons and the ions in the metal. The nature of this interaction can be either extrinsic or intrinsic. In the former case the spin-orbit interaction occurs during the scattering of the conduction electrons by defects and impurities. There are several proposed explanations for the ways that this interaction can result in the spin-dependent scattering of the electrons that leads to the generation of a transverse spin current; these include phenomena known as side-jump scattering and skew scattering from impurities and crystalline defects in the metal. In this extrinsic case the electrical conductivity and the spin Hall conductivity both vary with the defect or impurity density and thus the spin Hall angle is not expected to change significantly with changes in the electrical conductivity. In the intrinsic case the spin Hall effect arises directly from the orbital motion of the conduction electrons through the ionic lattice and does not depend on defect/impurity scattering which sets the electrical conductivity in materials with a relatively high density of defects and/or impurities, such as metallic thin films with very small crystalline grains or alloy films. In this intrinsic regime, the spin Hall angle and hence the efficiency by which an electrical current density generates a transverse current density can be increased by decreasing the electrical conductivity of the metal, by, for example, alloying or doping the spin Hall metal, provided that the decrease in electrical conductivity is not accompanied by a material decrease in the spin Hall conductivity, such that $\theta_{SH}\equiv(2e/\hbar)\cdot\sigma_{SH}/\sigma_{HM}=(2e/\hbar)\cdot J_s/J_e$ increases. Again, for this to be achieved, it is desirable that the selected dopant, defect, or alloy component that is added to the spin Hall metal for decreasing its electrical conductivity does not also significantly decrease its spin Hall conductivity.

The spin diffusion length within the spin Hall metal is also affected by the conductivity of the metal. In particular the spin diffusion length $\lambda_s$ is related to the elastic mean free path between momentum scattering of the conduction electrons $l_e$ and the mean distance traveled by the electrons between spin-flip (reversal of spin direction) scattering events of the conduction electrons $l_{sf}$, with the relationship generally being $\lambda_s = \lfloor (l_e \, l_{sf})/3 \rfloor^{1/2}$, in the typical case for metals where $l_e < \lambda_s < l_{sf}$. Since the electrical conductivity of the spin Hall metal is proportional to the elastic mean free path, $\sigma_{HM} \propto l_e$, such that $\lambda \propto \sigma_{1/2}$. Alternatively, in some cases, the spin diffusion length varies directly with the conductivity of the spin Hall metal, or $\lambda_s \propto \sigma$. In either case, the lower the electrical conductivity of the spin Hall metal the shorter the spin diffusion length.

The variation of the spin diffusion length as a function of the electrical conductivity of the spin Hall metal plays an additional role in determining the efficiency of the spin Hall effect in exerting a spin transfer torque on the adjacent ferromagnet. This is because the efficiency of the spin Hall effect is determined by the probability of the transmission of the spin current across the normal metal-ferromagnet interface. This transmission depends on the relative amplitude of the spin-mixing conductance $G_{SM}$ of the interface between the HM and the FM compared to the electrical conductance per unit area of the NM layer $G_{ext}$ over a spin-relaxation length $\lambda_s$. When $G_{SM}$ is much higher than this NM "spin conductance" $G_{ext} \equiv \sigma_{HM}/2\lambda_s$ the transmission probability is essentially unity and the incident spin current has its maximum impact on the FM, but if $G_{SM} \leq G_{ext}$ then there will be a significant backflow of the spin current from the interface and a build-up of spins, a spin accumulation, in the NM layer immediately adjacent to the FM. This backflow is understood to reduce the spin Hall torque efficiency $\xi_{SH}$ of the spin current generated by the spin Hall effect within the NM. In the case where the thickness of the HM $t_{HM}$ is much greater (3 times or more) than its spin diffusion length $\lambda_s$ This efficiency can be expressed $$\xi_{SH} \approx \theta_{SH} \times \frac{G_{SM}}{G_{ext} + G_{SM}}.$$

Thus to optimize the spin torque efficiency, the spin mixing conductance should be much greater than the effective spin conductance of the HM. Typical values of the spin-mixing conductance for relatively pure heavy metal films with typical face-centered cubic or body-centered cubic crystal structures and hence with low resistivity, $\leq 25 \times 10^{-8}$ $\Omega$-m, are $\geq 0.5 \times 10^{15}$ $\Omega^{-1}$m$^{-2}$. Therefore, optimization of the spin Hall torque efficiency $\xi$ will be premised on the following condition $G_{ext} \equiv \sigma_{HM}/2\lambda_s \leq 0.5 \times 10^{15}$ $\Omega^{-1}$m$^{-2}$.

If the conductivity of a metal with a strong spin-orbit interaction can be varied by introducing elastic, that is momentum, scattering centers within the metal without significantly increasing the spin flip scattering rate of the conduction electrons, that is without decreasing $l_{sf}$, then it should be possible to substantially enhance the efficiency by which the current density $J_e$ in the spin Hall metal exerts a spin transfer torque on the adjacent ferromagnet. For this to occur it is desirable that the spin Hall effect in that metal is an intrinsic phenomenon that arises from the electronic band structure of the metal and not from spin-dependent scattering from impurities and defects within the metal. In particular if $\sigma_{HM,ref}$ is the electrical conductivity of a relatively pure, relatively high conductivity spin Hall metal which has an intrinsic spin Hall conductivity $\sigma_{SH}$, then if dopants or defects are introduced to change that conductivity to a lower value $\sigma'^{HM}$ then the spin Hall efficiency will be $$\xi'_{SH} = \left(\frac{2e}{\hbar}\right)\frac{\sigma_{SH}}{\sigma'_{HM}} \times \frac{G_{SM}}{G_{SM} + (\sigma'_{HM}/2\lambda_{s,ref})(\sigma_{HM,ref}/\sigma'_{HM})^{1/2}}$$

where $\lambda_{s,ref}$ is the spin diffusion length of the undoped spin Hall metal. This relationship holds if $\sigma_{SH}$ is approximately unchanged by the introduction of the dopants or defects. Thus, under the condition that the spin mixing conductance is much greater than the effective spin conductance of the HM, the following relation will follow: $\lambda_{SH}' \propto (1/\sigma_{HM}')^{3/2}$. In all cases, decreasing the electrical conductivity of the spin Hall metal increases the spin Hall efficiency provided that the spin Hall conductivity $\sigma_{SH}$ does not change significantly.

For those spin torque devices that operate due to the anti-damping spin transfer torque effect of the incident spin current in exciting and reversing the orientation of the magnetic moment of the FM element, or in exciting the magnetization in the thin magnetic film into persistent oscillation, another important parameter to consider, and to minimize, is the total effective magnetic damping rate of the FM. For an isolated FM layer, the intrinsic Gilbert damping parameter $\alpha_G$ characterizes this magnetic damping rate. However, when the FM is in electrical contact with a NM, the magnetic damping rate is increased by the spin pumping effect, whereby magnetic precession causes spins to be "pumped" across the interface where they can relax via spin flip scattering in the NM. The effectiveness of this spin pumping also depends on the spin mixing conductance of the FM-NM interface $G_{SM}$ and on the conductance of the NM layer over a spin relaxation length $G_{ext}$. In particular, analyses and experiments indicate that the enhancement of the damping $\Delta\alpha_{SP}$ varies as $\Delta\alpha_{SP} \sim G_{SM}/(1+G_{SM}/G_{ext})$. Thus the optimum situation is for $G_{ext} << G_{SM}$ as then there is little enhancement of the damping. More specifically the standard theory of spin pumping enhancement of damping indicates that the total damping parameter $\alpha$ is given by $$\alpha = \alpha_0 + \frac{\gamma\hbar^2}{2e^2 M_s t_{FM}} \frac{G_{SM}}{1 + G_{SM}/G_{ext}},$$

where $\gamma$ is the fundamental constant known as the gyromagnetic ratio, $M_s$ is the saturation magnetization of the ferromagnetic material, and $t_{FM}$ is the thickness of the ferromagnetic thin film. When the conductivity of the NM is varied we have that $$\alpha = \alpha_0 + \frac{\gamma\hbar^2}{2e^2 M_s t_{FM}} \frac{G_{SM}}{1 + G_{SM}/[(\sigma'_{HM}/2\lambda_{s,ref}) \cdot (\sigma_{HM,ref}/\sigma'_{HM})^{1/2}]}.$$

The minimum electrical current density $J_c$ in a spin Hall metal that required for the anti-damping spin transfer torque to reverse the orientation of a ferromagnetic element or to excite the element into persistent microwave excitation varies as $$J_c \propto \frac{\alpha}{\xi'_{SH}} =$$

-continued $$\left(\frac{\hbar}{2e}\right)\frac{\sigma'_{HM}}{\sigma_{SH}}\left[\alpha_0\left(1+\frac{(\sigma'_{HM}\sigma_{HM,ref})^{1/2}}{2\lambda_{s,ref}G_{SM}}\right)+\frac{\gamma\hbar^2}{2M_s t_{FM}e^2}\frac{(\sigma'_{HM}\sigma_{HM,ref})^{1/2}}{2\lambda_{s,ref}}\right].$$

Thus as this equation indicates the minimum required critical current for anti-damping spin torque effects decreases as the conductivity of the spin Hall metal decreases, $J_c \propto (\sigma'_{HM})^{3/2}$, assuming that the spin pumping enhancement is dominant over the intrinsic damping.

The minimum electrical energy $E_c$ required to execute a spin transfer torque action varies as $E_c \propto J_c^2 t_{HM}/\sigma'_{HM}$ and minimization of this energy is an important consideration in device technologies. Therefore from the equations above, and if for optimum efficiency we scale the heavy metal film thickness with the changing spin diffusion length $t_{HM} \propto \lambda_s' = \lambda_{s,ref}(\sigma'_{HM}/\sigma_{HM,ref})^{1/2}$, we have that $E_c \propto (\sigma'_{HM})_{5/2}$ except when spin pumping is negligible and $G_{SM} G_{ext}'$ in which case $E_c \propto (\sigma'_{HM})^{3/2}$, so decreasing the conductivity of the spin Hall metal is quite beneficial to minimizing $E_c$ provided that the spin Hall conductivity $\sigma_{SH}$ is not also decreased.

For spin torque applications where damping does not play a role in determining the required critical density for the action, as in the displacement of domain walls in perpendicularly magnetized ferromagnetic layers, or in the reversal of the magnetic orientation of perpendicularly magnetized ferromagnetic layers, then for a device where $t_{HM}$ is optimally scaled with $\sigma'_{HM}$ we have $J_c \propto \sigma'_{HM}$ and thus $E_c \propto (\sigma'_{HM})^{3/2}$ for $G_{SM} G_{ext}'$ and $E_c \propto (\sigma'_{HM})^{5/2}$ when $G_{SM} H_{ext}'$. So here also decreasing $\sigma'_{HM}$ is beneficial provided again that $\sigma_{SH}$ does not decrease materially with the decrease in $\sigma'_{HM}$.

The design in FIG. 1B can be used for significantly improving both the strength and the electrical efficiency of the intrinsic spin Hall effect for the reversal by spin transfer torque of the magnetic orientation of the magnetic moment of a thin film ferromagnetic element that is the active data element in spin torque magnetic random access memory devices and in non-volatile logic devices. This design can also improve the electrical efficiency of the spin transfer torque excitation of the magnetization of nanoscale magnetic structures into persistent microwave or millimeter wave oscillations for the applications as spin-torque nanoscale oscillators. This method can further improve the strength and the electrical efficiency of the spin Hall effect for driving the rapid displacement of magnetic domain walls in thin film magnetic nanostructures with perpendicular magnetic anisotropy, and for reversibly switching the direction of magnetic orientation of a perpendicularly magnetized magnetic element by spin transfer torque effects.

In implementations, the SHE metal layer can be modified by a doping or alloying process. The SHE metal can be a heavy metal, for example, Pt, and is chosen such that, when in a thin film form it exhibits a strong intrinsic spin-orbit interaction and hence an intrinsic spin Hall conductivity $\sigma_{SH} \geq (\hbar/2e)2 \times 10^8$ $(\Omega \cdot m)^{-1}$ when unalloyed and un-doped, and when its electrical resistivity in that condition is $\rho_{HM} \leq 50 \times 10^{-8}$ $\Omega \cdot m$. When particular impurities, dopants and/or structural defects are incorporated into this heavy metal of the SHE metal layer, the resistivity of the heavy metal film is increased but the intrinsic spin Hall conductivity is not significantly decreased. Increases in the resistivity of, for example, Pt to $100 \times 10^{-8}$ $\Omega \cdot m$ or higher are achievable by doping or alloying for example with Hf, Ta, or a number of other high atomic number elements. For this increase in resistivity to be effective in enhancing the efficiency of the spin Hall torque effect, the incorporated impurity or dopant ions should operate to serve as strong elastic scattering centers for the conduction electrons and the incorporated ions should not materially increase the spin flip scattering rate of the conduction electrons. Accordingly, the incorporated impurities or dopants should not have a localized magnetic moment when within the spin Hall metal matrix and also be a strong elastic scattering center. Impurity or dopant atoms with an electronic valence considerably less than, or considerably greater than, that of the spin Hall metal element, such as Hf or Ta when used as dopants with Pt as the pure spin Hall metal, can serve as such strong scattering centers. Dopants with a very different atomic number than that of the spin Hall metal, such as, e.g., Al, B or Si in Pt, can also serve as strong scattering centers and hence be employed to substantially lower the conductivity of the spin Hall metal and hence increase its spin Hall angle and increase its spin Hall torque efficiency.

In using the spin Hall effect to cause a desired action in the magnetization of a ferromagnetic thin film element in close electrical proximity to the spin Hall metal, the resistivity of the spin Hall metal can be increased to, in various implementations, $50 \times 10^{-8}$ $\Omega \cdot m$, and to $100 \times 10^{-8}$ $\Omega \cdot m$, or even $200 \times 10^{-8}$ $\Omega \cdot m$ or higher, by doping or alloying with the appropriate elements, such as Hf, Ta, or some other atomic element having an electronic valence or atomic number different from that of the spin Hall metal host. The increase in the resistivity, or equivalently the decrease in the conductivity $\sigma_{HM}$ of the spin Hall metal, can be such that the resultant effective conductance of the spin Hall metal $G_{ext} = \sigma_{HM}/2\lambda_s \leq 0.5 \times 10^{15}$ $\Omega^{-1} m^{-1}$, or at least $G_{ext} = \sigma_{HM}/2\lambda_s \leq H_{SM}$, where $G_{SM}$ is the spin mixing conductance of the interface between the doped spin Hall metal and a ferromagnetic layer on which the spin transfer torque arising from the spin Hall effect is to be exerted.

Alternatively. the resistivity of the spin Hall metal can be increased such that the resultant effective conductance of the spin Hall metal $G_{ext}' = \sigma_{HM}'/2\lambda_s' \leq 0.5$ $G_{SM,FM,IL}$ where here $G_{SM,FM,IL}$ is the spin mixing conductance of the interface between the ferromagnetic layer and the surface of a very thin insertion layer (IL), of thickness ≤1 nm, of another material, for example Hf, placed between the spin Hall metal and the ferromagnetic layer. Such thin insertion layers can be employed for the purpose of enhancing the spin mixing conductance of the interface.

In some implementations, the heavy metal should have a spin Hall conductivity $\sigma_{SH} \geq (\hbar/2e)2 \times 10^5$ $(\Omega \cdot m)^{-1}$ and the resistivity of the pure spin Hall metal should be relatively low $\rho_{HM} \leq 50 \times 10^{-8}$ $\Omega \cdot m$ so that it can be increased substantially and still be below the metal-insulator transition regime. Then if the resistivity of the spin Hall metal is increased, the spin Hall angle of the metal will be increased proportionately provided that there no significant change in the intrinsic spin Hall conductivity $\sigma_{SH}$. For example, raising the resistivity of such a metal from $\rho_{HM} \leq 25 \times 10^{-8}$ $\Omega \cdot m$ to as high as $\rho_{HM} = 200 \times 10$ $\Omega \cdot m$ or more, which is feasible, the spin Hall angle can be increased from 0.05 to as high as 0.4 or more. If a low resistivity metal having a spin Hall conductivity considerably greater than $\sigma_{SH} \geq (\hbar/2e)2 \times 10^5$ $(\Omega \cdot m)^{-1}$ is utilized then the final value of the spin Hall angle will be even larger. The efficiency of this enhanced spin Hall angle in exerting spin transfer torque on an adjacent ferromagnetic thin film element is further increased by reducing the effective conductance of the spin Hall metal $G_{ext} \equiv 1/(2\lambda_s \cdot \rho_{HM})$ to $G_{HM} \leq G_{SM}$.

In combination, these two consequences of substantially increasing the electrical resistivity of the spin Hall metal increase the efficiency of the spin Hall effect for exerting spin transfer torque on an adjacent ferromagnetic element, and significantly lower the energy cost of executing an action from the spin transfer torque on that ferromagnetic element. For example, doubling the resistivity of the spin Hall metal, from $25 \times 10^{-8}$ Ω-m to $50 \times 10^{-8}$ Ω-m, by doping Pt with Hf, or any other element that has a similar effect as Hf dopants, doubles the spin Hall angle, and increases the spin Hall torque efficiency, by as much as 2.5 times or more, in the typical case where $G_{ext} \geq G_{SM}$ for the un-doped spin Hall metal. The minimum energy required to execute the spin transfer torque action is reduced by a factor of approximately two to four, depending on whether $G_{SM} > G_{ext}$ or $G_{SM} \leq G_{ext}$, where the latter is the typical case for Pt ferromagnetic interfaces. Greater increases in the resistivity of Pt with the use of a proper dopant material, such as Hf, Zr, Cr, or Ta, or another atomic element with a similar effect on the electrical resistivity but minimal effect on the spin Hall conductivity, will result in proportionality greater increases in the spin Hall torque efficiency and greater decreases in the minimum electrical energy required to execute as spin transfer torque action on an adjacent ferromagnetic thin film element.

This technique can be used to greatly or significantly increase the electrical efficiency of various devices and circuits that utilize the spin Hall effect. These include, for example, (1) magnetic memory cells and logic devices in which the magnetic free layer of a magnetic tunnel junction is reversibly switched by the spin transfer torque arising from the spin Hall effect originating from a current flowing in high resistivity Pt, or a similar spin Hall metal, with an enhanced spin Hall torque efficiency, (2) magnetic memory and logic devices which operate by the effect of the spin transfer torque from the spin Hall effect in high resistivity Pt or a similar spin Hall metal in efficiently displacing magnetic domain wall in a thin film ferromagnetic nanostructure, or (3) microwave and millimeter wave devices that operate on the basis of persistent magnetic oscillations driven by the spin transfer torque originating from high resistivity Pt or a similar spin Hall metal with an enhanced spin Hall torque efficiency.

Tests were conducted by building a three-terminal spin Hall device using a Pt(4)/Hf(0.5)/FCB(1.8)/MgO(1.6)/FCB(4)/Hf(5)/Ru(5) multilayer thin film stack produced by magnetron sputter deposition, where the number in parentheses indicates the each layer's thickness in nm and where the top two layers are included to provide protection of the magnetic tunnel junction (MTJ) layers (FCB/MgO/FCB) from the atmosphere. The FCB here refers to the ferromagnetic materials $Fe_{60}Co_{20}B_{20}$. Due to some intermixing of the Hf layer into the Pt, the resistivity of the 4 nm Pt layer in this multi-layer thin film stack was increased to approximately $50 \times 10^{-8}$ Ω-m in the as-deposited state and to approximately $60 \times 10^{-8}$ Ω-m after annealing the structure at 300 C for 30 minutes.

Figure 7:
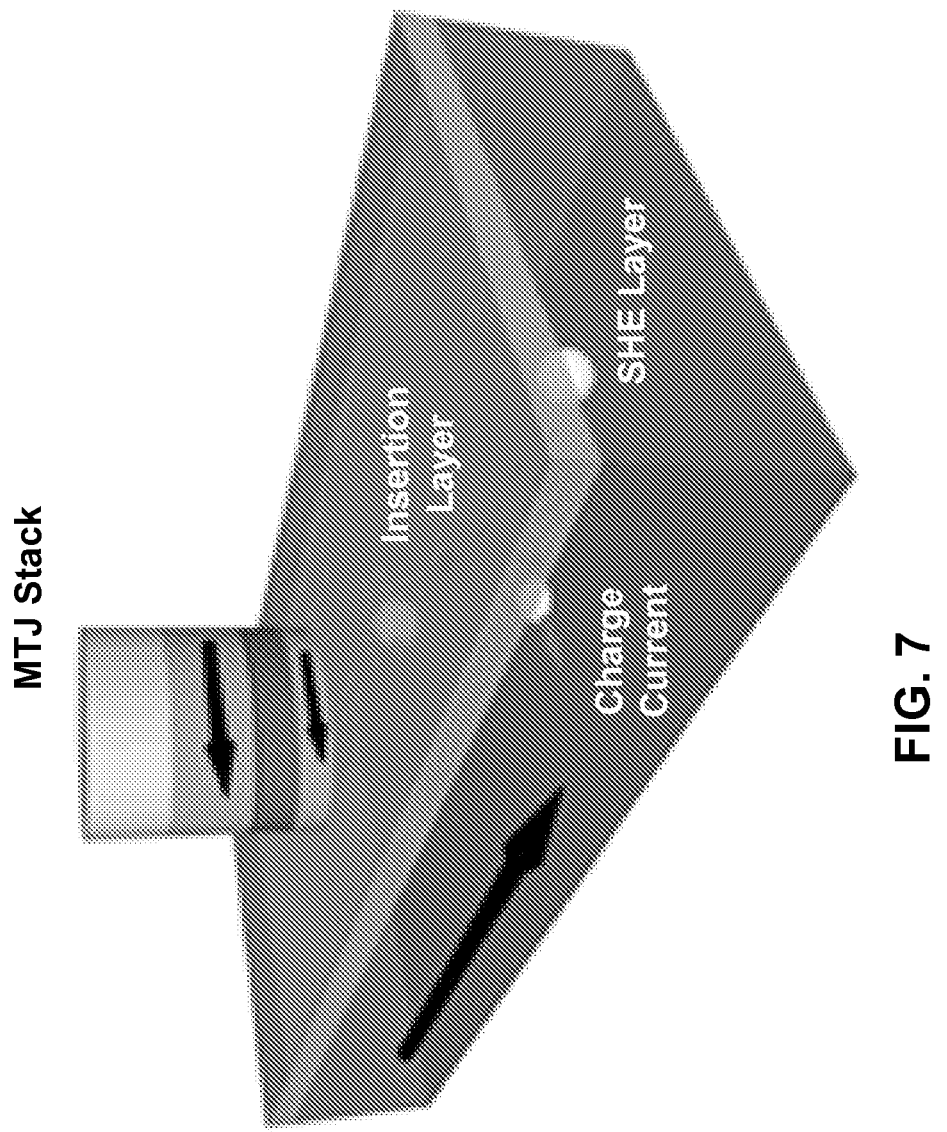
FIG. 7 depicts an example of a schematic representation of one embodiment of the disclosed technology where a magnetic tunnel junction is formed adjacent to a NM-IL bilayer and the free layer of the magnetic tunnel junction (indicated by the bottom orange layer in the schematic, is in electrical contact with the insertion layer.
Figure 8:
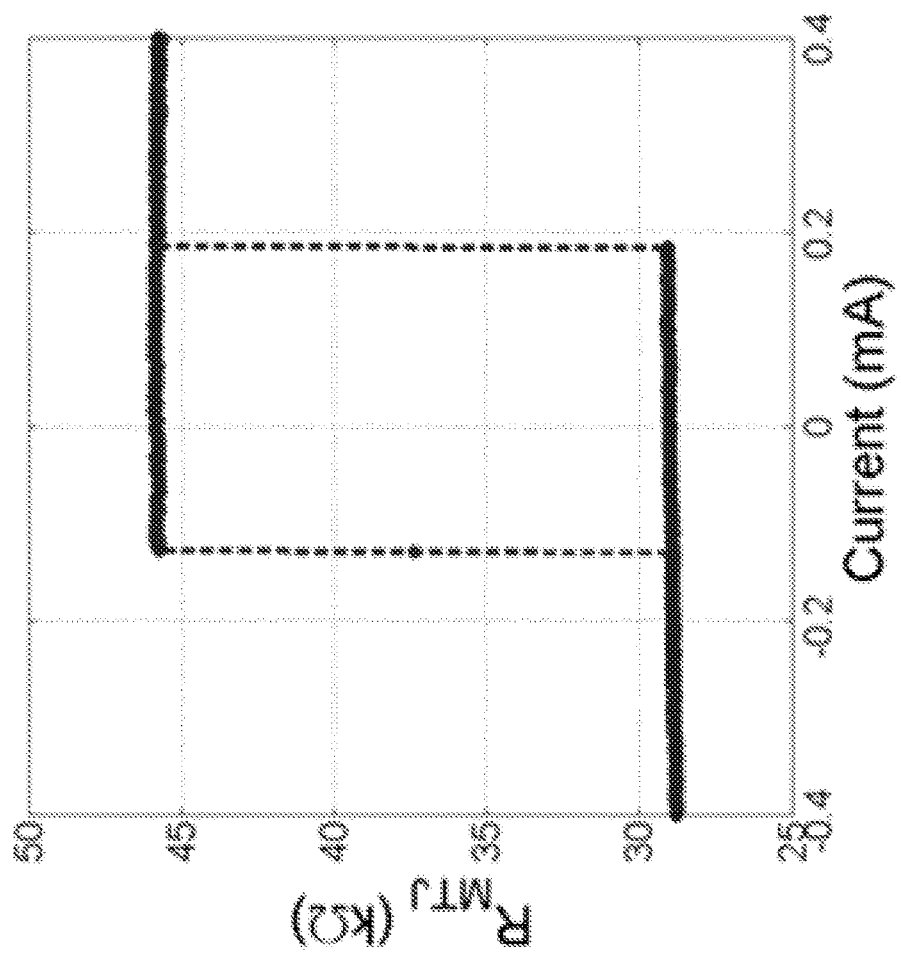
FIG. 8 depicts an example of a graph showing the change of resistance of a 70 nm×240 nm magnetic tunnel junction where the magnetic orientation of the 1.8 nm thick FeCoB free layer can be reversible changed from parallel to the orientation of the opposing, magnetically fixed, electrode by the spin torque exerted by the spin current originating from a current passing through the underlying 4 nm Pt layer and diffusing through the 0.5 nm Hf to impinge on the free layer. The small size of the required current for reversible demonstrates the successful operation of the disclosed technology.

In conducted test, electron beam lithography and ion-beam etching were employed to structure all but the bottom two layers into an elongated ~70 nm×240 nm MTJ on top of the Pt/Hf microstrip as shown in FIG. 7. The magnetoresistance of the MTJ as measured as a function of the current flowing longitudinally through the Pt/Hf bilayer. The minimum current density $J_{c0}$ required to switch the magnetic orientation of the bottom FCB layer in the magnetic tunnel junction, the magnetic "free layer", was determined experimentally and then the relationship $$J_{c0} = \frac{2e\mu_0 M_s t\alpha(H_c + M_{eff}/2)}{\hbar} \frac{1}{\xi_{SH}}.$$

was used to determine that the spin Hall torque efficiency in this system is approximately $\xi_{SH} \approx 0.12$. $M_s$ is the saturation magnetization of the FCB free layer, t is its thickness and $H_c$ is the in-plane coercive field of the free layer and α is the total magnetic damping of the free layer due to both its intrinsic damping and spin pumping across the FM-Hf interface. Our analysis of this result reveals that this increase in spin Hall torque efficiency, from $\xi_{SH} \approx 0.06$ for spin Hall devices using low resistivity Pt is due to the increase in the Pt resistivity due to the Hf intermixing and indicates an increase in the spin Hall angle of Pt(Hf) to at least $\theta_{SH}^{Pt(Hf)}=0.3$ and possibly higher. Higher levels of Hf doping and hence a higher Pt(Hf) resistivity will raise the spin Hall angle and hence the spin Hall torque efficiency even higher, further enhancing the energy efficiency of the spin Hall devices for all spin torque applications.

This result demonstrates that the spin Hall angle of a low resistivity spin Hall metal, in particular Pt, can be substantially increased by doping or alloying the Pt with a second element that increases its resistivity substantially but has no strong effect on the spin Hall conductivity of the metal. Our tests demonstrated that Hf dopants can be successfully employed for this purpose. Other elements that have similar characteristics to Hf with respect to serving as strong non-magnetic scattering centers when inserted into Pt, or a similar low resistivity spin Hall metal, will be equally effective in enhancing the spin Hall torque efficiency of the material. This enhancement enables, in this particular embodiment of the invention, a substantially enhanced electrical efficiency of the spin transfer torque reversal of the free layer in a magnetic tunnel junction by the spin Hall effect occurring in the doped Pt layer. Similar increases in the efficiency of the spin Hall effect for other magnetic devices that operate on the basis of spin transfer torque effects will be readily achievable.

Various implementations can be achieved based on the above disclosed structures and techniques.

For example, a specific magnetic structure based on the above disclosure can include a non-magnetic spin Hall effect conductor layer located over a substrate; and a magnetic thin film layer located over the substrate and contacting the non-magnetic conductor material where an electrical current flowing in the spin Hall effect conductor material generates a spin current that flows to the magnetic layer and hence results in the exertion of a spin transfer torque on the magnetic configuration of the magnetic thin film that effects a reversible change in that magnetic structure. In this structure, the metal layer that comprises the spin Hall effect conductor material has a spin Hall conductivity $\sigma_{SH} \geq (\hbar/2e) 2 \times 10^5$ Ω$^{-1}$m$^{-1}$, where $\hbar=h/2\pi$ and h is Planck's constant and e is the elemental charge of an electron, and an electrical resistivity that is less than or equal to $50 \times 10^{-8}$ Ω-m in its unalloyed and un-doped state. The spin Hall effect conductor material has a thickness no greater than about 5 times the spin diffusion length in the non-magnetic conductor spin Hall base layer material. The spin Hall effect conductor layer is doped or alloyed with atoms of a different atomic valence or atomic number and these atoms do not have a local magnetic moment when within the spin Hall conductor material. In addition, the effect of doping or alloying the spin Hall conductor material raises its resistivity to $\geq 50 \times 10^{-8}$ Ω-m, that is at least two times or more from that when it is un-doped or un-alloyed, while it does not significantly decrease the spin Hall conductivity.

More specific features can be further implemented into the above specifically defined magnetic structure in the immediate proceeding paragraph, either alone or in combination. For example, the magnetic free layer can be magnetically polarized in-plane with respect to the substrate, or the magnetic free layer can be magnetically polarized in a direction approximately perpendicular to the substrate; the magnetic free layer can include at least one of Fe, Co, Ni, or an alloy and compound where one or more of these metallic elements is included as a component, including, but not limited to, CoFeB, CoFeAl, NiFe, or CoFeNi alloys and compounds; the spin Hall conductor material is Pt and the dopant or alloying element is Hf; the spin Hall conductor material is Pt and the dopant or alloying element is Ta, Zr, B, Cr, or any one of a number of metallic elements whose electronic valence and/or atomic number differ from that of Pt but which atomic element does not exhibit a significant magnetic moment when inserted into the Pt metallic lattice. For example, the starting spin Hall conductor material can be a low resistivity ($\leq 50 \times 10^{-8}$ Ω-m) form of either Pd, Ta, W, Ir, Os, Au, Tl, and Bi, and low resistivity alloys and compounds that include one or more of the foregoing conductor materials where the resistivity is less than or equal to $50 \times 10^{-8}$ Ω·m before additional dopants or alloy components are added to the material, and wherein the dopant or alloying element is Hf, Zr, B, Cr, or any one of a number of metallic elements whose electronic valence and/or atomic number different from that of the starting spin Hall conductor material, but which does not exhibit a significant magnetic moment when inserted into the spin Hall material. For example, the low resistivity spin Hall effect conductor layer before having its resistivity increased by doping or alloying is comprised of at least one rare earth element or a low resistivity alloy or compound that includes a rare earth component. For example, a thin layer of another conducting material (e.g., $\leq 1$ nm), either Hf, Ta, W, Nb, Mo, Ru, Re, Os, Ir, Cr, or Zr or an alloy or metallic compound where one or more of these transition metals is included as a component, is inserted between the magnetic layer and the spin Hall conductor material, where the spin mixing conductance of this insertion layer and the magnetic material is less than 50% of that between the high resistivity spin Hall conductor material and the magnetic material in the absence of the insertion layer. For yet another example, in the above specifically defined magnetic structure, a thin layer of another conducting material (e.g., $\leq 1$ nm), either Hf, Ta, W, Nb, Mo, Ru, Re, Os, Ir, Cr, or Zr or an alloy or metallic compound where one or more of these transition metals is included as a component, can be inserted between the magnetic layer and the spin Hall conductor material, where the spin mixing conductance of this insertion layer and the magnetic material is less than 50% of that between the spin Hall conductor material and the magnetic material in the absence of the insertion layer, and where the high resistivity spin Hall conductor material is doped Pt or a Pt alloy.

The above and other disclosed magnetic structures based on the technology in this document, including the three designs in FIGS. 1A, 1B and 1C, may be used in various circuit configurations and for various applications. For example, both 2-terminal circuit configurations and 3-terminal circuit configurations may be used to supply a current through an MTJ under the disclosed structures. A magnetic tunneling junction memory device based on a two-terminal circuit configuration may be created, that include the structures described herein, where the first electrical terminal is in contact with the MTJ from a side having the pinned magnetic layer to receive a gate voltage that modifies a current threshold of a spin-polarized current flowing across the MTJ for switching the magnetization of the free magnetic layer and the second terminal in electrical contact with a contact location of the spin Hall effect metal layer.

A magnetic tunneling junction memory device based on a three-terminal circuit configuration can include an array of memory cells for storing data; and a memory control circuit coupled to the array of memory cells and operable to read or write data in the memory cells, wherein each memory cell includes a magnetic structure disclosed in this document and further includes: a first electrical terminal in electrical contact with the MTJ from a side having the pinned magnetic layer to receive a gate voltage that modifies a current threshold of a spin-polarized current flowing across the MTJ for switching the magnetization of the free magnetic layer; and second and third electrical terminals in electrical contact with two contact locations of the spin Hall effect metal layer on two opposite sides of the free magnetic layer to supply the charge current in the spin Hall effect metal layer.

The above specific 3-terminal device may, in some implementations, include additional features or structures.

In one example, the above 3-terminal device be configured so that the memory control circuit is coupled to the first, second and third electrical terminals to supply (1) the charge current via the second and third electrical terminals in the spin Hall effect metal layer and (2) the gate voltage across the MTJ causing a small current tunneling across the MTJ that is insufficient to switch the magnetization of the free magnetic layer without collaboration of the spin-polarized current flowing across the free magnetic layer caused by the charge current.

In a second example, the above 3-terminal device be configured so that the memory control circuit is configured to be operable in a writing mode to simultaneously apply the charge current in the spin Hall effect metal layer and the gate voltage across the MTJ to set or switch the magnetization direction of the free magnetic layer to a desired direction for representing a stored bit.

In a third example, the above 3-terminal device can be configured so that the memory control circuit is further configured to be operable in a read mode to apply a read voltage to the first electrical terminal to supply a read current tunneling across the MTJ between the first electrical terminal and the spin Hall effect metal layer, without switching the magnetization direction of the free magnetic layer, to sense the magnetization direction of the free magnetic layer that represents the stored bit in the MTJ.

In a fourth example, the above 3-terminal device can be configured so that the memory control circuit is coupled to the first, second and third electrical terminals to supply (1) the charge current via the second and third electrical terminals in the spin Hall effect metal layer and (2) the gate voltage across the MTJ causing a small current tunneling across the MTJ that is insufficient to switch the magnetization of the free magnetic layer without collaboration of the spin-polarized current flowing across the free magnetic layer caused by the charge current, the memory control circuit is configured to be operable in a writing mode to simultaneously apply the charge current in the spin Hall effect metal layer and the gate voltage across the MTJ to set or switch the magnetization direction of the free magnetic layer to a desired direction for representing a stored bit, and the memory control circuit is further configured to be operable in a read mode to apply a read voltage to the first electrical terminal to supply a read current tunneling across the MTJ between the first electrical terminal and the spin Hall effect metal layer, without switching the magnetization direction of the free magnetic layer, to sense the magnetization direction of the free magnetic layer that represents the stored bit in the MTJ.

Some aspects of the 2-terminal and 3-terminal circuit designs are provided below for implementing the SHE-STT structures in FIGS. 1A, 1B and 1C. The drawings referenced below may not expressly illustrate the insertion layer or the doped/alloyed SHE metal layer but the use of the design features in FIGS. 1A, 1B and 1C in each example to be described below is implied in connection with each SHE metal layer shown or discussed so that, each SHE metal layer shown should have a corresponding insertion layer in FIG. 1A, or a modified SHE metal layer by doping or alloying as shown in FIG. 1B or a combination of both as shown in FIG. 1C.

Some aspects of 3-terminal circuits having MTJs are disclosed in Applicant's prior patent applications in Cornell Unversity's PCT Application No. PCT/US2012/051351 entitled "SPIN HALL EFFECT MAGNETIC APPARATUS, METHOD AND APPLICATIONS" which is published under PCT Publication No. WO 2013/025994 A2, and PCT Application No. PCT/US2013/053874 entitled "ELECTRICALLY GATED THREE-TERMINAL CIRCUITS AND DEVICES BASED ON SPIN HALL TORQUE EFFECTS IN MAGNETIC NANOSTRUCTURES" which is published under PCT Publication No. WO 2014/025838 A1. Both PCT applications are incorporated by reference as part of the disclosure of this patent document.

Notably, as specific examples for using the SHE structure in 3-terminal device configurations, the perpendicular spin-polarized current can be combined with voltage controlled magnetic anisotropy generated by a voltage signal applied to the top contact, such as top contact layers to further improve the efficiency of spin torque manipulation of magnetic memory devices disclosed in this document.

Figure 13A:
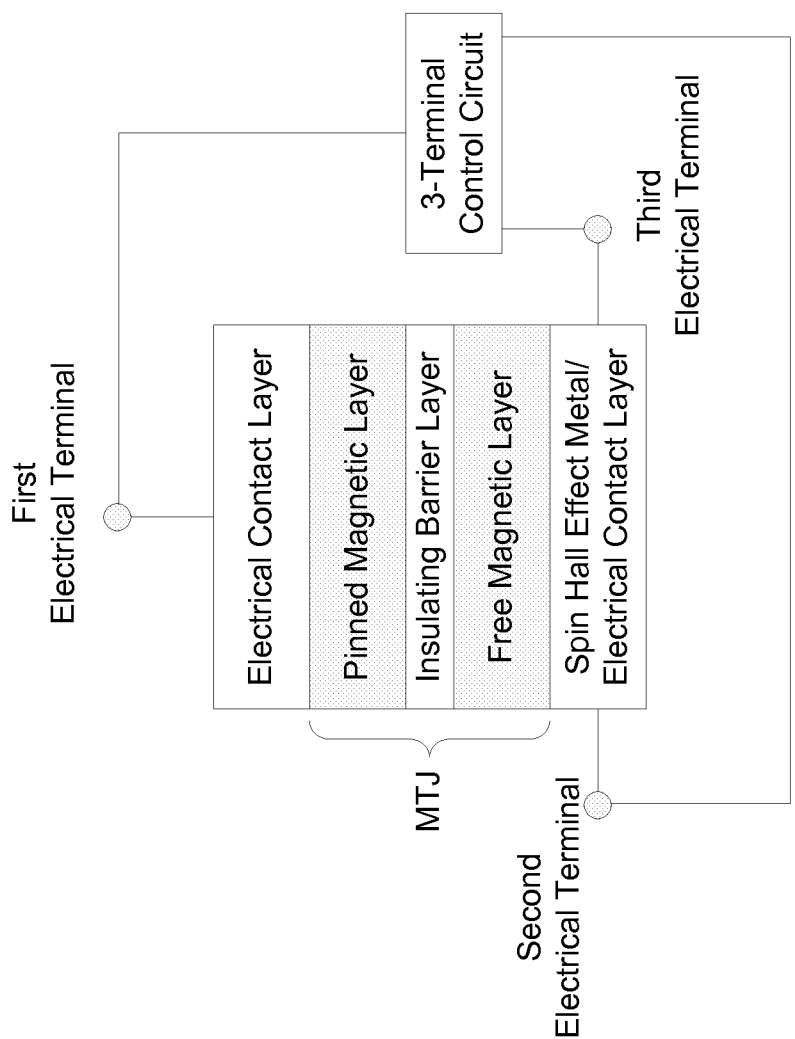
FIGS. 13A and 13B show examples of magnetic tunnel junction (MTJ) circuits in a 3-terminal circuit configuration implementing a spin Hall effect metal layer for providing a spin-polarized current into the free magnetization layer of the MTJ.

FIG. 13A shows an example of a 3-terminal MTJ device having a spin Hall effect (SHE) metal layer coupled to the free magnetic layer of the MTJ junction. The layers in the MTJ and the SHE metal layer, e.g., selection of the materials and dimensions, are configured to provide a desired interfacial electronic coupling between the free magnetic layer and the SHE metal layer to generate a large flow of spin-polarized electrons or charged particles in the SHE metal layer under a given charge current injected into the SHE metal layer and to provide efficient injection of the generated spin-polarized electrons or charged particles into the free magnetic layer of the MTJ. Each of the free magnetic layer or the pinned magnetic layer can be a single layer of a suitable magnetic material or a composite layer with two or more layers of different materials. The free magnetic layer and the pinned magnetic layer can be electrically conducting while the barrier layer between them is electrically insulating and sufficiently thin to allow for electrons to pass through via tunneling. The spin Hall effect metal layer can be adjacent to the free magnetic layer or in direct contact with the free magnetic layer to allow the spin-polarized current generated via a spin Hall effect under the charge current to enter the free magnetic layer.

The 3 terminals in the MTJ device in FIG. 13A can be used to implement two independent control mechanisms that are not possible in a 2-terminal MTJ device. As illustrated, the first control mechanism is via applying a gate voltage across the MTJ junction with the first terminal so that the electric field at the free magnetic layer caused by the applied gate voltage can modify the magnetic anisotropy of the free magnetic layer including its perpendicular magnetic anisotropy that affects the threshold value of a spin-polarized current that can switch the magnetization of the free magnetic layer via spin torque transfer from a spin-polarized current that is injected into the free magnetic layer. The second, independent control mechanism uses second and third electrical terminals at two contact locations of the SHE metal layer on two opposite sides of the area in contact with the MTJ of the SHE metal layer to supply the charge current in the SHE metal layer to produce the spin-polarized electrons or charged particles based on the spin Hall effect.

In principle, the layers of the MTJ and the SHE metal layer can be configured to allow either one of the gate voltage across the MTJ or the charge current in the SHE metal layer to independently cause switching of the magnetization of the free magnetic layer. However, in the disclosed 3-terminal MTJ devices in this document, the gate voltage across the MTJ is controlled to be less than the threshold voltage that is sufficient to independently cause a significant current tunneling through the barrier layer of the MTJ to trigger the switching, and similarly, the charge current in the SHE metal layer is controlled to be less than the threshold charge current that is sufficient to independently cause a significant amount of the spin-polarized charges to enter the free layer to trigger the switching. Notably, the disclosed 3-terminal MTJ devices and techniques can be designed to use the combined operation of both the gate voltage across the MTJ and the charge current in the SHE metal layer to collectively trigger the switching in the free magnetic layer. In FIG. 8A, a 3-terminal control circuit is coupled to the first, second and third electrical terminals to achieve the above desired control operations.

Specifically, the 3-terminal control circuit is operated as the following. The gate voltage is applied between a first electrical terminal in contact with the pinned magnetic layer and the spin Hall effect metal layer to modify the perpendicular magnetic anisotropy of the free magnetic layer, without allowing the gate voltage alone to cause switching of the magnetization direction of the free magnetic layer; and the charge current is applied between two electrical terminals in the spin Hall effect metal layer to induce a spin-polarized current into the free magnetic layer without switching of the magnetization of the free magnetic layer. The application of the gate voltage and the application of the charge current are synchronized in order to switch the magnetization of the free magnetic layer.

Figure 13B:
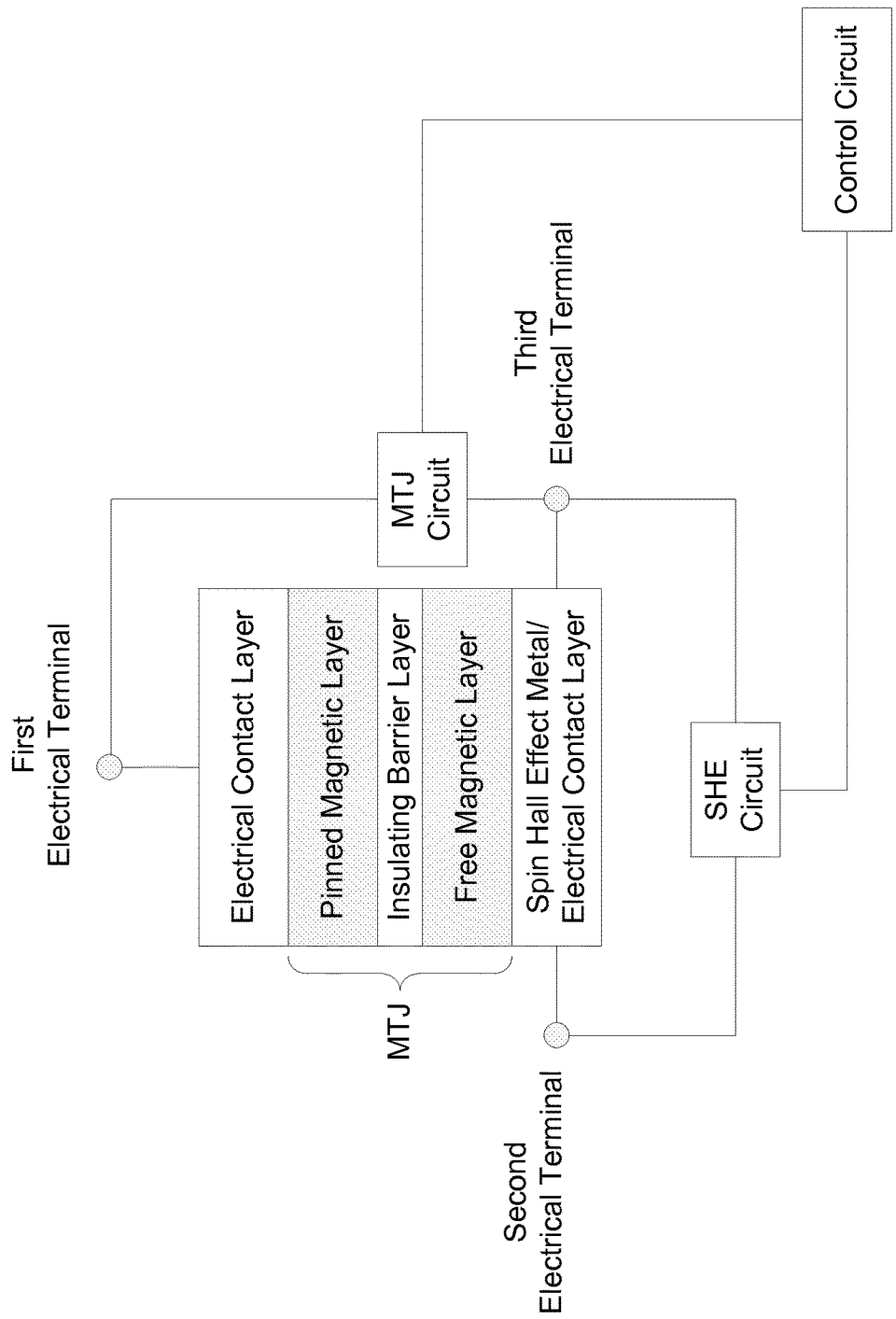

FIG. 13B shows an example where the 3-terminal control circuit in FIG. 8A is implemented by a MTJ circuit and a SHE circuit. The MTJ circuit is coupled between the first and the third terminals to apply a desired voltage across the MTJ without switching the magnetization of the free magnetic layer. The SHE circuit is coupled between the second and the third electrical terminals to supply the charge current in the SHE metal layer. A control circuit is further coupled to the MTJ circuit and the SHE circuit to control the operations of the MTJ and the SHE circuits, e.g., controlling the voltage amplitude or direction across the MTJ, the current amplitude or direction of the charge current in the SHE metal layer, and synchronizing the voltage and the charge current in time for switching the magnetization of the free magnetic layer.

The 3-terminal MTJ devices disclosed in FIGS. 13A, 13B and other parts of this document can be implemented to provide circuit configurations and operational features that are difficult to achieve in 2-terminal MTJ devices and to achieve certain advantages in applications. For example, the charge current applied to the spin Hall effect metal layer via two electrical terminals at two contact locations of the spin Hall effect metal layer is used to inject a spin-polarized current into the free magnetic layer of the MTJ for effectuating a spin torque transfer into the free magnetic layer eliminates the need to apply a large current across the MTJ for effectuating sufficient spin torque transfer into the free magnetic layer for switching the magnetization of the free magnetic layer as in the 2-terminal MTJ device. This can be advantageous because there are detrimental aspects to effecting the magnetic reorientation of the free magnetic layer (FL) with a current pulse that passes through the tunnel barrier layer for the memory cell application. For example, the high current pulse required to tunnel through the MTJ junction for the switching operation can result in degradation of the electrical integrity of the insulator barrier layer in the MTJ. In a 2-terminal MTJ device, the design of the FL can be made to reduce the required write current pulse amplitude for the switching operation. However, since the reading operation and the writing operation in this 2-terminal MTJ device are effectuated via the same two terminals of the MTJ, the electrical bias required to provide a large enough signal for a fast read of the memory cell can produce a tunneling current through the MTJ that is lower but close to the designed threshold current for the switching operation of the MTJ. This condition can result in a "write-upon-read" error where the MTJ is inadvertently switched during a read operation due to electrical noise that momentarily adds a small amount of additional current to the read current. The rate of this "write-upon-read" error increases as the difference between the current tunneling through the MTJ during a read operation and the STT threshold current for switching the MTJ becomes smaller. As such, various 2-terminal MTJ devices face a conflict between the need to reduce the amplitude of the tunneling current for switching the MTJ and the need for fast read associated with using a sufficiently large read current to complete the measurement of the MTJ resistance for reading the stored bit in a short time. Different from the 2-terminal MTJ devices, the 3-terminal MTJ devices in this document are configured to provide two separate and independent controls over the voltage across the MTJ to eliminate the above dilemma in the 2-terminal MTJ devices and can achieve a low tunneling current across the MTJ during a write operation while still being able to achieve a fast reading operation without being subject to the "write-upon-read" error in the 2-terminal MTJ devices. To effectuate a switching in the 3-terminal MTJ devices disclosed in this document, the two separate controls are synchronized in order to switch the magnetization of the free magnetic layer.

For a large array of 3-terminal MTJ cells in various circuits, the column and row driving circuits for the array of 3-terminal MTJ cells can be designed to reduce the overall circuit size by sharing circuit elements. As described in greater detail in the examples below, a cross-point memory architecture can be implemented based on the gated spin Hall torque switching to provide sharing of transistor switches in the 3-terminal MTJ cells, thus improving the overall compactness of circuits using large arrays of 3-terminal MTJ cells.

In another aspect, the availability of three terminals as input/output ports for a 3-terminal MTJ device disclosed in this document can be used to implement various logic operations. In contrast, with only two terminals available, the 2-terminal MTJ devices tend to be difficult, or infeasible in some cases, in building circuits for various binary logic applications based on the spin-torque switching operations.

In yet another aspect, the 3-terminal MTJs in combination with spin transfer torque disclosed in this document can be configured to employ a magnetic configuration such that the free magnetic layer has only one stable magnetic state but can be excited into magnetic precession about this equilibrium state at microwave or RF frequencies by the anti-damping torque generated by a steady spin-polarized direct current that impinges on the free magnetic layer. The frequency of oscillation is determined by the total time-averaged effective magnetic field experienced by the free magnetic layer, and this can vary with the amplitude of the magnetic precession, which in turn depends on the amplitude of the bias current. The time varying magnetoresistance of the MTJ due to the precession of the free magnetic layer provides a microwave output signal. Thus spin transfer torque can be employed in a MTJ to produce a spin-torque nano-oscillator (STNO) that has potential application in on-chip communication and signal processing applications. In STNO devices based on 2-terminal MTJ devices, the amplitude of the oscillator cannot be electrically varied independently of its frequency, due to the 2-terminal character of the MJT.

Specific implementations and examples of the present 3-terminal MTJ devices and applications are provided below.

The giant spin Hall effect in various heavy (high atomic number) metals, such as Pt, Ta, W, Hf, and others, provides the foundation for the new 3-terminal MTJ devices in this document. The spin Hall effect in certain metals with large atomic numbers is illustrated in FIGS. 14A and 14B.

Figure 14A:
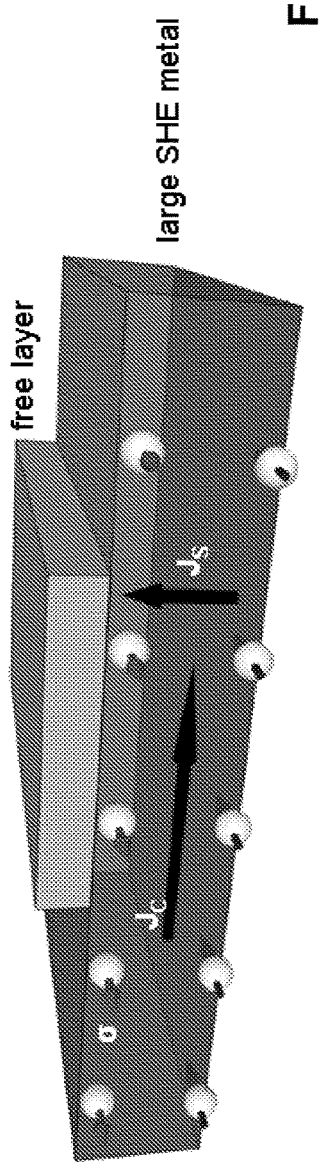
FIGS. 14A and 14B illustrate operation of a spin Hall effect metal layer for providing a spin-polarized current into the free magnetization layer, wherein the flowing directions of the in-plane charge current $J_c$ (or $J_e$) and out-of-plane spin-polarized current $J_s$ and the direction of the injected spin a are shown.

FIG. 14A shows a spin Hall effect metal layer is in direct contact with a free magnetic layer of an MTJ for receiving an in-plane charge current $J_c$ (or $J_e$) and for producing a spin-polarized current $J_s$ into the free magnetization layer. The flowing directions of the in-plane charge current $J_c$ (or $J_e$) and out-of-plane spin-polarized current $J_s$ and the direction of the injected spin a are shown. FIG. 9B further illustrates that the spin Hall effect separates two spin states in the charge current in opposite directions that are perpendicular to the in-plane charge current $J_c$ (or $J_e$). Hence, by controlling the current direction of the in-plane charge current $J_c$ (or $J_e$) in the SHE metal layer, one of the two spin states can be selected as the spin-polarized current $J_s$ that is injected into the free magnetization layer.

Figure 14B:
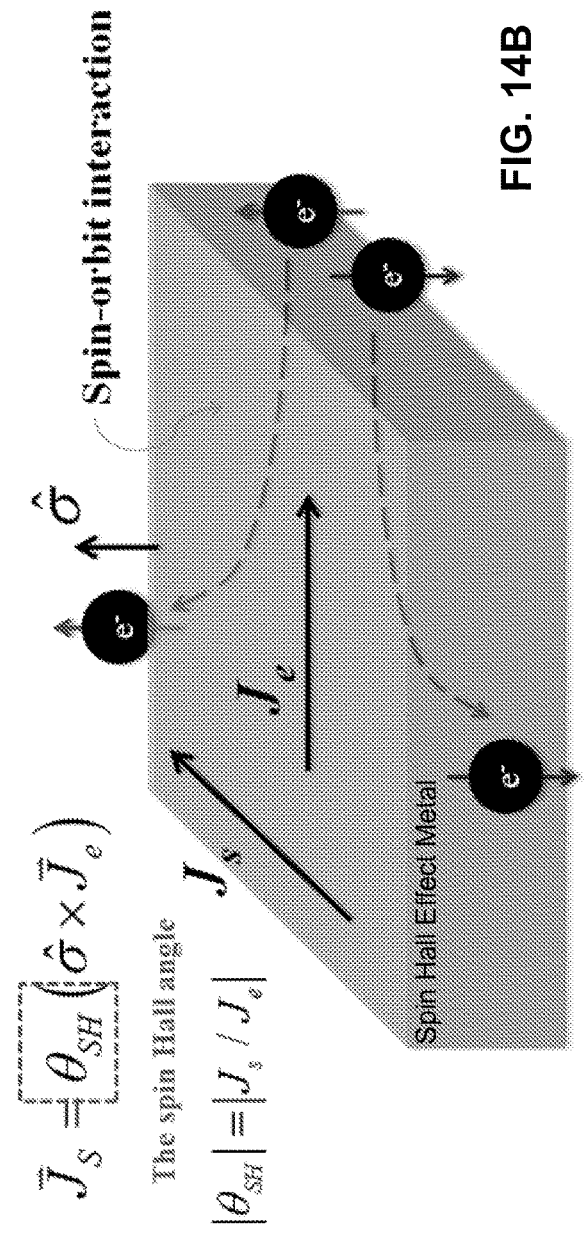

FIG. 14B further shows that, the orientation of the injected spins in the spin-polarized current J is determined by a relationship between the charge current $J_c$ (or $J_e$), the direction of the injected spin moments $\vec{\sigma}$ (not the angular momenta) and the charge current $J_c$: $\vec{J} \propto \theta_{SH} \vec{\sigma} \times \vec{J}_c$, where $\theta_{SH}$ is the spin Hall angle and is a parameter specific to each material and quantifies the magnitude of the SHE effect in each material.

In FIGS. 14A and 14B and some subsequent figures, only the in-plane spin polarization component of the injected spins in the spin-polarized current J is illustrated but it is understood that there is an out-of-plane spin polarization component as shown in FIG. 1B.

In the spin Hall effect, an electrical current flowing through a heavy metal thin film layer creates a transverse spin current due to spin dependent deflection of electrons in the directions perpendicular to the direction of current flow. Electrons of opposite spin angular momentum are deflected in opposite directions as illustrated in FIGS. 14A and 14B. In layers of high resistivity beta-Ta, for example, the spin Hall effect is particularly strong with the transverse spin current density being as high as 0.15 of the longitudinal electrical current density. This spin current can be utilized to exert torque on the magnetization of an adjacent magnetic film, and thus enables a 3-terminal magnetic circuit or device for reversing the magnetic orientation of the FL of a magnetic tunnel junction that is formed on top of a spin Hall layer, as also illustrated in FIGS. 13A and 13B.

Figure 15:
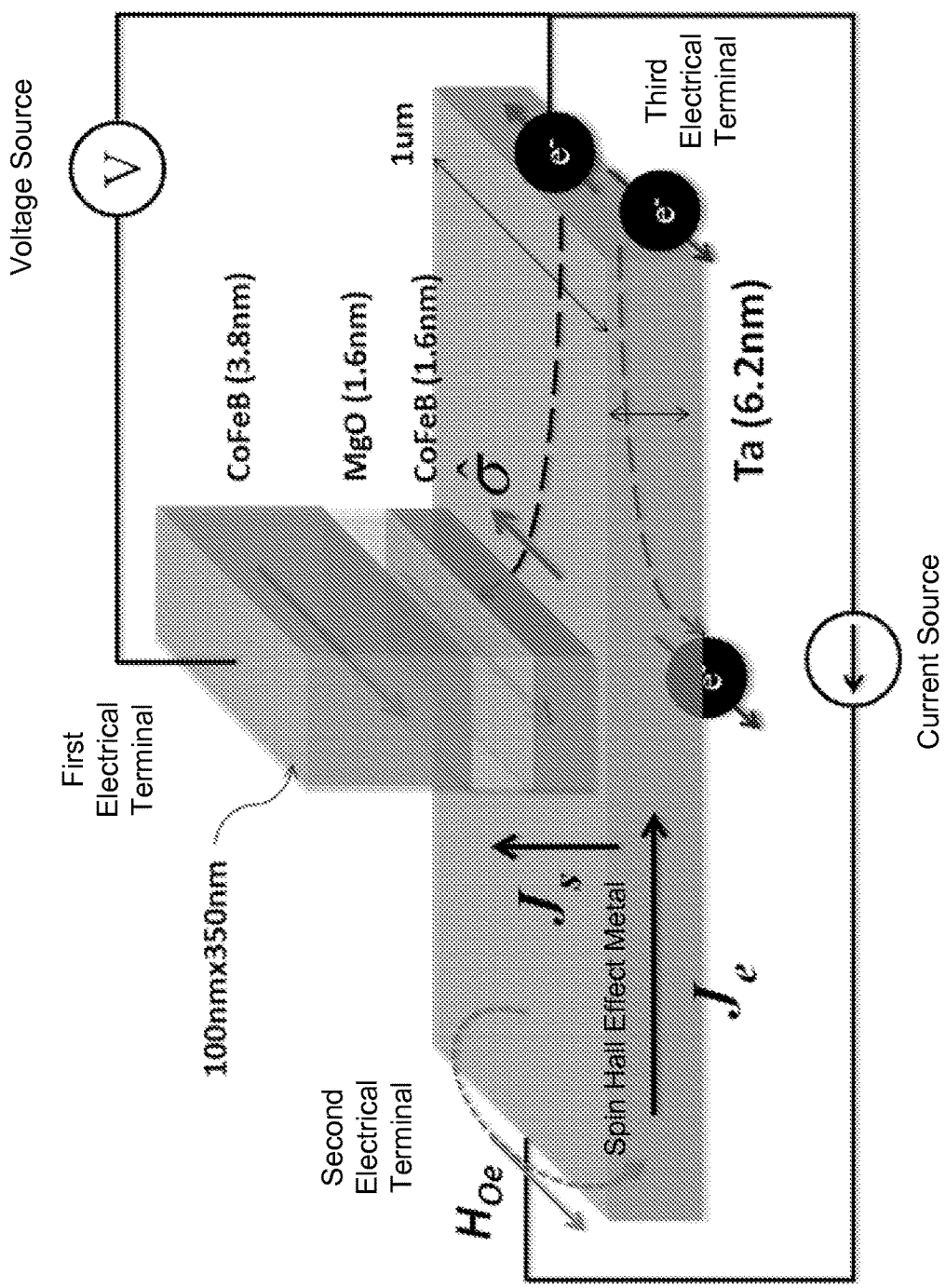
FIG. 15 shows an example of a 3-terminal MTJ circuit having a current source coupled to the spin Hall effect metal layer and a voltage source coupled across the MTJ.

FIG. 15 shows an example of a 3-terminal MTJ circuit that includes a voltage source coupled between the first and third electrical terminals across the MTJ and a current source coupled between the second and third electrical terminals to the spin Hall effect metal layer. The FL and PL layers in this example are shown to be parallel to the planes of the layers as in-plane magnetization that is perpendicular to the direction of the in-plane charge current $J_c$ (or $J_e$) in the SHE metal layer.

The present 3-terminal MTJ devices operate to effectuate switching of the magnetization in the free magnetic layer by simultaneously applying the gate voltage across the MTJ junction and the charge current in the SHE metal layer. This aspect of the 3-terminal MTJ devices is based on voltage-controlled magnetic anisotropy (VCMA), in which an electric field alters a ferromagnetic film's perpendicular anisotropy by changing the electronic structure at a ferromagnet/oxide interface. VCMA has been shown to enable strong tuning of the coercive magnetic field of the FL in a MTJ and direct toggle switching of the FL by voltage pulses applied across the MTJ. A significant aspect of VCMA is that it offers the potential of effecting the switching of a FL with little or no current flow through the MTJ, which could lower the energy cost of the MRAM write operation by minimizing Ohmic loss.

Considering the example in FIG. 15, the in-plane charge current $J_e$ in the SHE metal layer is set to produce the spin-polarized $J_s$ that is perpendicular to the in-plane charge current $J_e$ in the SHE metal layer. When the SHE metal layer is sufficiently thin in the transverse direction, the spin-polarized $J_s$ is injected into the free magnetization layer without significantly losing the injected spin moments $\vec{\sigma}$ due to the spin relaxation caused by propagation of the electrons or charged particles. The magnitude of the in-plane charge current $J_e$ in the SHE metal layer is controlled to be sufficiently small so that the spin-polarized current $J_s$ that has entered the free magnetization layer is significantly smaller than the threshold current for the spin-polarized current to cause switching of the magnetization of the free magnetic layer. The gate voltage across the MTJ junction, however, is applied to alter the perpendicular anisotropy by changing the electronic structure at the ferromagnet/oxide interface due to the voltage-controlled magnetic anisotropy (VCMA) to lower the threshold current required for the spin-polarized current to cause switching of the magnetization of the free magnetic layer to a level that the spin-polarized current $J_s$ that has entered the free magnetization layer is at or above the newly reduced threshold current for switching the MTJ. Under this condition of simultaneous application of the charge current and the gate voltage, the magnetization of the free magnetic layer is switched.

Figure 16A:
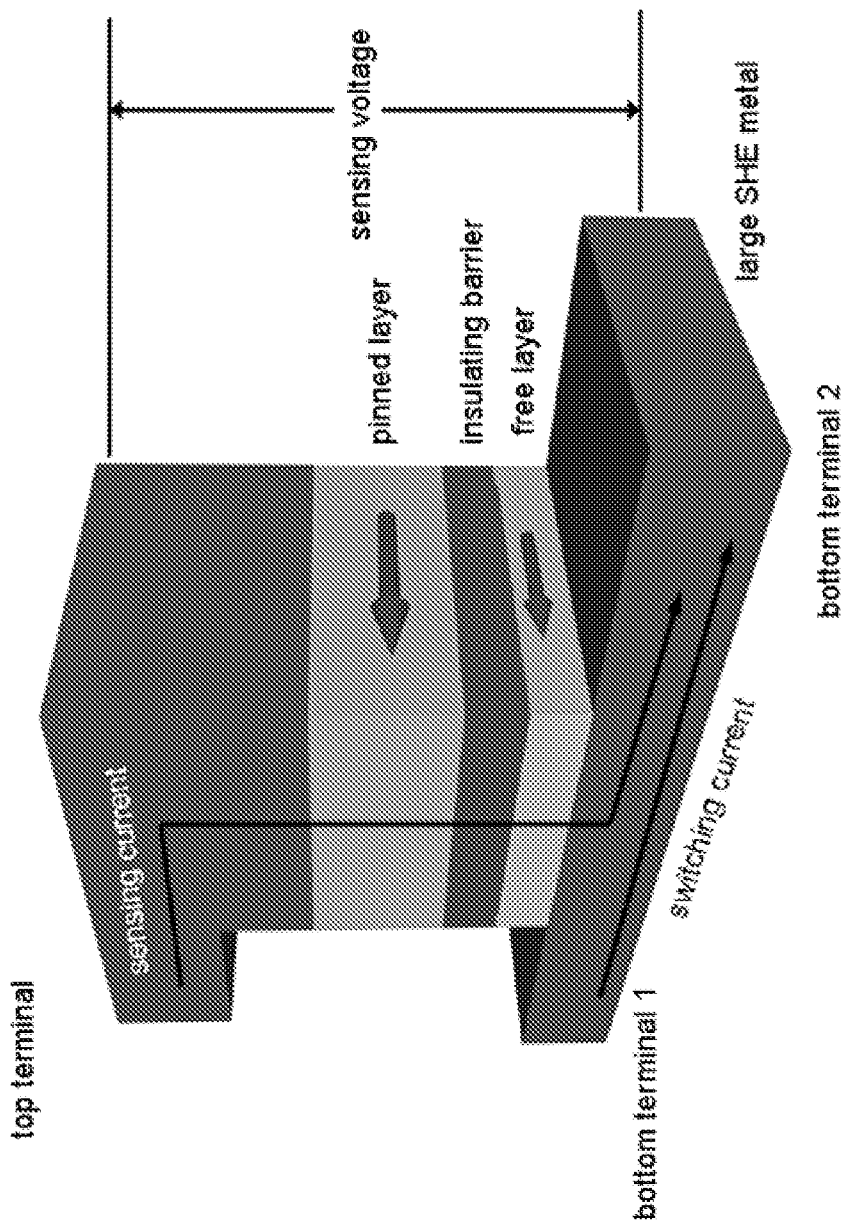
FIG. 16A shows an example of a schematic perspective-view diagram illustrating a three terminal ST-MRAM device cell that employs the spin Hall effect (SHE) and a gate voltage across the MTJ for a writing operation where the ST-MRAM cell is comprised of a magnetic tunnel junction having in-plane magnetic layers and a SHE conductive strip located on the bottom of the STT-MRAM device structure.
Figure 16B:
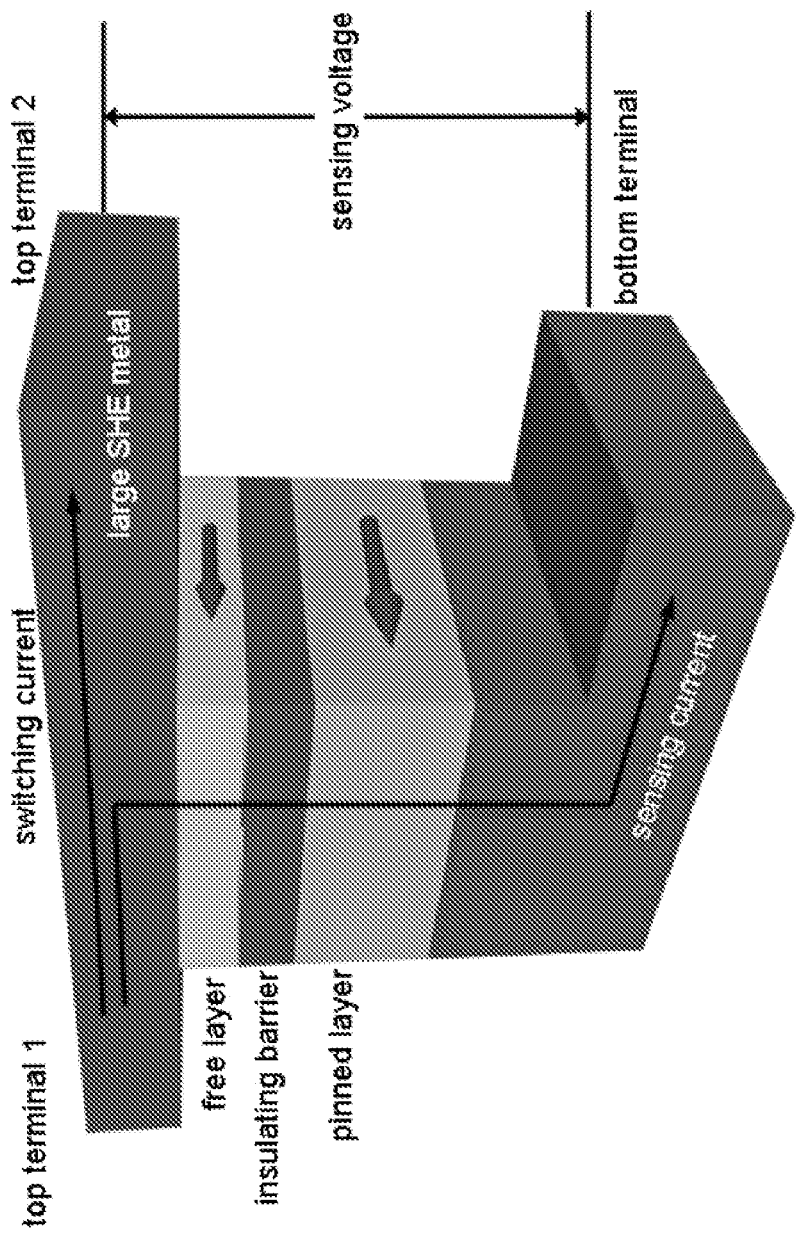
FIG. 16B shows another example of a three terminal ST-MRAM device cell that employs the spin Hall effect (SHE) and a gate voltage across the MTJ for a writing operation, where the magnetic tunnel junction has in-plane magnetic layers and the SHE conductive strip is located on the top of the STT-MRAM device structure.

FIG. 16A shows an example of a schematic perspective-view diagram illustrating a three terminal ST-MRAM device cell that employs the spin Hall effect (SHE) and a gate voltage across the MTJ for a writing operation where the ST-MRAM cell is comprised of a magnetic tunnel junction having in-plane magnetic layers and a non-magnetic strip with a strong SHE and the non-magnetic strip is located on the bottom of the STT-MRAM device structure. FIG. 16B shows another example of a three terminal ST-MRAM device cell that employs the spin Hall effect (SHE) and a gate voltage across the MTJ for a writing operation, where the magnetic tunnel junction has in-plane magnetic layers and the non-magnetic strip with the strong SHE is located on the top of the STT-MRAM device structure.

The SHE and VCMA can also be combined to yield gate controlled SHE switching of the FL in a MTJ in the case where the magnetic moments $\overline{m}_1$ and $\overline{m}_2$ of the free layer and reference layer of the MTJ are oriented perpendicular to the plane of the films. In this configuration, the in-plane components of injected spins from the SHE $\vec{\sigma}$ are still along +/−x-axis in the plane of MTJ layers while the equilibrium position for $\overline{m}_1$ is aligned along the +/−z axis perpendicular to the MTJ layers. So, the direction of $\overline{m}_1$ and that of $\vec{\sigma}$ are perpendicular to each other. In this situation the effect of the spin torque from the spin current generated by the SHE can be described using an effective magnetic field $H_{ST}$.

Figure 17A:
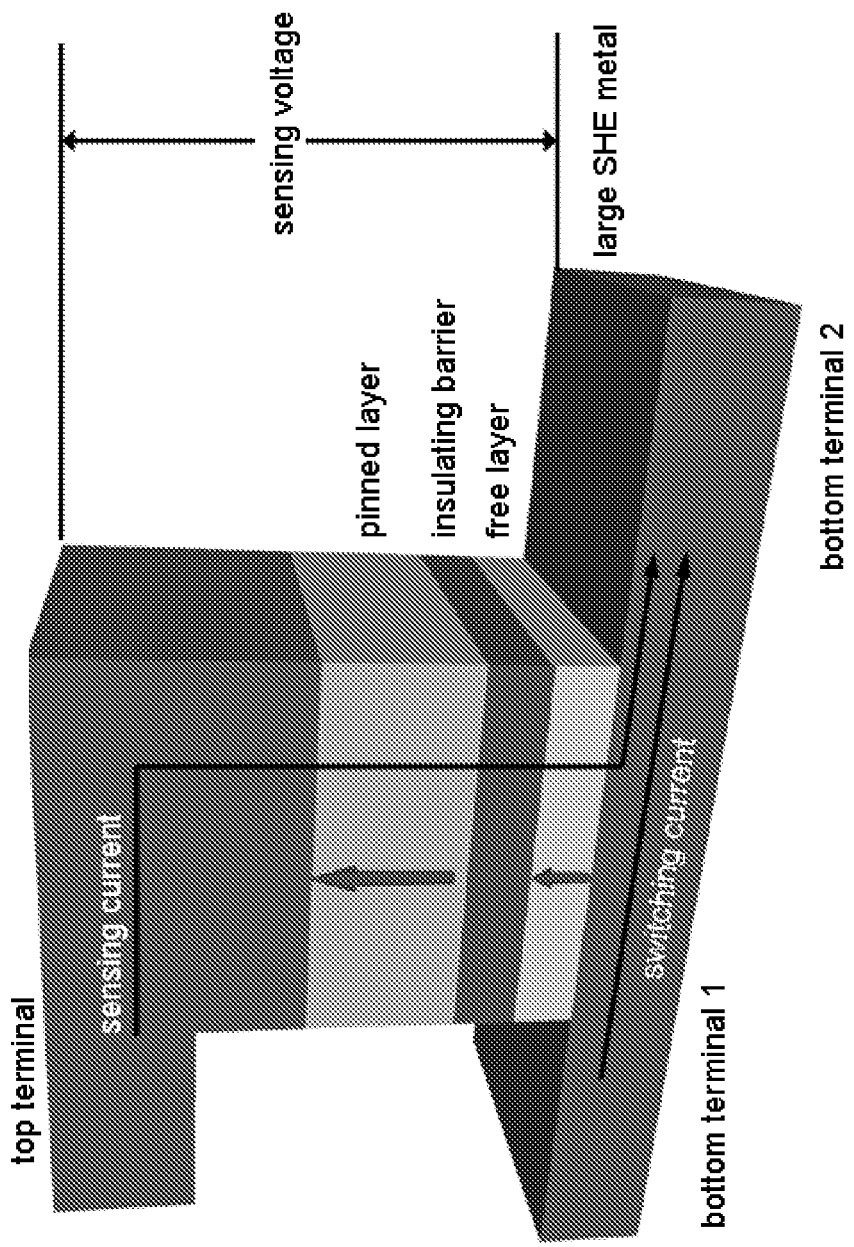
FIG. 17A shows an example of a three terminal ST-MRAM device cell that employs the spin Hall effect (SHE) and a gate voltage across the MTJ for a writing operation, where the equilibrium positions of the magnetic moments of the FL and PL are perpendicular to the film plane.

FIG. 17A shows an example of a three terminal ST-MRAM device cell that employs the spin Hall effect (SHE) and a gate voltage across the MTJ for a writing operation, where the equilibrium positions of the magnetic moments of the FL and PL are perpendicular to the film plane.

Figure 17B:
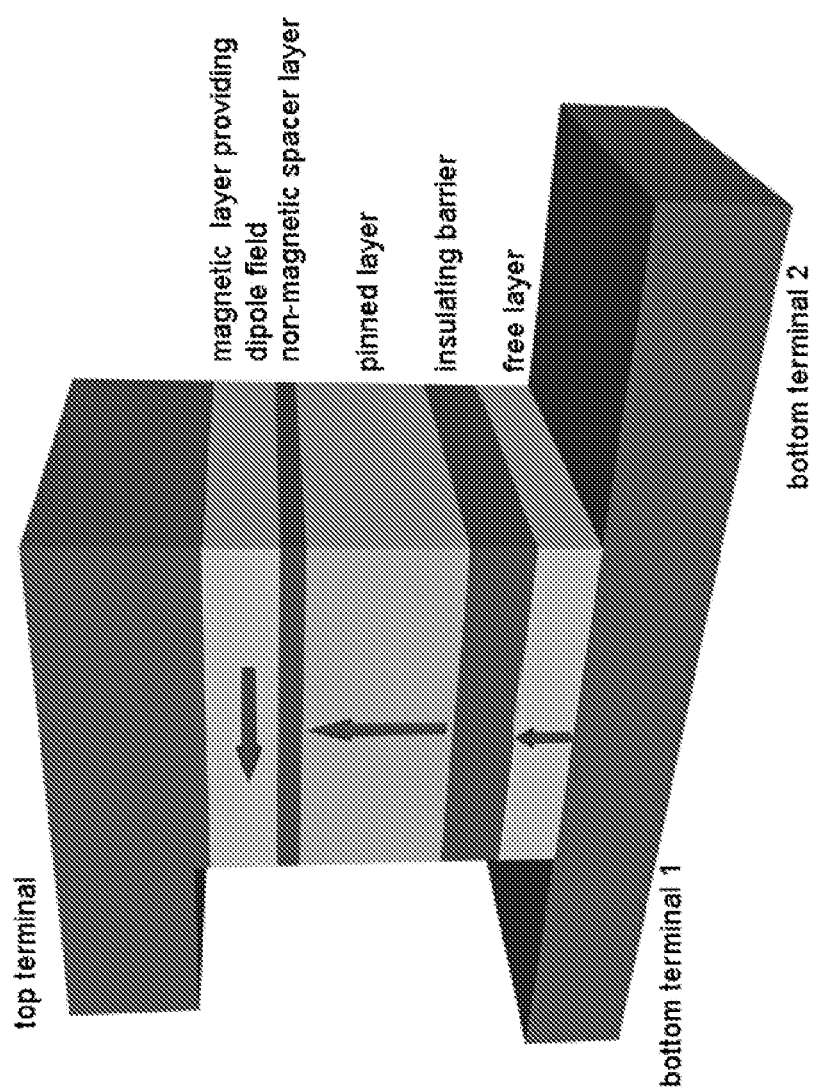
FIG. 17B shows an example of a three terminal ST-MRAM device cell that employs the spin Hall effect (SHE) and a gate voltage across the MTJ for a writing operation, where the equilibrium positions of the magnetic moments of the FL and PL are perpendicular to the film plane, and an additional in-plane magnetized ferromagnetic material layer is provided in the MTJ stack to produce an in-plane magnetic bias field for defining a definite switching direction for the perpendicular magnetization of the free magnetic layer. This in-plane magnetized ferromagnetic material layer in the MTJ stack (e.g., between the first electrical terminal and the spin Hall effect metal layer as shown) eliminates a separate magnetic mechanism to produce the magnetic bias field at the free magnetic layer. A non-magnetic spacer layer can be provided to be in contact with the pinned magnetic layer, and the magnetic layer is in contact with the non-magnetic spacer layer and configured to have a magnetization direction in the magnetic layer to produce the bias magnetic field in the free magnetic layer.

FIG. 17B shows an example of a three terminal ST-MRAM device cell that employs the spin Hall effect (SHE) and a gate voltage across the MTJ for a writing operation, where the equilibrium positions of the magnetic moments of the FL and PL are perpendicular to the film plane, and an additional in-plane magnetized ferromagnetic material layer is provided in the MTJ stack to produce an in-plane magnetic bias field for defining a definite switching direction for the perpendicular magnetization of the free magnetic layer.

The above design in FIG. 17B is explained below. The 3-terminal SHE switching results demonstrate that a spin Hall effect can be very effective in switching the free layer of a magnetic tunnel junction without any substantial part of the switching current required to flow through the MTJ, which solves a major reliability issue associated with conventional 2-terminal ST-MRAM devices. Moreover, the current required for switching the FL from being parallel (P) to being antiparallel (AP) to the PL is essentially the same as is required for switching in the opposite direction, AP to P, and of course the electrical impedance for the write operation is the same for both switching directions. This feature is in sharp contrast to the case of the 2-terminal MTJ spin torque device where the switching currents are quite different for the two switching directions, and the electrical impedance at the beginning of the write operation is also quite different for the two switching directions. These symmetric characteristics of the write operation in a 3-terminal SHE switched MTJ memory cell provide advantages for the design of magnetic memory circuits.

When achieving the SHE induced switching with $\vec{m}_1$ and $\vec{m}_2$ oriented perpendicular to the substrate plane as in FIG. 17B, the in-plane spin polarization components of injected spins from the SHE $\vec{\sigma}$ are along +/−x-axis in the substrate plane while the equilibrium position for $\vec{m}_1$ is aligned along the +/−z axis that is perpendicular to the substrate plane. So, the direction of $\vec{m}_1$ and that of $\vec{\sigma}$ are perpendicular to each other and effect of the injected spins is no longer equivalent to an effective damping. Instead the effect of the spin torque can be described using an effective magnetic field $B_{ST}$. The spin torque per unit moment generated by injected spin current can be written as $$\vec{\tau}_{ST} = \frac{\hbar}{2eM_S t} J_S (\hat{m} \times \hat{\sigma} \times \hat{m})$$

where $\hbar$, e, $M_S$ and t represent the Planck's constant, electron charge, saturation magnetization of the FL and the thickness of the FL, respectively, and $J_S$ is the spin current injected into the FL from the SHE. Meanwhile, the torque generated by a magnetic field in general can be written as $\vec{\tau} = \hat{m} \times \vec{B}$. By comparing the form of the two torques, the effective magnetic field induced by the spin Hall effect has the form $$\vec{B}_{ST} = -\frac{\hbar}{2eM_S t} J_S \hat{\sigma} \times \hat{m}.$$

Therefore, $\vec{B}_{ST}$ is always perpendicular to $\vec{m}_1$ and points clockwise or counterclockwise, depending upon the direction of the injected spins. FIG. 17C gives an illustration on the direction of $\vec{B}_{ST}$ when the injected spin $\vec{\sigma}$ is along the −x direction. If $J_S$ is large enough such that $|\vec{B}_{ST}|>0.5 B_{an}^0$, where $B_{an}^0$ is the maximum anisotropy field that the magnetic film can provide, then $\vec{B}_{ST}$ will induce a continuous rotation of $\vec{m}_1$. In a multi-domain ferromagnetic layer, where the coercive field of the magnetic film $B_c$ is smaller than $B_{an}^0$, the corresponding requirement on $\vec{B}_{ST}$ can be loosened to approximately $|\vec{B}_{ST}|>0.5 B_c$. Under the effect of $\vec{B}_{ST}$, $\vec{m}_1$ will be switched continuously, without a deterministic final state. So an external magnetic field has to be introduced in order to get a deterministic switching. In FIG. 17D, an external field in the +y direction is applied as an example. Using $m_z$ to represent the z component of $\vec{m}_1$, it can be seen that the state with $m_z>0$ will become a stable state because $\vec{B}_{ST}$ and $\vec{B}_{ext}$ can be balanced out with each other while $m_z<0$ states are still non-stable because $\vec{B}_{ST}$ and $\vec{B}_{ext}$ works in the same direction, causing $\vec{m}_1$ to continue to rotate. Therefore, under an applied field in the +y direction, spins injected in the −x direction can switch $\vec{m}_1$ into the $m_z>0$ state. By reversing the writing current direction, spins from the SHE will be injected along +x direction, causing $\vec{m}_1$ to be switched into the $m_z<0$ state. In conclusion, by using spins injected from the SHE, a reversible deterministic switching can be realized. The role of the external magnetic field $\vec{B}_{ext}$ is to break the symmetry of the system and to get a definite final state. The magnitude of this field can be as small as a few milli-Tesla (mT) as is demonstrated in the experiment. In one test using the spin current from the SHE to switch the magnetic moment at room temperature, the sample was formed by a 20 um wide, 2 nm thick Pt strip and a 0.7 nm Co magnetic layer in contact with the Pt strip, which has a perpendicular magnetic anisotropy, 1.6 nm of Al is utilized as the capping layer to protect the Co from oxidation by the atmosphere. The anomalous Hall effect is used to monitor the magnetization orientation of the Co layer. Under an external field of +10 mT, the magnetic moment of Co layer can be switched back and forth with opposite applied current. In the device configuration for an MRAM cells, in order to provide the required external field along the current flowing direction, an in-plane magnetized fixed magnetic layer of a few nanometers thickness can be added onto the top of the MTJ. The dipole field generated by this in-plane magnetic layer will give the current induced-switching a deterministic final state. Other configurations of ferromagnetic thin films can also be employed to generate this small external in-plane magnetic field.

Embodiments of the above new 3-terminal MTJ device configuration can be used to solve the reliability challenges that presently limit applications based on various two-terminal MTJ devices while also giving improved output signals. This new 3-terminal MTJ device configuration can also provide the added advantage of a separation between the low-impedance switching (write) process and high-impedance sensing (read) process in MTJ memory devices. More specifically, the devices and methods discloses here combine the spin Hall effect (SHE) with the voltage control of the magnetic anisotropy (VCMA) of nanoscale magnetic elements to enable the electrically gated switching of the magnetic orientation of a bi-stable magnetic element in a magnetic tunnel junction, and the electrical tuning of the oscillation frequency and output power of a spin torque nano-oscillator (STNO). This 3-terminal MTJ design enables more efficient and effective designs of magnetic random access memory circuits and of high performance non-volatile logic circuits, and a new 3-terminal approach to STNO's that provides separate, independent control of the oscillation microwave amplitude and frequency.

In implementations, the materials of the MTJ layers suitable for the disclosed 3-terminal MTJ devices are selected to form a magnetic tunnel junction that exhibits a strong voltage-controlled magnetic anisotropy (VCMA) effect, with its free layer located adjacent to a non-magnetic metallic strip composed of a material having a strong spin Hall effect (SHE) that can carry current flowing in the film plane. In some implementations, the magnetic tunnel junction is comprised of two ferromagnetic thin film elements separated by a thin, less than 2.0 nm thick, insulating layer, typically MgO or some other insulator material, that serves as a tunnel barrier through which electrons can tunnel by a quantum mechanical process. One of the ferromagnetic elements, the pinned layer (PL), which may or may not consist of multiple layers of thin film material, has a fixed magnetization direction, and the other ferromagnetic layer, the free layer (FL), which may or may not consist of multiple layers of thin film material, is free to rotate under the influence of a strong enough spin current or applied magnetic field. Depending on whether the magnetization of the FL is aligned, as result of the action of a spin current, more or less parallel or anti-parallel to the magnetization direction of the PL, the resistance of the MTJ is either in its low resistance state (parallel) or high resistance state (anti-parallel). The MTJ is fabricated to have a magnetoresistance change of 10% or more.

The material composition of the insulating layer and the adjacent FL surface are also chosen such that the electronic interface between the two results in a substantial interfacial magnetic anisotropy energy that alters the perpendicular magnetic anisotropy of the FL. Appropriate combinations of material include, but are not limited to, MgO for the insulating layer and for the interfacial surface layer of the FL, Co, Fe, and alloys with Co and/or Fe components. The interfacial electronic structure is such that an electric field that is produced by the application of a voltage bias across the insulator layer can substantially modify the interfacial magnetic anisotropy energy, resulting in a voltage controlled magnetic anisotropy (VCMA) of the FL. In some MTJ device implementations, changes in the interfacial magnetization energy per unit electric field of 25 µJ/m$^2$ (V/nm)$^{-1}$ or greater can effectuate the necessary change in magnetic anisotropy.

In making the 3-terminal MTJs, the magnetic tunnel junction is fabricated such that its free layer is adjacent to and in good electrical contact with a thin film strip composed of a material that has a high spin Hall angle, e.g., greater than 0.05, as a spin Hall effect (SHE) metal layer to generated a spin-polarized current. For example, in implementations, this SHE metal layer can have a thickness that is less than or no more than approximately five times its spin diffusion length to maintain sufficient spin population in a particular spin state in the generated spin-polarized current at the interface with the free magnetic layer of the MTJ. An electrical current passing through this SHE metal thin film strip can provide, via the spin Hall effect, a transverse spin current that will exert spin torque on the MTJ FL that is sufficient to either efficiently reverse its magnetic orientation, depending on the direction of current flow through the spin Hall layer, or alternatively to excite it into persistent microwave oscillation, while a bias voltage across the MTJ is employed to modify the magnetic anisotropy and/or coercive field of the FL via the VCMA effect. This combination achieves new spin-transfer-torque device functionalities: gate-voltage-modulated spin torque switching and gate-voltage-modulated spin torque oscillation. The former makes possible energy-efficient and gate controlled switching for non-volatile digital logic application, and more energy-efficient and improved architectures for non-volatile digital memory applications, including a simple approach for implementing magnetic memory circuits with a maximum-density cross-point geometry that does not require a control transistor for every MTJ. The latter provides separate, independent control of the microwave oscillation amplitude and frequency of a spin torque nano-oscillator.

Referring to the 3-terminal MTJ device examples herein, a 3-terminal MTJ device can be configured to include a magnetic tunneling junction (MTJ) that includes (1) a pinned magnetic layer having a fixed magnetization direction, (2) a free magnetic layer having a magnetization direction that is changeable, and (3) a non-magnetic junction layer between the magnetic free layer and the pinned magnetic layer and formed of an insulator material sufficiently thin to allow tunneling of electrons between the magnetic free layer and the pinned magnetic layer, and a spin Hall effect metal layer that includes a metal exhibiting a large spin Hall effect to react to a charge current directed into the spin Hall effect metal layer to produce a spin-polarized current that is perpendicular to the charge current, the spin Hall effect metal layer being parallel to and in contact with the free magnetic layer to direct the spin-polarized current generated in the spin Hall effect metal layer into the free magnetic layer. For the gated modulation operation, the 3-terminal MTJ device also includes a first electrical terminal in electrical contact with the MTJ from a side having the pinned magnetic layer to receive a gate voltage that modifies a current threshold of a spin-polarized current flowing across the MTJ for switching the magnetization of the free magnetic layer, and second and third electrical terminals in electrical contact with two contact locations of the spin Hall effect metal layer on two opposite sides of the free magnetic layer to supply the charge current in the spin Hall effect metal layer. A control circuit is coupled to the first, second and third electrical terminals to supply (1) the charge current via the second and third electrical terminals in the spin Hall effect metal layer and (2) the gate voltage across the MTJ causing a small current tunneling across the MTJ that is insufficient to switch the magnetization of the free magnetic layer without collaboration of the spin-polarized current flowing across the free magnetic layer caused by the charge current.

For memory applications, the control circuit in the 3-terminal MTJ device can be specifically configured to be operable in a writing mode to simultaneously apply the charge current in the spin Hall effect metal layer and the gate voltage across the MTJ to set or switch the magnetization direction of the free magnetic layer to a desired direction for representing a stored bit, and, in a read mode, the control circuit is operable to apply a read voltage to the first electrical terminal to supply a read current tunneling across the MTJ between the first electrical terminal and the spin Hall effect metal layer, without switching the magnetization direction of the free magnetic layer, to sense the magnetization direction of the free magnetic layer that represents the stored bit in the MTJ.

Referring to FIGS. 16A and 16B, the SHE is employed as the writing mechanism and a magnetic tunnel junction (MTJ) is employed both to apply the gate voltage that modulates the magnetic orientation of the free layer (FL) during the application of the spin torque effect by the SHE generated spin current, and to sense the magnetic orientation of the bistable free layer relative to that of the fixed reference layer (RL). The MTJ can be a pillar-shaped magnetic device with the lateral dimension generally in the sub-micron or nanometer range. The free ferromagnetic layer with the magnetic moment is made of soft ferromagnetic material with small to medium coercive field. The pinned ferromagnetic layer with magnetic moment is made of soft or hard ferromagnetic material with large coercive field or pinned by additional antiferromagnetic layers. Typical thickness for the free and pinned magnetic layers range from less than one nanometer to a few tens of nanometers. The FL and the PL are separated by a crystalline insulating spacer layer, less than 2 nm in thickness, such as MgO or boron doped MgO (Mg(B)O) or any other crystalline or amorphous insulator layer that generates an interfacial magnetic anisotropy energy density per unit area of contact with the surface of the ferromagnetic free layer that substantially affects the overall magnetic anisotropy of the FL. This magnetic anisotropy energy density can be substantially modified by electric fields applied across the insulator-FL interface. Examples of suitable materials for the magnetic layer may include (but are not limited to) Fe, Co, Ni, alloys of these elements, such as $Ni_{1-x}Fe_x$, alloys of these elements with non-magnetic material, such as $Fe_{1-x}Pt_x$ and $Co_xFe_yB_{1-(x+y)}$, and ferromagnetic multilayers made from those materials, such as $(Co/Ni)_n$, $(Co/Pt)_n$, and $(Co/Pd)_n$ where n represents the repeat number of the multilayer. The materials for the MTJ structures are selected so that there be a substantial interfacial magnetic anisotropy energy density per unit area of contact between the surface of the ferromagnetic free layer that is in contact with the insulator layer and that this anisotropy vary significantly with the voltage that is applied between a ferromagnetic reference layer on one side of the insulator and the free layer on the other side. Variation is the strength of this applied voltage varies the electric field at the insulator-free layer interface and hence modifies the interfacial magnetic anisotropy experienced by the FL.

In contact with the FL of the magnetic tunnel junction is a non-magnetic thin-film strip made of one of a variety of materials that exhibit a strong spin Hall effect (SHE). Examples of suitable materials for this layer include high resistivity Ta (beta-Ta), W (beta-W), Hf and Ir layers. Other suitable materials for the SHE layer include (but are not limited to) Pt, Pd, Nb, Mo, Ru, Re, Os, Ir, Au, Tl, Pb, Bi as well as the alloys based upon those transition metals such as $Cu_{1-x}Bi_x$, $Ag_{1-x}Bi_x$, $Cu_{1-x}Ir_x$, $Ag_{1-x}Ir_x$, $Cu_{1-x}W_x$, $Ag_{1-x}W_x$, $Cu_{1-x}Ta_x$, $Ag_{1-x}Ta_x$, $Hf_xIr_y$ and high resistivity intermetallic compounds that incorporate one or more elements with high atomic number, such as compounds with the A15 crystal structure such as $Ta_3Al$, $Nb_3Sn$, $W_3Ge$, $Ir_3Hf$ and other compounds such as TaN, WN and NbN. The non-magnetic SHE strip is patterned into a nanometer scale or micrometer scale width and has a thickness that is less than or approximately equal to five times its spin diffusion length.

In the examples in FIGS. 16A and 16B, three terminals are formed where electrical connections are made to the device. One terminal is on the pillar, close to the PL of the MTJ, and the other two terminals are the two ends of the non-magnetic strip. Writing current is applied between the two terminals on the non-magnetic strip while a bias voltage is applied between the terminal on the pillar and either one of the two terminals on the non-magnetic strip to effect the gating of the switching of the FL magnetization or alternatively to modulate the oscillator frequency in a spin torque nano-oscillation implementation. To read the binary state of the device for a logic gate or memory device implementation, a bias current is applied between the terminal on the pillar and either one of the two terminals on the non-magnetic strip.

In FIGS. 16A and 16B, the FL of the MTJ can be either at the bottom of the pillar, as shown in FIG. 16A, or on the top of the pillar as illustrated in FIG. 16B. In either case the non-magnetic strip with the strong SHE is always adjacent to the FL. When the FL is at the bottom, the non-magnetic strip is also at the bottom of the device, next to the substrate. When the FL is on the top, the PL is placed on the substrate side of the tunnel barrier, the FL is above the tunnel barrier, and the non-magnetic strip is located on the top of the device.

The following describes the VCMA effect by considering, as an example, only the in-plane spin polarization component of the injected spin-polarized current from SHE.

When the FL and RL are polarized in plane in a 3-terminal MTJ device, and with their in-plane magnetization direction perpendicular to the current direction mentioned above (i.e. along +/− x axis direction), $\overline{m}_1$ is collinear (either parallel or anti-parallel) with the injected spins from the SHE $\vec{\sigma}$. In this case, the injected spins from the SHE act as an effective magnetic damping which depending upon the orientation of the spin can be of either sign, i.e. either positive or negative damping. Under this configuration, the SHE induced switching works in the same way as the conventional spin torque induced switching. Conventional spin torque switching employs a pair of ferromagnetic layers separated by a non-magnetic spacer layer, with one ferromagnetic layer being the fixed, polarizer layer, and the other ferromagnetic layer being the free layer whose magnetic moment orientation can be switched by the transfer of spin torque from the polarized current. One difference is that, the spin current in the spin Hall effect device is generated using a non-magnetic material instead of a ferromagnetic polarizer layer. When $\overline{m}_1$ is parallel with $\vec{\sigma}$, the spin current will make the current magnetization orientation more stable, and will not cause switching. Otherwise, when $\overline{m}_1$ is antiparallel with $\vec{\sigma}$, if the spin current is large enough, the magnetization of FL will be switched. Therefore, currents with opposite signs inject spins with an opposite orientation into the FL, and those opposite orientations will result in different preferable orientations of the FL magnetization, so a reversible deterministic switching can be realized by determining the direction of the electrical current through the SHE generating layer.

The result of this combining the spin torque exerted by the spin Hall effect with the voltage-controlled magnetic anisotropy (VCMA) effect is that, in the absence of thermal fluctuations, the critical or threshold current density required to flow through the lateral spin Hall layer to cause spin torque switching of an in-plane polarized magnetic free layer by the spin Hall effect depends on the effective perpendicular demagnetization field $H_{demag}^{eff}$ of the free layer as $$|J_{c0}| \approx \frac{2eM_S t_{free}\alpha}{\hbar\theta_{SH}}(H_c + 0.5 H_{demag}^{eff}). \quad (1)$$

As result of the VCMA effect $H_{demag}^{eff}$ is variable as a function of the voltage $V_{MTJ}$ applied across the MTJ:

$$H_{demag}^{eff} = 4\pi M_S - 2K_u(V_{MTJ})/M_S. \quad (2)$$

where e is the electron charge, $M_S$ is the saturation magnetization of the CoFeB free layer, $t_{free}$ is its thickness and a the value of its Gilbert damping, $H_c$ is its within-plane magnetic anisotropy field, and $K_u(V_{MTJ})$ is the voltage-dependent perpendicular anisotropy energy coefficient of the free layer. Thus, as indicated by Equations (1) and (2), the critical current density that is required to flow through the SHE layer to effect the switching of the FL of the MTJ can be modulated by applying a gating voltage to the MTJ. In an implementation of this device by the current inventors $d(H_{demag}^{eff})/dV_{MTJ}=730\pm90$ Oe/V was achieved, corresponding to a change in demagnetization energy per unit electric field $d(K_u t)/dE|=[M_S t_{free} t_{MgO}/2]d(H_{demag}^{eff})/dV=70$ µJ/m² (V/nm)$^{-1}$. Values for the modulation of the magnetic anisotropy by the applied electric field that are as much as a factor of 3 lower than 70 µJ/m² (V/nm)$^{-1}$, and values that are higher than this can also be effective in this invention.

For digital logic and gated memory embodiments, the VCMA is configured to be capable of changing the probability of SHE spin torque switching of the MTJ free layer fully between 0% and 100% for a given level of applied current through the spin Hall layer. For long pulse lengths, e.g., greater than 10 ns, and at room temperature and above, thermal activation of the FL can contribute substantially to its reversal. The energy barrier E that the thermal activation energy has to overcome scales directly with the in-plane coercive field $H_c$ of the free layer if the FL is magnetized in plane. Since $H_c$ can depend on the out-of-plane magnetic anisotropy of the FL this means that the gate voltage can act to modulate the spin Hall torque switching current via its effects on both the zero-fluctuation critical current density $|J_{c0}|$ and the activation barrier E. However, for most applications, switching is driven by spin Hall current pulses in a short duration (e.g., less than 10 ns or 20 ns) for which thermal activation provides little assistance, although it does result in a probabilistic distribution of switching current density about $|J_{c0}|$. Therefore, in this short pulse regime, the gate voltage can effectively modulate the switching current density through its influence on $|J_{c0}|$ alone. For example, an optimized value of the effective perpendicular magnetic anisotropy of the free layer would be $H_{demag}^{eff} \approx 1$ kOe, while $d(H_{demag}^{eff})/dV_{MTJ} \approx 700$ Oe/V has been established as a typical value of the VCMA effect in, for example, a CoFeB/MgO/CoFeB magnetic tunnel junction. Also $H_c$ can be readily adjusted so that it is large enough to maintain the thermal stability of the free layer but Hc is much less than the perpendicular demagnetization field $H_{demag}^{eff}$. Using the typical parameter values $M_S$=1100 emu/cm$^3$, $t_{free}$=1.5 nm, $\alpha$=0.021, and $\theta_{SH}$=0.15, Eq. (2) yield $|J_{c0}|$=9.6×10$^6$ A/cm$^2$ for $V_{MTJ}$=500 mV and $|J_{c0}|$=4.5×10$^6$ A/cm$^2$ for $V_{MTJ}$=−500 mV. This variation of a factor of two in $|J_{c0}|$ is larger than the typical width of the thermal distribution for the switching current density in spin torque devices, so that the effect of the voltage-controlled anisotropy on $J_{c0}$ is sufficient to achieve full modulation of short-pulse, ≤20 nanosecond, spin Hall torque switching of the F1 in optimized spin Hall spin torque devices.

Figure 18A:
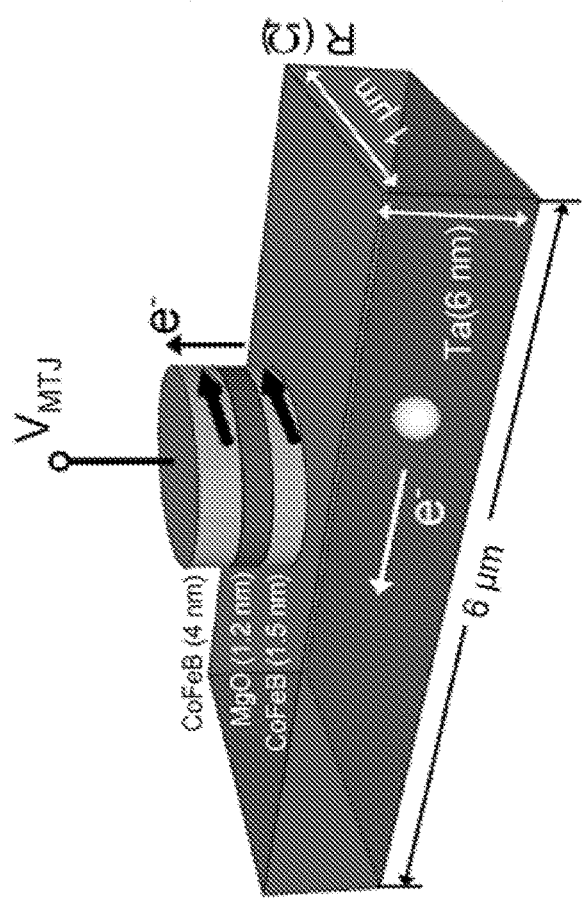
FIG. 18A shows an example 3-terminal MTJ device for demonstrating the capability of the effect of voltage control of the magnetic anisotropy (VCMA) to modulate the spin Hall torque switching of the FL of the MTJ.
Figures 18B, 18C:
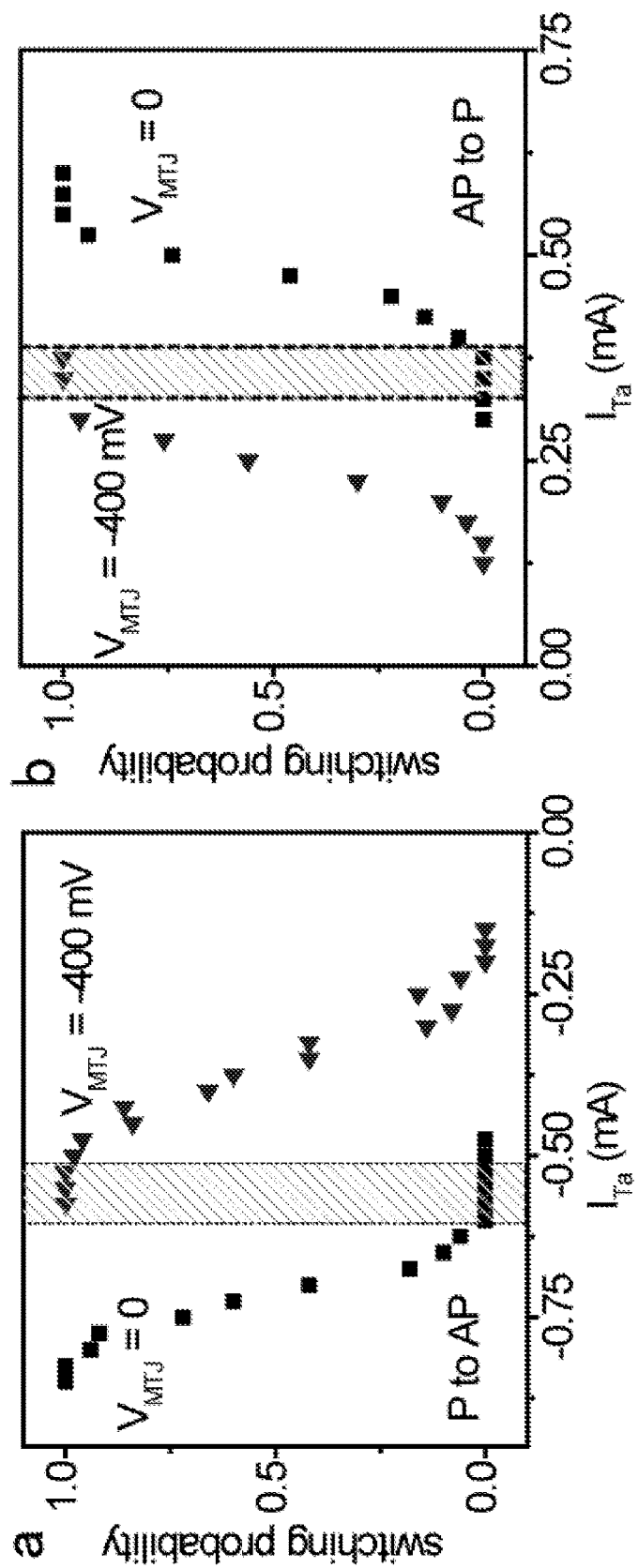
FIGS. 18B and 18C illustrate operation of a bias voltage, $V_{MTJ}$, applied across the tunnel junction terminals in a 3-terminal SHE device to substantially alter the current $I_{Ta}$ required through the spin Hall layer to effect either parallel to anti-parallel (P to AP) switching (FIG. 18A) or anti-parallel to parallel (AP to P) switching (FIG. 18B), where the shaded areas indicate the current range in which the ON state ($V_{MTJ}=-400$ mV) and the OFF state ($V_{MTJ}=0$ mV) alter the switching probability from 100% to zero.
Figure 18D:
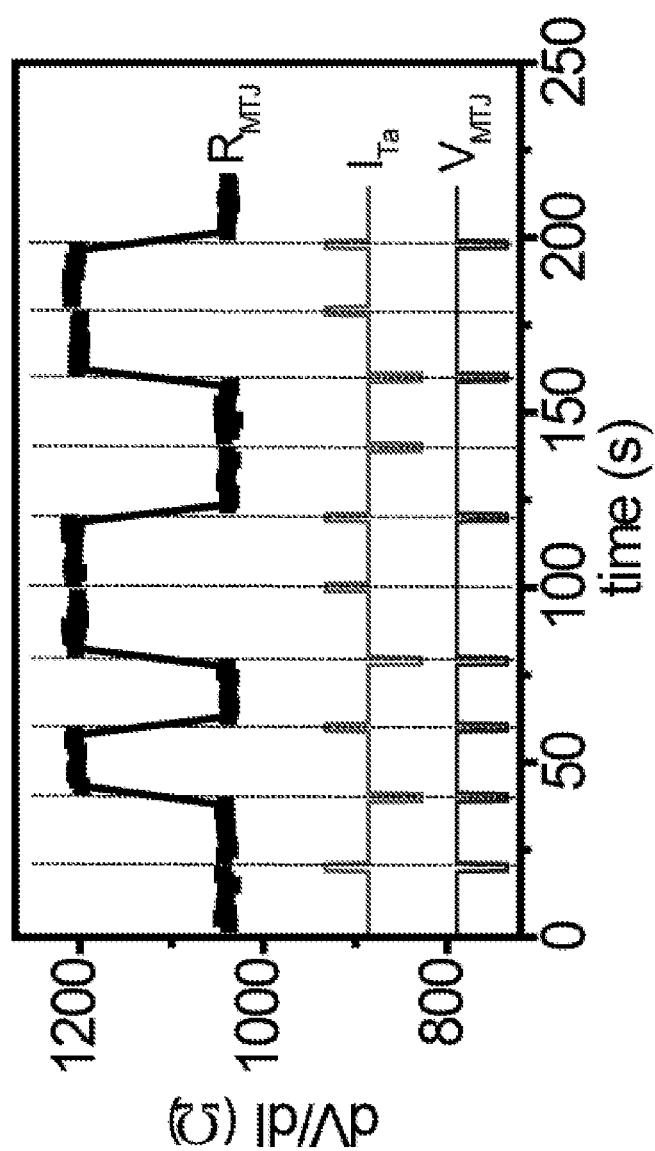
FIG. 18D illustrates gated spin Hall torque switching under a series of 10 μs pulses, where $R_{MTJ}$ is the resistance of the MTJ (data state). To achieve the gated switching to the high resistance state, $V_{MTJ}$ is switched between 0 mV and −400 mV, while the spin Hall current $I_{Ta}$ is switched between 0 mA and −0.55 mA. To achieve the gate switching to the low resistance state, $V_{MTJ}$ is switched between 0 mV and −400 mV, while the spin Hall current $I_{Ta}$ is switched between 0 mA and 0.35 mA. Switching does not occur unless the $V_{MTJ}=-400$ mV pulse is applied.

As part of the testing, a sample 3-terminal MTJ device was fabricated using a 6 nm thick, 1 μm wide Ta strip as the SHE metal layer and a MTJ stack of Co$_{40}$Fe$_{40}$B$_{20}$(1.5)/MgO (1.2)/Co$_{40}$Fe$_{40}$B$_{20}$(4) (thicknesses in nanometers) on top of the Ta SHE metal layer (FIG. 18A). The MTJ stack is shaped to be an approximately elliptical cross section of 100×350 nm$^2$ with the long axis perpendicular to the Ta SHE strip. The sample MTJ device was tested to demonstrate the capability of the VCMA effect to modulate the spin Hall torque switching of the FL of the MTJ by using a long, pulse regime (~10 μs). The test results are shown in FIGS. 18B and 12C, using $V_{MTJ}$=0 and −400 mV. For both P-to-AP (FIG. 18B) and AP-to-P (FIG. 18C) switching there is a window of current amplitude for which the switching probability is 100% for $V_{MTJ}$=−400 mV and 0% for $V_{MTJ}$=0, so that $V_{MTJ}$ gates the switching process effectively. This is shown directly in FIG. 18D; a voltage $V_{MTJ}$=−400 mV puts the device in the ON state for switching by the spin Hall torque from the Ta, while $V_{MTJ}$=0 turns the switching OFF. FIG. 18D also demonstrates how this 3-terminal device achieves fundamental logic operations by combining spin Hall torque switching with the VCMA effect. More complicated logic functions can be obtained by combining more than one spin Hall torque/VCMA device.

To achieve a large spin Hall effect sufficient for efficient switching of either an in-plane or out-of-plane magnetized magnetic free layer requires the use of a thin film material comprised of one or more metallic atomic elements with a high atomic number, and one in which there a strong spin-orbit interaction between the conduction electrons and the metallic ions. Materials that are suitable for the disclosed 3-terminal MTJ devices include the high atomic number (Z) metallic elements Ta, W, Hf and Ir, all of which, in the appropriate atomic structural form, have spin Hall angles of greater than 0.08 and in some cases greater than 0.25. Alloys and intermetallic compounds of these elements and in combination with other high Z elements may also be used. However, a metal layer with a high atomic number is not in and of itself sufficient for effective use as the source of the spin current in this invention. In various implementations, the material is selected to have particular electronic properties and an optimal crystalline structure, including in relation to the properties and structure of the adjacent ferromagnetic layer on which the spin current generated by the spin Hall effect in the first layer acts to effect the magnetic switching or the excitation of that second, ferromagnetic layer.

First, the electronic properties of the spin Hall metal can be configured such that there is a high efficiency in the generation of a transverse spin current density by a longitudinal electronic current density with that conversion efficiency being quantified by what is known as the spin Hall angle which is defined as the ratio of the transverse spin conductivity to the longitudinal electronic conductivity, or equivalently the ratio of the generated transverse spin current density to applied longitudinal electrical current density. When a crystalline metal is employed and in the case where the spin Hall effect is intrinsic and arises from the spin-orbit interaction between the conduction electrons and the fixed ionic crystalline lattice structure, which then determines the transverse spin conductivity of the material, the electrical conductivity of the metal should be low so that the spin Hall angle, or efficiency of the generation of the transverse spin current, is high. In the instance, which can also be employed for this invention, where the spin Hall effect is not intrinsic but is determined by the spin-dependent scattering of the conduction electrons by impurities and crystalline defects, that spin-dependent scattering must be made strong by choice of the impurities or defects, relative to the any non-spin dependent scattering of the electrons.

Second, the spin relaxation length within the spin Hall metal is desired to be short, e.g., less than or equal to 1 nm up to approximately 5 nm. The thickness of the spin Hall layer, in order to optimize conversion efficiency, is no less than approximately one spin relaxation length and no more than approximately five times the spin relaxation length. The current required to effect the magnetic switching or excitation of the adjacent magnetic layer scales directly with the thickness of the spin Hall layer times the spin Hall angle of the material. Therefore to minimize the required switching current a thin spin Hall layer with a high spin Hall angle and a short spin diffusion length is optimal.

Third, the electronic structure of the spin Hall material and of the adjacent ferromagnetic material is selected such that a conduction electron from the spin Hall layer can pass readily across the interface into the ferromagnetic layer if the magnetic moment of the electron is aligned either parallel, or in some cases anti-parallel but usually parallel, to the orientation of the magnetization of the ferromagnetic layer and has a low probability of passing into the ferromagnetic layer if the electron's magnetic moment has the opposite orientation relative to that of the ferromagnetic layer's magnetization. In the case of a crystalline spin Hall material and a crystalline ferromagnetic layer the electronic band structures of the two materials must be such that the probability of electron transmission from the spin Hall material across the interface and into either the majority electron sub-band structure or the minority electron sub-band structure of the ferromagnetic layer is much greater in one case than the other. The band structure of the beta form of Ta, which is generally reported to have tetragonal crystalline symmetry, is sufficiently different from that of typical ferromagnetic materials, such as FeCo and NiFe alloys as to meet this requirement. This is also the case for the beta form of W, which is generally reported to have the A15 crystalline symmetry. For Hf, which can be found in multiple crystalline forms, including hexagonally close packed (hcp) and face-centered cubic (fcc) forms, the choice of the crystalline form relative to that of the composition and crystalline form of the ferromagnetic layer is critical to obtaining a combination with a high spin torque efficiency.

Fourth, in implementations where the incident spin current from the spin Hall layer excites and then reverses the orientation of the ferromagnetic layer by the exertion of an anti-damping spin torque, it is also required that the injection of spins from the magnetically processing ferromagnetic material during this excitation process back into the spin Hall material is minimized. This injection is known as spin pumping and is generally considered to depend on the probability of electronic transmission across the interface per unit area, where the transmission probability is dependent upon the spin orientation of the electron relative to that orientation of the magnetization direction of the ferromagnet. A high spin pumping rate acts to damp the magnetic excitation of the ferromagnet and hence leads to the undesirable requirement of a stronger incident spin current density to effect the magnetic switching. This spin pumping process is generally characterized by a parameter known as the interfacial spin-mixing conductance. For optimal performance this spin-mixing conductance should be minimized, well below that found in most conventional combinations of ferromagnetic materials and high atomic number spin Hall materials. For example the Co—Pt combination has a high spin mixing conductance, as does the combination of CoFe (or CoFeB) with alpha-W, that is W in the standard bcc crystalline form. However both beta-Ta and beta-W in combination with ferromagnetic layers such as CoFe, CoFeB and NiFe alloys exhibit a low spin-mixing conductance, which makes these combinations effective for the anti-damping switching embodiment of this invention.

A spin Hall material suitable for implementing the 3-terminal MTJ devices can be selected or designed to have a strong spin orbit interaction (with a high spin Hall angle and associated high spin current density generation efficiency), and a short spin relaxation length for efficient injection of the spin-polarized electrons or other charge particles into the FL from the SHE metal layer, (e.g., approximately 1 to 5 nm). Furthermore the interfacial electronic structures of the two materials are configured such that the incident spin current exerts a highly efficient spin torque on the ferromagnetic material, this depends on a strong difference in the spin dependent electron transmission probabilities of the interface. In some implementation, the 3-terminal MTJ devices can be configured to utilize anti-damping excitation of the ferromagnetic material to effect the switching the interfacial electronic properties so that the spin pumping efficiency, or equivalently that the spin mixing conductance, of the interface is quite low.

In addition, the insulating spacer layer for the 3-terminal MTJ devices can range in thickness, e.g., from less than 1 nm to greater than 2 nm in some implementations. The insulating spacer layer can be composed of polycrystalline MgO or mixed oxide such as $Mg_xB_yO_z$ of variable composition, or any other crystalline or amorphous insulator layer that results in a high tunneling magnetoresistance for currents flowing between the ferromagnetic reference layer and ferromagnetic free layer placed on the opposing sides of the insulating layer, and that also results in an interfacial magnetic anisotropy energy density per unit area of contact with the surface of the ferromagnetic free layer (FL) that substantially affects the overall magnetic anisotropy of that thin FL, and where this magnetic anisotropy energy density can be substantially modified by electric fields applied across the insulator-FL interface.

Some examples of the materials for the magnetic free layer may include (but are not limited to) Fe, Co, Ni, alloys of these elements, such as $Fe_{1-x}Co_x$, $Ni_{1-x}Fe_x$, alloys of these elements with non-magnetic material, such as $Fe_{1-x}Pt_x$ and $Co_xFe_yB_{1-(x+y)}$, and ferromagnetic multilayers made from those materials, such as $(Co/Ni)_n$, $(Co/Pt)_n$, and $(Co/Pd)_n$ where n represents the repeat number of the multilayer. Such materials should exhibit a substantial interfacial magnetic anisotropy energy density per unit area of contact between the surface of the ferromagnetic free layer that is in contact with the insulator layer. This interfacial anisotropy can vary significantly with the voltage that can be applied between a ferromagnetic reference layer on one side of the insulator and the free layer on the other side. Variation in the strength of this applied voltage changes the electric field at the insulator-free layer interface and hence modifies the interfacial magnetic anisotropy experienced by the FL.

The current that flows through the insulator layer of the magnetic tunnel junction during the electrically gated switching operation can be varied over a wide range by choice of the insulator material and its thickness. The tunneling resistance of such an insulator layer varies exponentially with its thickness, typically increasing by about one order of magnitude for a 0.2 to 0.3 nm increase in thickness, as in the case of an MgO insulator layer in an MTJ. Thus by using a relatively thick MgO layer (e.g., with a thickness of greater than 1.5 nm), for example, the tunnel current that flows through the insulator layer due to the voltage bias can be quite low during the gated spin Hall switching operation. This can reduce the energy required for the gate component of the switching operation to the level of that required to charge the voltage across the tunnel barrier which acts as a capacitor in this case. The voltage required to execute the gated response does vary linearly with insulator layer thickness, so that a thicker barrier does require a proportionately higher gate voltage to execute the gated response. Thus the insulator thickness should be typically kept to be ≤2 nm in some applications.

Alternatively, if the insulator layer is made thin, e.g., of the order of 1 nm, then the current that flows through the insulator layer when a voltage bias is applied to modulate the interfacial anisotropy of the free layer can be substantial. Depending on the relative orientation of the FL relative to the RF, and on the polarity of the voltage bias and hence the direction of the tunneling electron flow, this current can exert a spin torque on the FL that either aids or hinders the spin torque switching of the FL by a current that is also applied to flow through the adjacent spin Hall metal layer. This can add extra flexibility in designing the device for optimum switching performance and for also achieving maximum thermal stability in the absence of gated switching pulses. The insulator thickness should be thick enough such that the current that flows when a bias voltage that is required to be applied to read the magnetoresistive state of the MTJ during a read operation is not sufficient to independently effect a switching of the free layer due to the spin torque exerted by the tunnel junction, without the aid of any spin torque being generated by a bias current flowing through the spin Hall metal layer.

In addition to providing a new, basic element for high-performance non-volatile logic circuits, embodiments of the present 3-terminal MTJ designs enable improved circuit architectures for high-performance magnetic memory logic technologies. For example, this spin Hall torque/VCMA device can be employed to produce nonvolatile magnetic random access memory circuits in the maximum-density cross-point geometry shown schematically in FIG. 13A and FIG. 13B. A major challenge for the successful implementation of cross-point memories using conventional spin torque switching with 2-terminal magnetic tunnel junctions is the issue of current flow via sneak paths that leads to unintended switching events and increased power consumption during writing processes and decreased sensitivity during reading. In the circuit shown in FIGS. 13A and 13B, during the writing operation each memory cell can be addressed individually by applying a gate voltage to the MTJ from above while also applying a current through the SHE microstrip below to generate a spin Hall torque.

Figure 19:
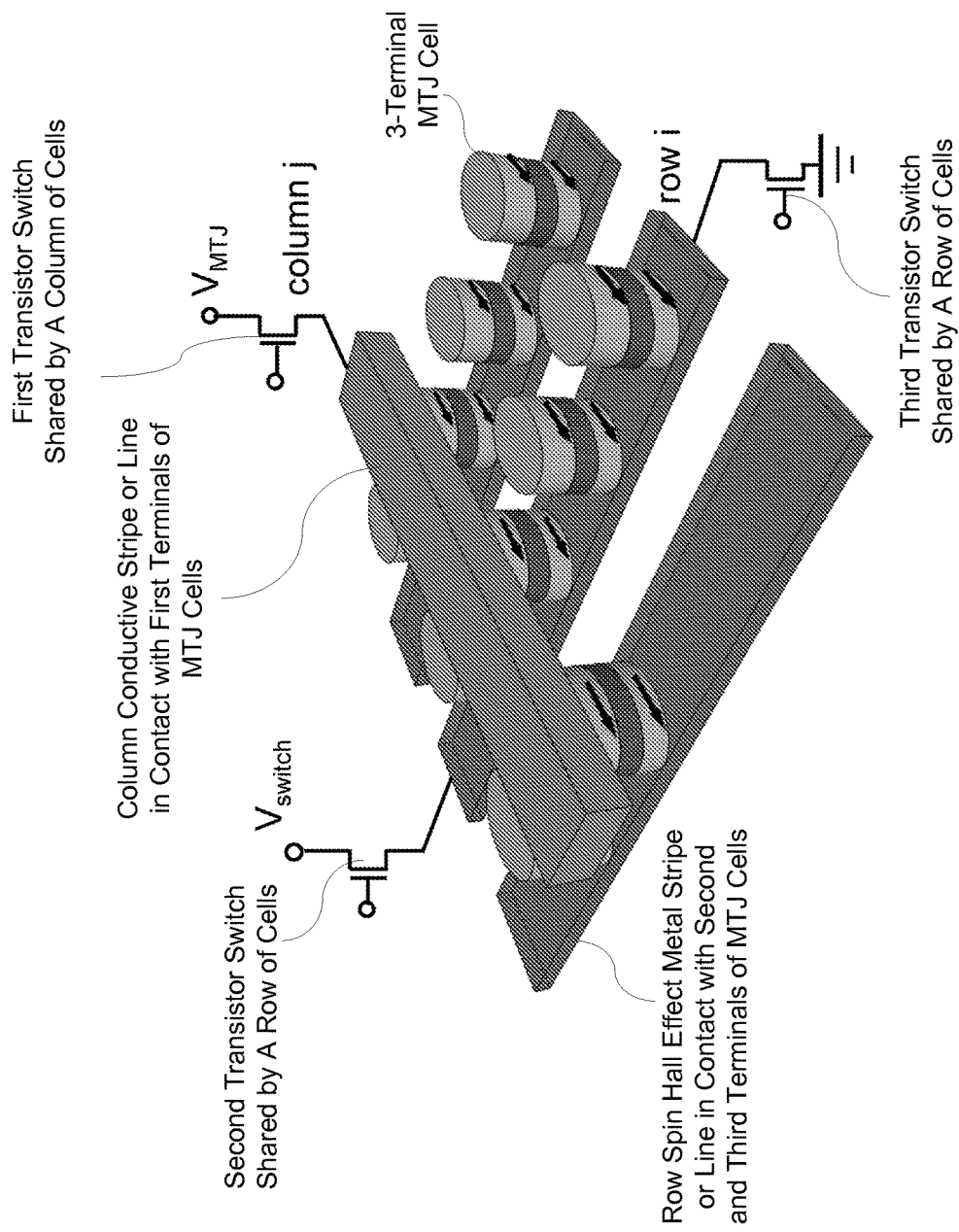
FIG. 19 provides an example of a cross-point memory architecture enabled by gated spin Hall torque switching for an array of 3-terminal memory cells based on coupling between MTJ and the spin Hall effect metal layer where transistor switches are shared and coupled to the three terminals of MTJ cells.

The device in FIG. 19 includes rows and columns of 3-terminal MTJ memory cells. Rows of spin Hall effect metal stripes are provided and each row spin Hall effect metal stripe is configured to be in contact with a row of memory cells as the spin Hall effect metal layer for each memory cell in the row of memory cells and is further coupled to the memory control circuit to carry a row charge current as the charge current for each memory cell in the row of memory cells. The device in FIG. 19 also includes columns of conductive stripes and each column conductive stripe is configured to be in contact with a column of memory cells respectively located in different rows of memory cells and further coupled to the memory control circuit to apply a row gate voltage as the gate voltage, or a row read voltage as the read voltage, for each memory cell in the column of memory cells. The memory control circuit includes first transistors coupled to the column conductive stripes, respectively, one first transistor per column conductive stripe to apply the row gate voltage or the row read voltage to the first electrical terminals of the memory cells; and second transistors coupled to the row spin Hall effect metal stripes, respectively, one second transistor per row spin Hall effect metal stripe to connect to the second electrical terminals to switch on or off the row charge current in the respective row spin Hall effect metal stripe as the charge current for each memory cell in a corresponding row of memory cells. In some implementations, the third electrical terminals are grounded. In the example in FIG. 14, this grounding is controlled by third transistors coupled to the row spin Hall effect metal stripes, respectively, one third transistor per row spin Hall effect metal stripe to connect between the third electrical terminals of memory cells in a corresponding row of memory cells and an electrical ground.

Figure 20:
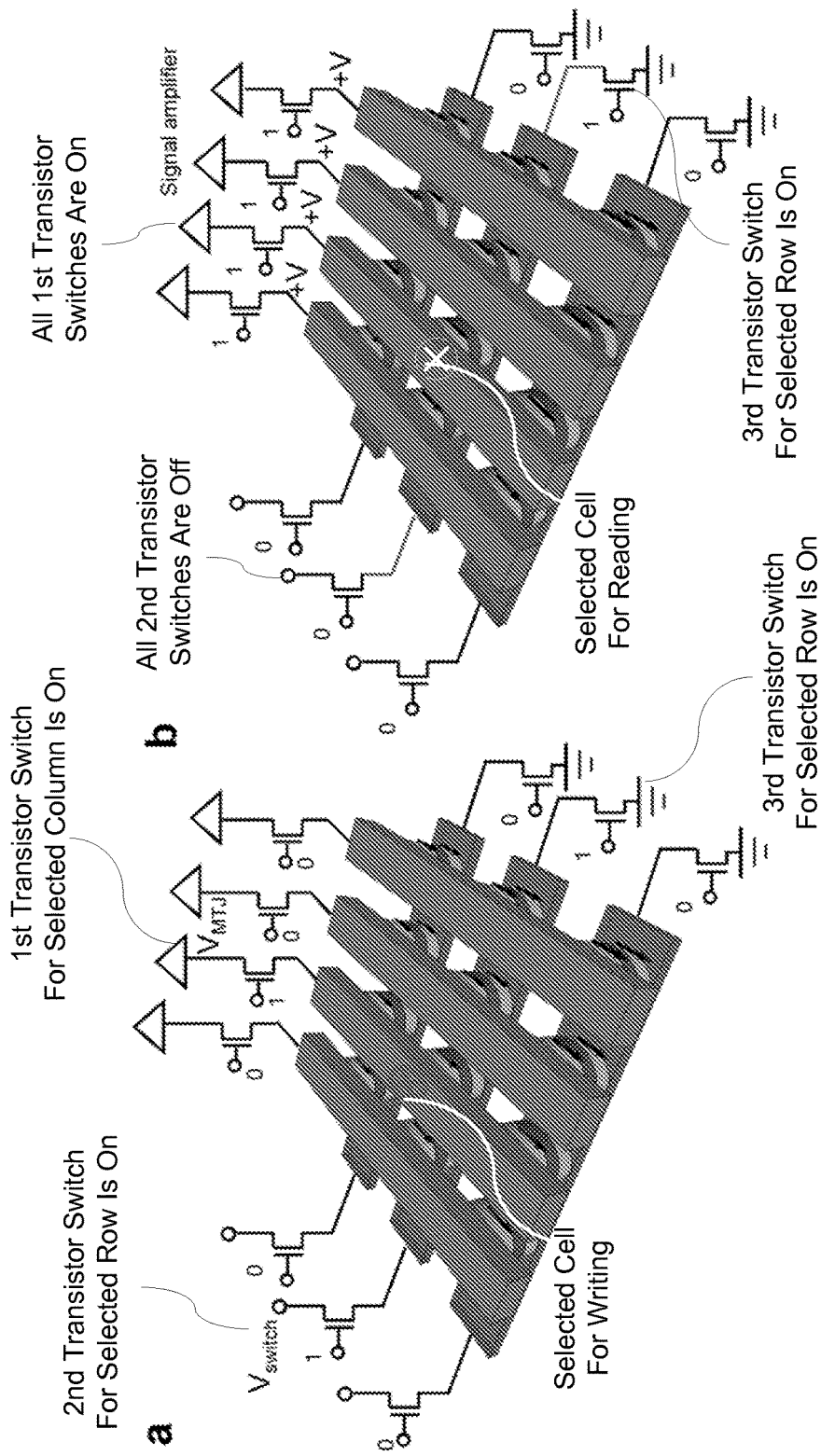
FIGS. 20A and 20B illustrates examples of transistor switch operation status for bias configurations that can be employed for the writing and reading operations in the gated spin Hall torque cross-point memory architecture in FIG. 19.

FIGS. 20A and 20B show examples of operations of the first, second and third transistors in FIG. 19 during writing and reading operations. More specifically as illustrated in FIG. 20A for the writing operation, the first transistor at the chosen column and the pair of the second and third transistors at the two ends of the chosen row are set to be ON while all of the other transistors are set to be OFF. $V_{switch}$ is chosen to be positive or negative depending on which final state is desired for the MTJ. Information is then written into the selected MTJ for the writing operation. MTJs with high impedance can be utilized such that $R_{MTJ}$, the impedance of the tunnel junction, is much greater than $R_{Ta}$, the resistance of the SHE strips. This condition effectively blocks all possible sneak paths for the writing current. For the reading operation shown in FIG. 20B, a parallel reading scheme can be employed to effectively ameliorate the effect of sneak currents. The second transistors for all of the columns and the third transistor at the right end of the chosen row are set to be ON. All of the other transistors are set to be OFF. Therefore, all of the column lines are set at the same read voltage level +V. Information is read in a parallel way from all the MTJs on the same row by measuring the currents flowing in the column lines.

The overall benefit of the cross-point architecture as illustrated in the examples in FIGS. 19, 20A and 20B is that whereas some 2-terminal spin-torque MRAM circuits require at least 1 transistor for every bit, the cross-point geometry for the present 3-terminal MTJ circuits can be made with only 1 transistor for every N bits in an array, thereby increasing the storage density significantly and reducing the complexity at the interface between the MTJs and the semiconductor (CMOS) circuit elements that provide the write signals and perform the read-out of the stored data.

Referring to FIGS. 17A and 17B where the magnetic layers of the MTJ are perpendicular the MTJ layers, the effect of the spin torque from the spin current generated by the SHE can be described using an effective magnetic field $H_{ST}$. The spin torque per unit moment generated by injected spin current can be written as $$\tau_{ST} = \frac{\hbar}{2eM_s t} J_s \hat{\sigma} \times \hat{m},$$

where $\hbar$, e, $M_S$ and t represent Planck's constant, electron charge, saturation magnetization of the FL and the thickness of the FL, respectively, and $J_S$ is the spin current injected into the FL from the SHE. Meanwhile, the torque generated by a magnetic field in general can be written as $\vec{\tau} = -\hat{m} \times \vec{H}$. By comparing the form of the two torques, the effective magnetic field induced by the spin Hall effect has the form $$\vec{H}_{ST} = -\frac{\hbar}{2eM_s t} J_s \hat{\sigma} \times \hat{m}.$$

Therefore, $\vec{H}_{ST}$ is perpendicular to $\overline{m}_1$ and points clockwise or counterclockwise, depending upon the direction of the injected spins. If $J_S$ is large enough such that $|\vec{H}_{ST}| > 0.5 H_{an}^{eff}$, where $H_{an}^0$ is the maximum anisotropy field that the magnetic film can provide, then $\vec{H}_{ST}$ will induce a continuous rotation of $\overline{m}_1$. Under the effect of $\vec{H}_{ST}$, $\overline{m}_1$ will be switched continuously, without a deterministic final state. To achieve deterministic switching an external in-plane magnetic field $\vec{H}_{ext}$ has to be introduced, which can be easily provided by the magnetic dipole field of a magnetic layer placed nearby. The external field can be generated by using one or more magnetic elements in the device in various configurations. In FIG. 6B, an external field in the +y direction is applied as an example. Using $m_z$ to represent the z component of $\overline{m}_1$, it can be seen that the state with $m_z > 0$ will become a stable state because $\vec{H}_{ST}$ and $\vec{H}_{ext}$ can be balanced out with each other while $m_z < 0$ states are still non-stable because $\vec{H}_{ST}$ and $\vec{H}_{ext}$ act in the same direction, causing to continue to rotate. Therefore, under an applied field in the +y direction, spins injected in the -x direction can switch $\overline{m}_1$ into the $m_z > 0$ state. By reversing the writing current direction, spins from the SHE will be injected along +x direction, causing $\overline{m}_1$ to be switched into the $m_z < 0$ state. By using spins injected from the SHE, reversible deterministic switching is realized.

The current through the SHE layer that is required to effect the deterministic switching of the FL scales linearly with the effective perpendicular magnetic anisotropy field $H_{demag}^{eff}$ of the FL for the case where the FL and RL are polarized perpendicular to the plane. If $H_{demag}^{eff}$ is adjusted to be, for example, ~1000 Oe or less, which is readily achievable through choice of the FL material, its thickness and careful thermal annealing strong gating of the SHE switching current can be readily obtainable with SHE/VCMA that incorporate MTJ's that have a VCMA of the order of $d(H_{demag}^{eff})/dV_{MTJ} \approx 700$ Oe/V, as has been experimentally demonstrated (see FIG. 7C).

Another application of the present 3-terminal MTJ device design for combining spin Hall torque with voltage controlled magnetic anisotropy is to employ these effects to achieve new, independent control of the frequency and amplitude of output power of a spin torque nano-oscillator (STNO). Such a device for generating an oscillation signal based on a magnetic tunneling junction in a three-terminal circuit configuration can be configured to include a magnetic tunneling junction (MTJ) that includes (1) a pinned magnetic layer having a fixed magnetization direction in the pinned magnetic layer, (2) a free magnetic layer having a magnetization direction that is in the free magnetic layer and is changeable, and (3) a non-magnetic junction layer between the magnetic free layer and the pinned magnetic layer and formed of an insulator material sufficiently thin to allow tunneling of electrons between the magnetic free layer and the pinned magnetic layer. A spin Hall effect metal layer is provided to be nonmagnetic and includes a metal exhibiting a large spin Hall effect to react to a charge current directed into the spin Hall effect metal layer to produce a spin-polarized current that is perpendicular to the charge current. The spin Hall effect metal layer is parallel to and in contact with the free magnetic layer to direct the spin-polarized current generated in the spin Hall effect metal layer into the free magnetic layer. This device includes a first electrical terminal in electrical contact with the MTJ from a side having the pinned magnetic layer; and second and third electrical terminals in electrical contact with two contact locations of the spin Hall effect metal layer on two opposite sides of the free magnetic layer to supply the charge current in the spin Hall effect metal layer. An oscillator control circuit in this device is coupled to the first, second and third electrical terminals to supply (1) a constant current as the charge current via the second and third electrical terminals in the spin Hall effect metal layer to cause a precession of the magnetization of the free magnetic layer due to the spin-polarized current produced by the spin Hall effect metal layer, and (2) a MTJ junction current directed via the first electrical terminal across the MTJ to cause a current tunneling across the MTJ that oscillates due to the precession of the magnetization of the free magnetic layer. This control circuit is configured to adjust the MTJ junction current to control an oscillation frequency or an amplitude of the oscillation in the current tunneling across the MTJ.

Figure 21:
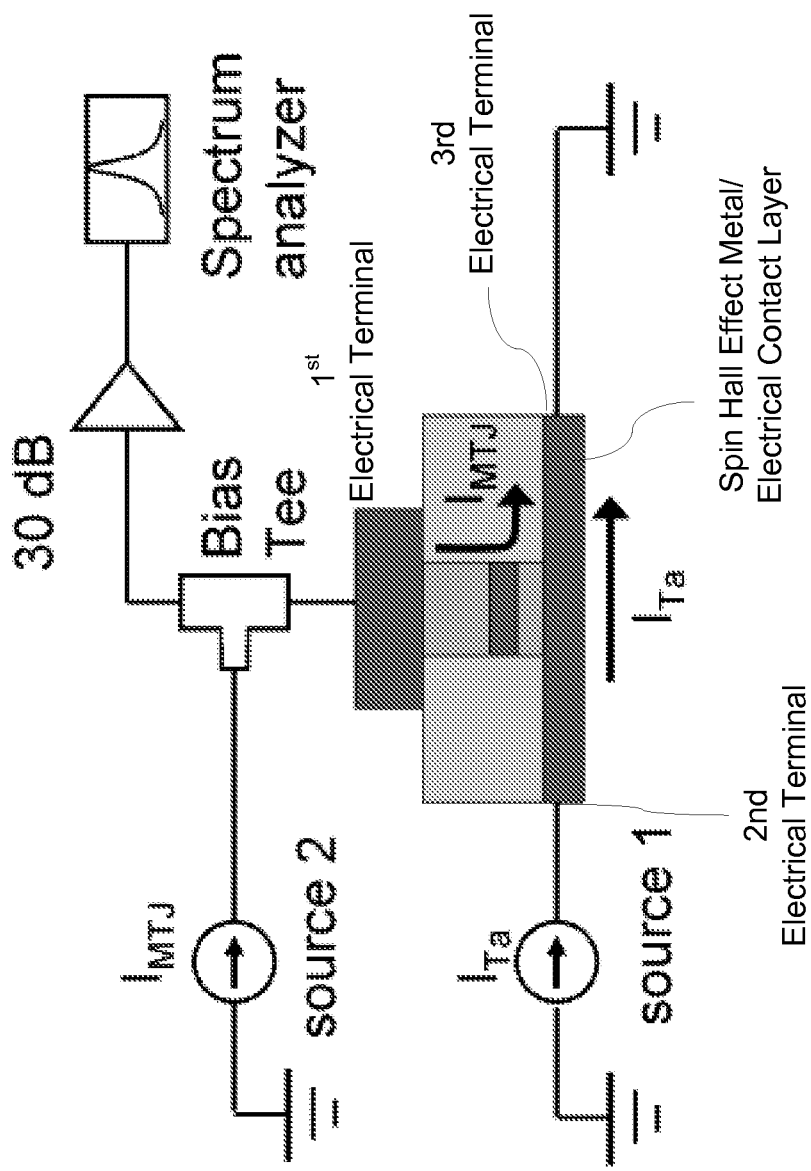
FIG. 21 illustrates an example of an oscillation circuit that can be used to excite magnetic oscillation in a 3-terminal SHE/VCMA device and output the associated microwave power to achieve spin torque nano-oscillator performance. The black arrows denote the current distribution inside the three terminal SHE device and the spin Hall current $I_{Ta}$ and the tunnel junction bias current $I_{MTJ}$ come from current source 1 and current source 2, respectively.

FIG. 21 shows an example of such an oscillator circuit for exciting and detecting the magnetic dynamics in the SHE device. Two DC current sources with common ground can be employed to separately apply current through the SHE strip and through the MTJ. The current through the SHE strip $I_{SHE}$ injects spin current into the magnetic free layer of the MTJ through the SHE and excites magnetic dynamics therein, while the MTJ bias current $I_{MTJ}$ converts the oscillations of the MTJ resistance $R_{rf}$ arising from the TMR into an oscillating voltage $V_{rf} = I_{MTJ} R_{rf}$ which can then be coupled to a microwave strip-line or antenna.

In comparison, a conventional 2-terminal MTJ STNO device would have to use the same two terminals to carry the same current as both (1) the driving current to excite the dynamics and (2) the sensing current to provide the output power. The 3-terminal SHE/VCMA device in FIG. 16 uses two separate currents for these functions, respectively, to provide better technical controls and operation advantages.

Figure 22:
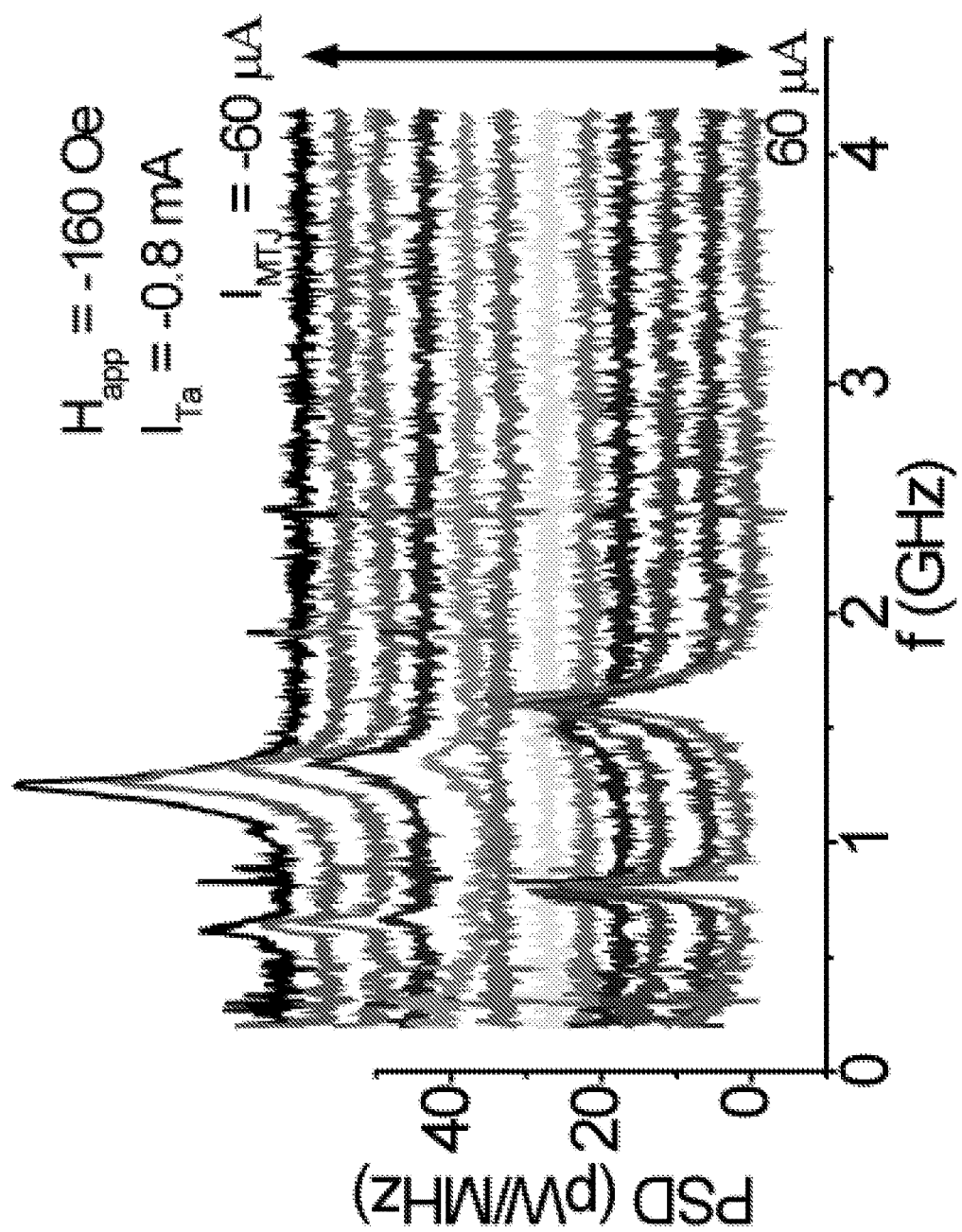
FIG. 22 shows the microwave spectra produced by a spin Hall torque excited FL in a magnetic tunnel junction when the MTJ bias current is $I_{MTJ}=60$ μA, and the spin Hall current in the spin Hall metal (Ta) strip is varied between $I_{Ta}=-0.8$ mA and +0.8 mA. The spectra under different currents are shifted vertically for the ease of comparison. The power spectrum density (PSD) is a measure of the output microwave power of the device.
Figures 23A, 23B:
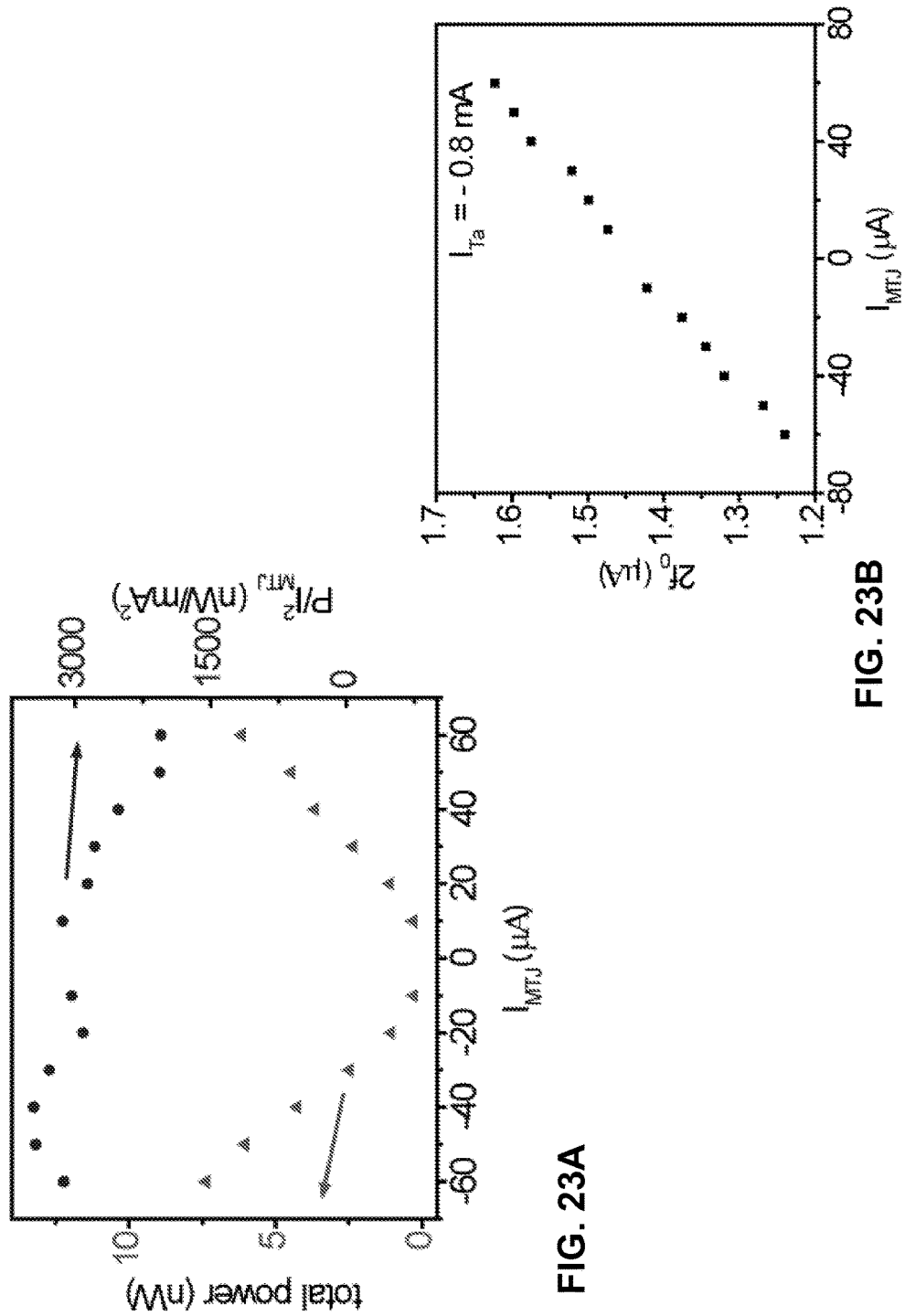
FIG. 23A shows the integrated output microwave power of a SHE driven spin torque nano-oscillator as indicated schematically in FIG. 21. The red triangles represent the microwave power versus the applied MTJ current. The blue circles represent the microwave power normalized by $I_{MTJ}^2$ and the magnetoresistance of the corresponding current.
FIG. 23B shows the center oscillation frequency of a SHE excited and VCMA tuned spin torque nano-oscillator in FIG. 21 as the function of the applied MTJ current.

FIG. 22 shows the microwave spectra obtained with a prototype SHE/VCMA STNO for different $I_{MTJ}$ while $I_{SHE}$ is held constant. Since the sensing current has little or no influence on the magnetic dynamics, unlike the case for conventional STNO's, the output power P scales as $I_{MTJ}^2$ as shown in FIG. 23A which displays the integrated power P (triangles) of the 3-terminal STNO prototype and its normalized power (circles) vs. $I_{MTJ}$, where $T(I_{MTJ})$ is the bias-dependent normalized TMR value of the MTJ. The normalized power is roughly constant with bias.

As illustrated in FIG. 23B, an important aspect of the behavior of this three-terminal STNO is a quite significant blue shift of the oscillator frequency as $I_{MTJ}$ is increased in the positive direction. This is quantitatively related to the perpendicular magnetic anisotropy change induced by the changes in the electric field across the MgO tunnel barrier as $I_{MTJ}$ is varied. Thus as demonstrated by FIGS. 23A and 23B, the 3-terminal STNO embodiment of the spin Hall effect in combination with voltage control magnetic anisotropy enables independent control of the magnetic dynamics and the output electric power of a spin torque nano-oscillator, therefore providing a greater and more versatile tuning of the frequency and variation of the amplitude of the output microwave signal.

In implementing 3-terminal MTJ devices based on two independent control mechanisms, it is desirable to produce a sufficiently large effective perpendicular demagnetization field $H_{demag}^{eff}$ of the free layer as indicated in Equations (1) and (2) to affect the critical or threshold spin-polarized current for switching the magnetization of the free magnetic layer. Various material combinations can be selected for the MTJ device, including proper transitional metal elements in desired crystalline phases. One technique for achieving a sufficiently large effective perpendicular demagnetization field $H_{demag}^{eff}$ of the free layer is to provide a thin transition metal layer between the free magnetic layer and the SHE metal layer as shown in the MTJ example in FIG. 24.

Figure 24:
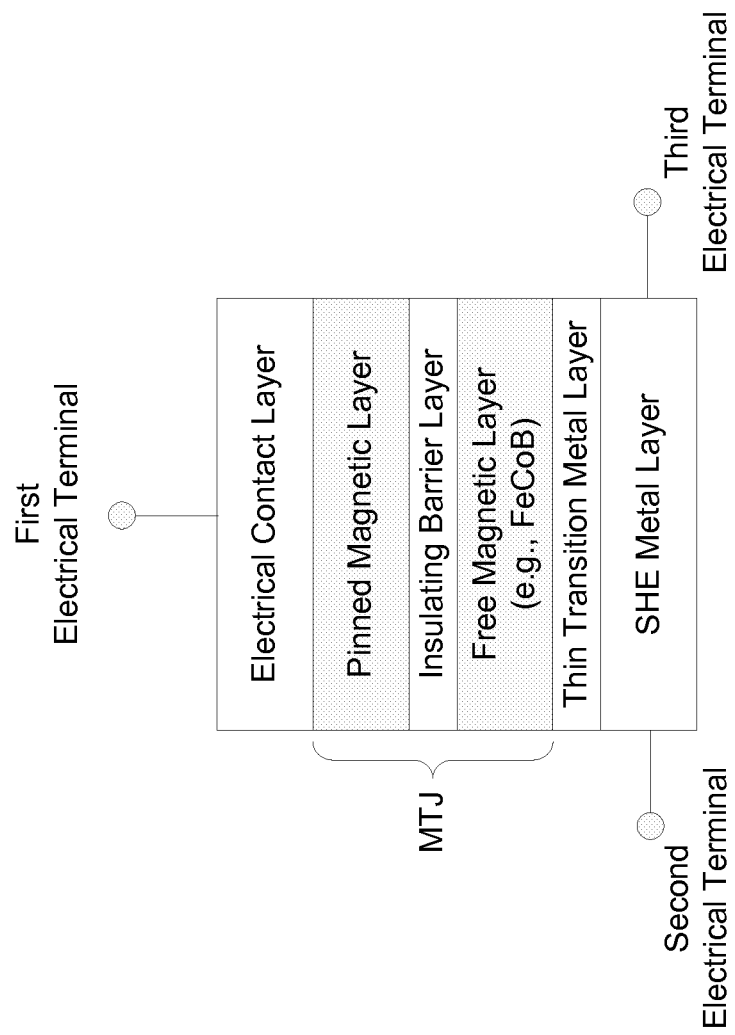
FIG. 24 shows an example of a 3-terminal MTJ device having a thin transition metal layer between the free magnetic layer and the SHE metal layer for enhancing the perpendicular magnetic anisotropy in the free magnetic layer.

In FIG. 24, the material and the thickness of the thin transition metal layer are selected with respect to the material configurations of the free magnetic layer and the SHE metal layer to enable the interfacing between the thin transition metal layer and free magnetic layer to produce a strong interfacial anisotropy, thus effectuating a contribution to the perpendicular demagnetization field $H_{demag}^{eff}$ of the free layer and enhancing the voltage-controlled magnetic anisotropy (VCMA) effect of the 3-terminal MTJ device. This thin transition metal layer may not exhibit a significant spin Hall effect and is provided between the free magnetic layer and the SHE metal layer as a mechanism to engineer an effective 3-terminal MTJ for dual controls based SHE and VCMA effects. The combined structure of the thin transition metal layer and the SHE metal layer can be treated as a composite SHE metal layer. As a specific example, a 3-terminal MTJ device based on an in-plane free magnetic layer having FeCoB was fabricated to include a layer of beta W (4 nm) as the SHE metal layer and a layer of Hf (1 nm) as the thin transition metal layer. Conducted measurements of this MTJ device show both strong SHE and VCMA effects. In addition, the thin transition metal layer between the free magnetic layer and the SHE metal layer in FIG. 24 can be used for enhancing the perpendicular anisotropy of the FL layer of MTJ devices where both the FL and PL layers have perpendicular magnetization directions as shown in FIGS. 17A and 17B.

In at least some of the above 3-terminal MTJ examples, the interface between the SHE metal layer and the free magnetic layer of the MTJ is electrically conductive due to the fact that the either the free layer in direct contact with the SHE metal layer or the thin transition metal layer in FIG. 24 is electrically conducting. Such configurations produce a shunt path so that the charge current that is supplied by the second and third terminals into the SHE metal layer is leaked into the shunt path. This leaking causes the actual charge current that stays within the SHE metal layer to reduce and this reduction, undesirably, reduces the spin-polarized current generated by the SHE effect. For 3-terminal MTJ devices that use SHE metal layers with high resistivity, this undesired leaking of the charge current can be significant. To ensure efficient generation of the spin-polarized current in the SHE metal layer, a thin magnetic insulator layer may be inserted between the MTJ stack and the SHE metal layer to prevent or reduce leaking of the charge current in the SHE metal layer into the MTJ stack. The thickness of the thin magnetic insulator layer is sufficiently small to allow tunneling of electrons since a sensing current needs to pass through the MTJ stack for various circuit operations, including read operations of a MTJ memory cell and generation of oscillation signals in STNO circuits described above. This thin magnetic insulator layer is a magnetic layer that reduces the relaxation effect on the spin-polarized current from the SHE metal layer generated from the spin Hall effect. This thin magnetic insulator layer can be a ferromagnetic or ferrimagnetic insulator layer. Various magnetic insulator materials can be used as the thin magnetic insulator layer, e.g., YIG (Yttrium Iron Garnet) and others.

While this patent document contain many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Only a few implementations and examples are described and other implementations, enhancements and variations can be made based on what is described and illustrated in this patent document.

What is claimed is what is described and illustrated, including:

1. A device based on a spin Hall effect (SHE) and spin transfer torque (STT) effect, comprising:
   a magnetic structure including a ferromagnetic layer having a magnetization direction that can be changed by spin transfer torque;
   a SHE layer that is electrically conducting and exhibits a spin Hall effect to, in response to an applied charge current, generate a spin-polarized current that is perpendicular to the applied charge current, the SHE layer located adjacent to the ferromagnetic layer to inject the spin-polarized current into the ferromagnetic layer; and
   a metal insertion layer in contact with and located between, the ferromagnetic layer and the SHE layer, through which the spin-polarized current generated by the SHE layer enters the ferromagnetic layer, the metal insertion layer having a thickness less than a spin diffusion length of the SHE layer and exhibiting an electrical resistivity greater than an electrical resistivity of the SHE layer to enhance a switching of the magnetization direction of the ferromagnetic layer by the spin transfer torque effect, wherein an interface of the metal insertion layer with the magnetic free layer has a spin mixing conductance that is greater than a conductance of the insertion layer.

2. The device as in claim 1, further comprising:
   a first electrical contact in contact with a first location of the SHE layer;
   a second electrical contact in contact with a second location of the SHE layer so that the first and second locations are on two opposite sides of the magnetic structure;
   a third electrical contact in contact with the magnetic structure;
   a magnetic structure circuit coupled between one of the first and second electrical contacts and the third electrical contact to supply a current or a voltage to the magnetic structure; and
   a charge current circuit coupled between the first and second electrical contacts to supply the charge current into the SHE layer.

3. A device based on a spin Hall effect (SHE) and spin transfer torque (STT) effect, comprising:
   a magnetic structure including a ferromagnetic layer having a magnetization direction that can be changed by spin transfer torque;
   a SHE layer that is electrically conducting and exhibits a spin Hall effect to, in response to an applied charge current, generate a spin-polarized current that is perpendicular to the applied charge current, the SHE layer located adjacent to the ferromagnetic layer to inject the spin-polarized current into the ferromagnetic layer; and
   a metal insertion layer in contact with and located between, the ferromagnetic layer and the SHE layer, through which the spin-polarized current generated by the SHE layer enters the ferromagnetic layer, the metal insertion layer having a thickness less than a spin diffusion length of the SHE layer and exhibiting an electrical resistivity greater than an electrical resistivity of the SHE layer to enhance a switching of the magnetization direction of the ferromagnetic layer by the spin transfer torque effect, wherein the SHE layer includes:
   a SHE metal material that exhibits a first resistivity without any doping or alloying; and
   a different metal element doped in or alloyed with the SHE metal material to cause the doped or alloyed SHE metal to exhibit a second resistivity higher than the first resistivity without degrading a spin Hall conductivity of the SHE metal material.

4. The device as in claim 2, wherein:
   the magnetic structure includes a magnetic tunneling junction (MTJ) which includes (1) the ferromagnetic layer as a free layer of the MTJ, (2) a pinned magnetic layer having a fixed magnetization direction and (3) a non-magnetic junction layer between the free layer and the pinned magnetic layer to allow tunneling of electrons between the free layer and the pinned magnetic layer;
   the charge current circuit is coupled to supply a constant current as the charge current via the first and second electrical contacts in the SHE layer to cause a precession of the magnetization of the free layer due to the spin-polarized current; and
   the magnetic structure circuit is coupled to supply a MTJ current across the MTJ to cause a current tunneling across the MTJ that oscillates due to the precession of the magnetization of the free magnetic layer, wherein magnetic structure circuit is configured to adjust the MTJ junction current to control an oscillation frequency or an amplitude of the oscillation in the current tunneling across the MTJ.

5. A device based on a spin Hall effect (SHE) and spin transfer torque (STT) effect, comprising:
a magnetic structure including a ferromagnetic layer having a magnetization direction that can be changed by spin transfer torque;
a SHE layer that is electrically conducting and exhibits a spin Hall effect to, in response to an applied charge current, generate a spin-polarized current that is perpendicular to the applied charge current, the SHE layer located adjacent to the ferromagnetic layer to inject the spin-polarized current into the ferromagnetic layer, wherein the SHE layer includes a SHE metal material that exhibits a first resistivity without any doping or alloying; and a different metal element doped in or alloyed with the SHE metal material to cause the doped or alloyed SHE metal to exhibit a second resistivity higher than the first resistivity without degrading a spin Hall conductivity of the SHE metal material;
a first electrical contact in contact with a first location of the SHE layer;
a second electrical contact in contact with a second location of the SHE layer so that the first and second locations are on two opposite sides of the magnetic structure;
a third electrical contact in contact with the magnetic structure;
a magnetic structure circuit coupled between one of the first and second electrical contacts and the third electrical contact to supply a small current across the ferromagnetic layer that co-propagates with the spin-polarized current and is insufficient to switch the magnetization of the ferromagnetic layer without the spin-polarized current and the small current and the spin-polarized current together are sufficient to switch the magnetization of the ferromagnetic layer; and
a charge current circuit coupled between the first and second electrical contacts to supply the charge current into the SHE layer,
wherein the different metal element doped or alloyed with the SHE metal material is selected so that the doped or alloyed SHE metal reduces a total power of the magnetic structure circuit magnetic structure circuit that is needed to switch the magnetization of the ferromagnetic layer when comparing a total power needed without the different metal element doped or alloyed with the SHE metal material.

6. The device as in claim 5, wherein:
the SHE metal material includes Pt, and
the different metal element doped or alloyed with Pt includes (1) Al, B or Si, or (2) Hf, Zr, Cr or Ta.

7. The device as in claim 5, wherein:
the magnetic structure includes a magnetic tunneling junction (MTJ) which includes (1) the ferromagnetic layer as a free layer of the MTJ, (2) a pinned magnetic layer having a fixed magnetization direction and (3) a non-magnetic junction layer between the free layer and the pinned magnetic layer to allow tunneling of electrons between the free layer and the pinned magnetic layer;
the third electrical terminal is in electrical contact with the MTJ from a side having the pinned magnetic layer to receive a gate voltage that modifies a current threshold of a spin-polarized current flowing across the MTJ for switching the magnetization of the free layer; and the magnetic structure circuit is coupled to supply (1) the gate voltage across the MTJ causing a small current tunneling across the MTJ that is insufficient to switch the magnetization of the free magnetic layer without the spin-polarized current,
wherein the magnetic structure circuit and the charge current circuit are operable to simultaneously apply the charge current in the SHE layer and the gate voltage across the MTJ to set or switch the magnetization direction of the free layer,
the charge current circuit is coupled to supply a constant current as the charge current via the first and second electrical contacts in the SHE layer to cause a precession of the magnetization of the free layer due to the spin-polarized current; and
the magnetic structure circuit is coupled to supply a MTJ current across the MTJ to cause a current tunneling across the MTJ that oscillates due to the precession of the magnetization of the free magnetic layer, wherein magnetic structure circuit is configured to adjust the MTJ junction current to control an oscillation frequency or an amplitude of the oscillation in the current tunneling across the MTJ.

8. A magnetic structure based on a spin Hall effect (SHE) and spin transfer torque (STT) effect, comprising:
a spin Hall effect base layer located over a substrate;
a thin high-resistivity normal metal insertion layer located over the substrate and contacting the spin Hall effect base layer; and
a magnetic free layer located over the substrate and contacting the thin insertion layer,
wherein the spin Hall effect base layer includes a non-magnetic conductor material that exhibits a spin Hall angle greater than about 0.05 and has a thickness no greater than about 5 times a spin diffusion length in the non-magnetic conductor material in the spin Hall base layer;
wherein the thin high-resistivity normal metal insertion layer includes an insertion layer non-magnetic metal layer having a thickness of at least one atomic layer thick but no thicker than the spin diffusion length; and
wherein an interface of the thin high-resistivity normal metal insertion layer with the magnetic free layer has a spin mixing conductance that is greater than the conductance of the insertion layer itself; and
wherein the thin high-resistivity normal metal insertion layer is configured to exhibit an electrical resistivity of about two times or more greater than an electrical resistivity of the spin Hall effect base layer.

9. The magnetic structure of claim 8, wherein the non-magnetic spin Hall conductor layer material includes Pt, Pd, Ta, W, Hf, Nb, Mo, Ru, Re, Os, Ir, Au, Tl, Pb, Bi, one or more alloys based upon Pt, Pd, Ta, W, Hf, Nb, Mo, Ru, Re, Os, Ir, Au, Tl, Pb, Bi, including $Cu_{1-x}Bi_x$, $Ag_{1-x}Bi_x$, $Ag_{1-x}Ir_x$, $Cu_{1-x}W_x$, $Ag_{1-x}W_x$, $Cu_{1-x}Ta_x$, $Ag_{1-x}Ta_x$, $Hf_xIr_y$ and intermetallic compounds that incorporate one or more elements with a high atomic number, such as compounds with the A15 crystal structure such as $Ta_3Al$, $Nb_3Sn$, $W_3Ge$, $Ir_3Hf$ or other compounds such as TaN, WN or NbN.

10. The magnetic structure of claim 8, wherein the spin Hall effect conductor layer comprises at least one rare earth element or an alloy or compound that includes a rare earth component, wherein the thin high-resistivity normal metal insertion layer comprises Hf, Ta, W, Nb, Mo, Ru, Re, Os, Ir, Au, Tl, Pb, Bi or one or more alloys and compounds where one or more of these transition metals is included as a component, and wherein the thin high-resistivity normal metal insertion layer comprises one rare earth element or an alloy or compound that includes a rare earth component.

11. The magnetic structure of claim 8, wherein the magnetic free layer includes one or more of Fe, Co, Ni, one or more alloys and compounds where one or more of these metallic elements is included as a component.

12. A magnetic structure based on a spin Hall effect (SHE) and spin transfer torque (STT) effect, comprising:
a magnetic metallic layer or ferromagnetic insulator layer located over a substrate; and
a spin Hall effect layer located adjacent to but not in direct contact with the magnetic layer; and
a thin high-resistivity normal metal insertion layer that is located between and contacting the spin Hall effect layer and the magnetic free layer; and
wherein the non-magnetic conductor material that comprises the spin Hall effect base layer includes:
a spin Hall angle greater than about 0.05; and
a thickness no greater than about 5 times a spin diffusion length in the non-magnetic conductor spin Hall base layer material; and
wherein the non-magnetic metal layer that comprises the thin insertion layer is at least one atomic layer thick but is no thicker than approximately its spin diffusion length;
wherein the interface of the insertion layer with the magnetic free layer has a spin mixing conductance that greater than the conductance of the insertion layer itself; and
wherein the electrical resistivity of the insertion layer is about two times or more greater than that of the spin Hall effect base layer.

13. A magnetic memory device based on a spin Hall effect (SHE) and spin transfer torque (STT) effect, comprising:
a free magnetic layer having a magnetization direction that is changeable;
a spin Hall effect layer comprising a first material having a first electrical resistivity, a first thickness, and having a relatively large spin Hall angle greater than 0.05, wherein the spin Hall effect layer is nonmagnetic and includes a metal exhibiting a large spin Hall effect to react to a charge current directed into the spin Hall effect layer to produce a spin-polarized current that is perpendicular to the charge current, the spin Hall effect layer being parallel to the free magnetic layer to direct the spin-polarized current generated in the spin Hall effect layer into the free magnetic layer; and
an insertion layer comprising a second material having a second electrical resistivity, a second thickness, and a conductance, wherein the insertion layer is nonmagnetic and coupled between the free magnetic layer and the spin Hall effect metal layer, and wherein a spin mixing conductance between the insertion layer and the free magnetic layer is greater that the conductance;
wherein the second thickness is at least one atomic layer thick, wherein the second thickness is less than the first thickness, and wherein the second electrical resistivity is at least twice the first electrical resistivity.

14. A magnetic structure based on a spin Hall effect (SHE) and spin transfer torque (STT) effect, comprising:
a free magnetic layer having a magnetization direction that is changeable;
a spin Hall effect layer comprising a first material having a first electrical resistivity, a first thickness, wherein the spin Hall effect layer is nonmagnetic and includes a metal exhibiting a large spin Hall effect to react to a charge current directed into the spin Hall effect layer to produce a spin-polarized current that is perpendicular to the charge current, the spin Hall effect layer being parallel to the free magnetic layer to direct the spin-polarized current generated in the spin Hall effect layer into the free magnetic layer; and
an insertion layer comprising a second material having a second electrical resistivity, a second thickness, and a conductance, wherein the insertion layer is nonmagnetic and coupled between the free magnetic layer and the spin Hall effect metal layer, and wherein a spin mixing conductance between the insertion layer and the free magnetic layer is greater than the conductance;
wherein the second thickness is at greatest a spin relaxation length of the second material, wherein the second electrical resistivity is at least twice the first electrical resistivity.

15. A magnetic structure based on a spin Hall effect (SHE) and spin transfer torque (STT) effect, comprising:
a magnetic tunneling junction (MTJ) that includes (1) a pinned magnetic layer having a fixed magnetization direction, (2) a free magnetic layer having a magnetization direction that is changeable, and (3) a non-magnetic junction layer between the magnetic free layer and the pinned magnetic layer and formed of an insulator material sufficiently thin to allow tunneling of electrons between the magnetic free layer and the pinned magnetic layer;
a spin Hall effect metal layer that is nonmagnetic and includes a metal exhibiting a large spin Hall effect to react to a charge current directed into the spin Hall effect metal layer to produce a spin-polarized current that is perpendicular to the charge current, the spin Hall effect metal layer being parallel to and in contact with the free magnetic layer to direct the spin-polarized current generated in the spin Hall effect metal layer into the free magnetic layer; and
a metal insertion layer positioned between the spin Hall effect metal layer and the MTJ and structured to include a nonmagnetic metal material of a thickness not greater than a thickness of the spin Hall effect metal layer and exhibiting a high-resistivity greater than a resistivity of the spin Hall effect metal layer,
wherein the metal insertion layer includes Hf and the spin Hall metal layer includes Pt, and
wherein the metal insertion layer has a thickness less than a spin relaxation length of the spin Hall effect metal layer.

16. The magnetic structure of claim 15, wherein the metal insertion layer has a resistivity that is 2.5 times greater than a resistivity of the spin Hall effect metal layer.

17. A magnetic tunneling junction memory device based on a three-terminal circuit configuration and a spin Hall effect (SHE) and spin transfer torque (STT) effect, comprising:
an array of memory cells for storing data; and
a memory control circuit coupled to the array of memory cells and operable to read or write data in the memory cells,
wherein each memory cell includes a magnetic structure as in claim 7, 8 or 9 and further includes:
a first electrical terminal in electrical contact with the MTJ from a side having the pinned magnetic layer to receive a gate voltage that modifies a current threshold of a spin-polarized current flowing across the MTJ for switching the magnetization of the free magnetic layer; and second and third electrical terminals in electrical contact with two contact locations of the spin Hall effect metal layer on two opposite sides of the free magnetic layer to supply the charge current in the spin Hall effect metal layer.

18. The device as in claim 17, wherein:
the memory control circuit is coupled to the first, second and third electrical terminals to supply (1) the charge current via the second and third electrical terminals in the spin Hall effect metal layer and (2) the gate voltage across the MTJ causing a small current tunneling across the MTJ that is insufficient to switch the magnetization of the free magnetic layer without collaboration of the spin-polarized current flowing across the free magnetic layer caused by the charge current.

19. The device as in claim 17, wherein the memory control circuit is configured to be operable in a writing mode to simultaneously apply the charge current in the spin Hall effect metal layer and the gate voltage across the MTJ to set or switch the magnetization direction of the free magnetic layer to a desired direction for representing a stored bit.

20. The device as in claim 17 wherein the memory control circuit is further configured to be operable in a read mode to apply a read voltage to the first electrical terminal to supply a read current tunneling across the MTJ between the first electrical terminal and the spin Hall effect metal layer, without switching the magnetization direction of the free magnetic layer, to sense the magnetization direction of the free magnetic layer that represents the stored bit in the MTJ.

21. The device as in claim 17, wherein:
the memory control circuit is coupled to the first, second and third electrical terminals to supply (1) the charge current via the second and third electrical terminals in the spin Hall effect metal layer and (2) the gate voltage across the MTJ causing a small current tunneling across the MTJ that is insufficient to switch the magnetization of the free magnetic layer without collaboration of the spin-polarized current flowing across the free magnetic layer caused by the charge current,
the memory control circuit is configured to be operable in a writing mode to simultaneously apply the charge current in the spin Hall effect metal layer and the gate voltage across the MTJ to set or switch the magnetization direction of the free magnetic layer to a desired direction for representing a stored bit, and
the memory control circuit is further configured to be operable in a read mode to apply a read voltage to the first electrical terminal to supply a read current tunneling across the MTJ between the first electrical terminal and the spin Hall effect metal layer, without switching the magnetization direction of the free magnetic layer, to sense the magnetization direction of the free magnetic layer that represents the stored bit in the MTJ.

22. A magnetic structure based on a spin Hall effect (SHE) and spin transfer torque (STT) effect, comprising:
a magnetic circuit element that includes:
a free magnetic layer having a magnetization direction that is changeable;
a spin Hall effect layer comprising a first material having a first electrical resistivity, a first thickness, wherein the spin Hall effect layer is nonmagnetic and includes a metal exhibiting a large spin Hall effect to react to a charge current directed into the spin Hall effect layer to produce a spin-polarized current that is perpendicular to the charge current, the spin Hall effect layer being parallel to the free magnetic layer to direct the spin-polarized current generated in the spin Hall effect layer into the free magnetic layer; and
an insertion layer comprising a second material having a second electrical resistivity, a second thickness, and a conductance, wherein the insertion layer is nonmagnetic and coupled between the free magnetic layer and the spin Hall effect metal layer,
wherein the first material includes Pt and the second material includes Hf so that a combined structure of the spin hall effect layer including Pt and the insertion layer including Hf forms a composite structure of a high resistivity,
wherein:
the composite structure includes an intermediate layer between the spin hall effect layer including Pt and the insertion layer including Hf, and the intermediate layer includes Pt and Hf that are intermixed.

23. The device as in claim 22, wherein:
the magnetic circuit element includes a structure of ||Ta(1)|Pt(4)|Hf($t_{Hf}$)|FeCoB($t_{FeCoB}$)|MgO(1.6)|FeCoB(4)|Hf(5)|Ru(5).

* * * * *